US012149237B2

(12) United States Patent
Ikeda et al.

(10) Patent No.: US 12,149,237 B2
(45) Date of Patent: Nov. 19, 2024

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Takayuki Ikeda, Kanagawa (JP); Shuhei Nagatsuka, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 18/016,888

(22) PCT Filed: Jul. 19, 2021

(86) PCT No.: PCT/IB2021/056484
§ 371 (c)(1),
(2) Date: Jan. 19, 2023

(87) PCT Pub. No.: WO2022/029532
PCT Pub. Date: Feb. 10, 2022

(65) Prior Publication Data
US 2023/0283276 A1 Sep. 7, 2023

(30) Foreign Application Priority Data

Aug. 3, 2020 (JP) ................................. 2020-131616

(51) Int. Cl.
*H03K 17/687* (2006.01)
*G06F 7/544* (2006.01)
(Continued)

(52) U.S. Cl.
CPC ......... *H03K 17/687* (2013.01); *G06F 7/5443* (2013.01); *H01L 29/7869* (2013.01); *G06F 2207/4824* (2013.01); *G06G 7/16* (2013.01)

(58) Field of Classification Search
None
See application file for complete search history.

(56) References Cited

U.S. PATENT DOCUMENTS 8,680,478 B2 * 3/2014 Ofuji ................. H01L 27/14609
250/336.1
9,584,707 B2 * 2/2017 Inoue ..................... H04N 23/54
(Continued)

FOREIGN PATENT DOCUMENTS

| CN | 110770737 A | 2/2020 |
| JP | 06-131482 A | 5/1994 |

(Continued)

OTHER PUBLICATIONS

International Search Report (Application No. PCT/IB2021/056484) Dated Oct. 19, 2021.
(Continued)

*Primary Examiner* — Kenneth B Wells
(74) *Attorney, Agent, or Firm* — NIXON PEABODY LLP; Jeffrey L. Costellia

(57) ABSTRACT

A semiconductor device with high arithmetic performance is provided. The semiconductor device employs the translinear principle, and the semiconductor device includes first to tenth transistors each including a metal oxide in a channel formation region and a first capacitor. A first terminal of the first transistor is electrically connected to a first terminal of the second transistor, a first terminal of the third transistor is electrically connected to a second terminal of the second transistor and a gate of the second transistor through the first capacitor. The second terminal of the second transistor is electrically connected to first terminals of the fourth and the seventh transistors and gates of the fifth and the eighth transistors. A gate of the seventh transistor is electrically connected to first terminals of the fifth and the sixth tran-
(Continued)

sistors, and a gate of the tenth transistor is electrically connected to first terminals of the eighth and the ninth transistors.

14 Claims, 34 Drawing Sheets

(51) Int. Cl.
*H01L 29/786* (2006.01)
*G06G 7/16* (2006.01)

(56) References Cited

U.S. PATENT DOCUMENTS

| | | | |
|---|---|---|---|
| 10,163,948 B2 * | 12/2018 | Ohmaru | H01L 29/78648 |
| 10,290,266 B2 | 5/2019 | Kurokawa | |
| 10,483,293 B2 * | 11/2019 | Miyake | G09G 3/3291 |
| 11,114,047 B2 | 9/2021 | Kurokawa | |
| 11,417,273 B2 * | 8/2022 | Toyotaka | G09G 3/3233 |
| 11,568,224 B2 | 1/2023 | Kurokawa et al. | |
| 11,595,594 B2 * | 2/2023 | Ikeda | H04N 23/11 |
| 11,791,344 B2 * | 10/2023 | Toyotaka | H01L 29/78648 |
| | | | 257/43 |
| 2018/0005588 A1 | 1/2018 | Kurokawa | |
| 2020/0125935 A1 | 4/2020 | Kurokawa et al. | |
| 2022/0254401 A1 | 8/2022 | Kurokawa et al. | |
| 2022/0286090 A1 | 9/2022 | Kimura et al. | |
| 2023/0043910 A1 | 2/2023 | Kurokawa et al. | |

FOREIGN PATENT DOCUMENTS

| | | |
|---|---|---|
| JP | 2018-025759 A | 2/2018 |
| KR | 2020-0020813 A | 2/2020 |
| WO | WO-2018/002774 | 1/2018 |
| WO | WO-2018/234919 | 12/2018 |
| WO | WO-2021/209855 | 10/2021 |
| WO | WO-2021/214583 | 10/2021 |
| WO | WO-2021/229373 | 11/2021 |
| WO | WO-2021/229385 | 11/2021 |
| WO | WO-2022/013676 | 1/2022 |
| WO | WO-2022/023866 | 2/2022 |
| WO | WO-2022/029541 | 2/2022 |

OTHER PUBLICATIONS

Written Opinion (Application No. PCT/IB2021/056484) Dated Oct. 19, 2021.
Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.
Kang.M et al., "A 19.4-nJ/Decision, 364-K Decisions/s, In-Memory Random Forest Multi-Class Inference Accelerator", IEEE Journal of Solid-State Circuits, May 2, 2018, vol. 53, No. 7, pp. 2126-2135.
Moradi.S et al., "An Event-Based Neural Network Architecture With an Asynchronous Programmable Synaptic Memory", IEEE Transactions on Biomedical Circuits and Systems, Jun. 4, 2013, vol. 8, No. 1, pp. 98-107.
Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.
Akyel.K et al., "DRC2: Dynamically Reconfigurable Computing Circuit based on memory architecture", IEEE International Conference on Rebooting Computing, Oct. 17, 2016, pp. 1-8pages.
Agrawal.A et al., "X-SRAM: Enabling In-Memory Boolean Computations in CMOS Static Random Access Memories", IEEE Transactions on Circuits and Systems, Jul. 2, 2018, pp. 1-14.

* cited by examiner

100

FIG. 28A
|  | Intermediate state<br>New crystalline phase | |
|---|---|---|
| Amorphous | Crystalline | Crystal |
| •completely amorphous | •CAAC<br>•nc<br>•CAC<br>excluding single crystal and poly crystal | •single crystal<br>•poly crystal |
FIG. 28B
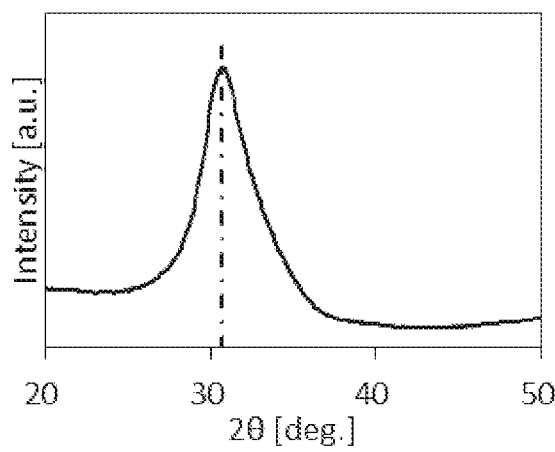
FIG. 28C
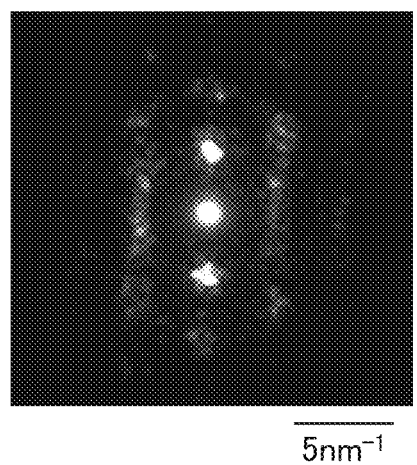

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a storage device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits, for example. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). For example, Non-Patent Document 1 and Non-Patent Document 2 each disclose an arithmetic device including an artificial neural network constructed using an SRAM (Static Random Access Memory).

REFERENCE

Non-Patent Document

[Non-Patent Document 1] M. Kang et al., "IEEE Journal Of Solid-State Circuits", 2018, Volume 53, No. 2, pp. 642-655.

[Non-Patent Document 2] J. Zhang et al., "IEEE Journal Of Solid-State Circuits", 2017, Volume 52, No. 4, pp. 915-924.

SUMMARY OF THE INVENTION

Problems to be Solved by the Invention

An artificial neural network performs calculations in which the connection strength (sometimes referred to as weight coefficient) of a synapse that connects two neurons is multiplied by a signal transmitted between the two neurons. In particular, in a hierarchical artificial neural network, the connection strength of synapses between a plurality of first neurons in a first layer and one of second neurons in a second layer and signals input from the plurality of first neurons in the first layer to the one of the second neurons in the second layer need to be multiplied and summed, i.e., need to be subjected to product-sum operation; for example, the number of connection strengths and the number of parameters indicating the signals are determined in accordance with the scale of the artificial neural network. In addition, with use of a result of the product-sum operation of the connection strength of synapses and the signal output from the first neurons, the second neuron performs an activation function operation and outputs the operation result as a signal to third neurons in a third layer. That is, in the artificial neural network, as the number of layers, the number of neurons, and the like increase, the number of circuits corresponding to the "neurons" and "synapses" also increases, which sometimes makes the amount of arithmetic operation enormous. This might increase the power consumption of a circuit and decrease the arithmetic efficiency.

In addition, when an artificial neural network operation is performed using a digital arithmetic circuit, the limitation of the arithmetic performance is said to be approximately 10 TOPS (Tera Operations Per Second)/W. There is a proposal that an artificial neural network operation is performed with use of an analog arithmetic circuit to increase the arithmetic performance.

Examples of an analog arithmetic circuit for artificial neural network operations include a circuit employing the translinear principle. However, when the circuit is formed using a transistor including silicon in its channel formation region (hereinafter referred to as a Si transistor), for example, it is difficult to configure an analog memory with Si transistors. Thus, as data input to an analog arithmetic circuit, data read from a digital memory needs to be converted into analog data by a digital-analog conversion circuit.

In the case where a multiplier circuit including a Si transistor and employing the translinear principle is formed, the amount of current flowing through the Si transistor needs to be greater than or equal to 10 pA, preferably greater than or equal to 1 nA. In contrast, in a current less than the values, it is difficult to maintain exponential characteristics of a subthreshold region in the Si transistor.

In general, if a circuit scale is increased, a voltage input terminal of the circuit might be affected by a voltage drop. In the case of a multiplier circuit including a Si transistor and employing the translinear principle, it is necessary to supply an appropriate voltage to the voltage input terminal of the circuit in order to give the above current value to the Si transistor.

A calculation result of a multiplier circuit employing the translinear principle may be affected by a variation of a threshold voltage of the transistor included in the circuit. In contrast, removal of a variation in the threshold voltage can increase the arithmetic operation accuracy.

An object of one embodiment of the present invention is to provide a semiconductor device or the like that performs a product-sum operation and/or a function operation. Another object of one embodiment of the present invention is to provide a semiconductor device or the like for AI (Artificial Intelligence). Another object of one embodiment of the present invention is to provide a semiconductor device or the like for DNN (Deep Neural Network). Another object of one embodiment of the present invention is to provide a semiconductor device with high arithmetic performance. Another object of one embodiment of the present invention is to provide a semiconductor device or the like with low power consumption. Another object of one embodiment of the present invention is to provide a semiconductor device or the like that is less affected by a variation in a threshold voltage of a transistor. Another object of one embodiment of the present invention is to provide a semiconductor device or the like that is less affected by a variation in characteristics of a current source. Another object of one embodiment of the present invention is to provide a novel semiconductor device or the like.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)
One embodiment of the present invention is a semiconductor device including a first transistor, a second transistor, a third transistor, a fourth transistor, a fifth transistor, a sixth transistor, a seventh transistor, an eighth transistor, a ninth transistor, a tenth transistor, and a first capacitor. Each of the first transistor, the second transistor, the third transistor, the fourth transistor, the fifth transistor, the sixth transistor, the seventh transistor, the eighth transistor, the ninth transistor, and the tenth transistor includes a metal oxide in its channel formation region. A first terminal of the first transistor is electrically connected to a first terminal of the second transistor, and a gate of the second transistor is electrically connected to a first terminal of the third transistor and a first terminal of the first capacitor. A second terminal of the second transistor is electrically connected to a second terminal of the first capacitor, a first terminal of the fourth transistor, a gate of the fifth transistor, a first terminal of the seventh transistor, and a gate of the eighth transistor. A first terminal of the fifth transistor is electrically connected to a first terminal of the sixth transistor and a gate of the seventh transistor, and a first terminal of the eighth transistor is electrically connected to a first terminal of the ninth transistor and a gate of the tenth transistor. An amount of current flowing between a source and a drain of each of the second transistor, the fifth transistor, the sixth transistor, the seventh transistor, the eighth transistor, the ninth transistor, and the tenth transistor is an amount of current flowing when the transistor operates in a subthreshold region (2)
Another embodiment of the present invention preferably includes a second capacitor in the above (1). In particular, it is preferable that a gate of the first transistor be electrically connected to a first terminal of the second capacitor, and the gate of the second transistor be electrically connected to a second terminal of the second capacitor.

(3)
In another embodiment of the present invention, at least one of the first transistor, the second transistor, the third transistor, the fourth transistor, the fifth transistor, the sixth transistor, the seventh transistor, the eighth transistor, the ninth transistor, and the tenth transistor is preferably a multi-gate transistor in the above (1) or (2).

(4)
Another embodiment of the present invention preferably includes an eleventh transistor and a third capacitor in any one of the above (1) to (3). In particular, it is preferable that a first terminal of the eleventh transistor be electrically connected to a first terminal of the third capacitor. In addition, when the first terminal of the eleventh transistor is electrically connected to a back gate of any one of the first transistor, the second transistor, the third transistor, the fourth transistor, the fifth transistor, the sixth transistor, the seventh transistor, the eighth transistor, the ninth transistor, and the tenth transistor, it is preferable that a second terminal of the third capacitor be electrically connected to the source of the transistor having the back gate electrically connected to the first terminal of the eleventh transistor.

(5)
In another embodiment of the present invention, it is preferable that a back gate of the first transistor be electrically connected to a back gate of the third transistor and a back gate of the fourth transistor in any one of the above (1) to (3).

(6)
Another embodiment of the present invention is a semiconductor device including a first transistor, a second transistor, a fourth transistor, a fifth transistor, a sixth transistor, a seventh transistor, an eighth transistor, a ninth transistor, a tenth transistor, a twelfth transistor, a thirteenth transistor, and a first capacitor, and each of the first transistor, the second transistor, the fourth transistor, the fifth transistor, the sixth transistor, the seventh transistor, the eighth transistor, the ninth transistor, the tenth transistor, the twelfth transistor, and the thirteenth transistor includes a metal oxide in a channel formation region. A first terminal of the first transistor is electrically connected to a first terminal of the second transistor, a gate of the second transistor is electrically connected to a first terminal of the twelfth transistor, a gate of the thirteenth transistor, and a first terminal of the first capacitor, and a second terminal of the twelfth transistor is electrically connected to a first terminal of the thirteenth transistor. A second terminal of the second transistor is electrically connected to a second terminal of the first capacitor, a first terminal of the fourth transistor, a gate of the fifth transistor, a first terminal of the seventh transistor, and a gate of the eighth transistor. A first terminal of the fifth transistor is electrically connected to a first terminal of the sixth transistor and a gate of the seventh transistor, and a first terminal of the eighth transistor is electrically connected to a first terminal of the ninth transistor and a gate of the tenth transistor. An amount of current flowing between a source and a drain of each of the second transistor, the fifth transistor, the sixth transistor, the seventh transistor, the eighth transistor, the ninth transistor, the tenth transistor, and the thirteenth transistor is an amount of current flowing when the transistor operates in a subthreshold region.

(7)
In another embodiment of the present invention, at least one of the first transistor, the second transistor, the fourth transistor, the fifth transistor, the sixth transistor, the seventh transistor, the eighth transistor, the ninth transistor, the tenth transistor, the twelfth transistor, and the thirteenth transistor is preferably a multi-gate transistor in the above (6).

(8)
Another embodiment of the present invention preferably includes an eleventh transistor and a third capacitor in the above (6) or (7). It is preferable that a first terminal of the eleventh transistor be electrically connected to a first terminal of the third capacitor. When the first terminal of the eleventh transistor is electrically connected to a back gate of any one of the first transistor, the second transistor, the fourth transistor, the fifth transistor, the sixth transistor, the seventh transistor, the eighth transistor, the ninth transistor, the tenth transistor, the twelfth transistor, and the thirteenth transistor, it is preferable that a second terminal of the third capacitor be electrically connected to the source of the transistor having the back gate electrically connected to the first terminal of the eleventh transistor.

(9)

In another embodiment of the present invention, it is preferable that a back gate of the first transistor be electrically connected to a back gate of the fourth transistor and a back gate of the twelfth transistor in the above (6) or (7).

(10)

Another embodiment of the present invention is a semiconductor device including a first transistor, a second transistor, a third transistor, a fourth transistor, a fifth transistor, a sixth transistor, a seventh transistor, an eighth transistor, a ninth transistor, a tenth transistor, a fourteenth transistor, a fifteenth transistor, a first capacitor, and a photodiode. Each of the first transistor, the second transistor, the third transistor, the fourth transistor, the fifth transistor, the sixth transistor, the seventh transistor, the eighth transistor, the ninth transistor, the tenth transistor, the fourteenth transistor, and the fifteenth transistor comprises a metal oxide in a channel formation region. In addition, a first terminal of the first transistor is electrically connected to a first terminal of the second transistor, a gate of the second transistor is electrically connected to a first terminal of the third transistor and a first terminal of the first capacitor. A second terminal of the second transistor is electrically connected to a second terminal of the first capacitor, a first terminal of the fourth transistor, a gate of the fifth transistor, a first terminal of the seventh transistor, and a gate of the eighth transistor. A first terminal of the fifth transistor is electrically connected to a first terminal of the sixth transistor and a gate of the seventh transistor, a first terminal of the eighth transistor is electrically connected to a first terminal of the ninth transistor and a gate of the tenth transistor. A first terminal of the fourteenth transistor is electrically connected to an input terminal of the photodiode, a second terminal of the fourteenth transistor is electrically connected to a first terminal of the fifteenth transistor, a gate of the fifteenth transistor, and a gate of the sixth transistor. An amount of current flowing between a source and a drain of each of the second transistor, the fifth transistor, the sixth transistor, the seventh transistor, the eighth transistor, the ninth transistor, the tenth transistor, and the fifteenth transistor is an amount of current flowing when the transistor operates in a subthreshold region.

(11)

In another embodiment of the present invention, at least one of the first transistor, the second transistor, the third transistor, the fourth transistor, the fifth transistor, the sixth transistor, the seventh transistor, the eighth transistor, the ninth transistor, the tenth transistor, the fourteenth transistor, and the fifteenth transistor is preferably a multi-gate transistor in the above (10).

(12)

Another embodiment of the present invention preferably includes an eleventh transistor and a third capacitor in the above (10) or (11). It is preferable that a first terminal of the eleventh transistor be electrically connected to a first terminal of the third capacitor. When the first terminal of the eleventh transistor is electrically connected to a back gate of any one of the first transistor, the second transistor, the third transistor, the fourth transistor, the fifth transistor, the sixth transistor, the seventh transistor, the eighth transistor, the ninth transistor, the tenth transistor, the fourteenth transistor, and the fifteenth transistor, it is preferable that a second terminal of the third capacitor be electrically connected to a source of the transistor having the back gate electrically connected to the first terminal of the eleventh transistor.

(13)

In another embodiment of the present invention, it is preferable that a back gate of the first transistor be electrically connected to a back gate of the third transistor and a back gate of the fourth transistor in the above (10) or (11).

(14)

Another embodiment of the present invention preferably includes a second capacitor in any one of the above (10) to (13). In particular, it is preferable that a gate of the first transistor be electrically connected to a first terminal of the second capacitor, and the gate of the second transistor be electrically connected to a second terminal of the second capacitor.

(15)

In another embodiment of the present invention, it is preferable that the first terminal of the first transistor be electrically connected to a second terminal of the fifth transistor and a second terminal of the eighth transistor in any one of the above (1) to (14).

(16)

Another embodiment of the present invention is an electronic device that includes the semiconductor device according to any one of the above (1) to (15) and a housing and in which a product-sum operation is performed by the semiconductor device.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, an electronic component including a chip in a package, and the like are examples of the semiconductor device. Moreover, a storage device, a display device, a light-emitting device, a lighting device, an electronic device, and the like themselves are semiconductor devices, or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0. Therefore, in this specification and the like, a "resistor" sometimes includes a wiring having a resistance value, a transistor in which a current flows between its source and drain, a diode, and a coil. Thus, the term "resistor element" can be sometimes replaced with the terms "resistor", "load", and "region having a resistance", and the like; conversely, the terms "resistor", "load", and "region having a resistance" can be sometimes replaced with the term "resistor element" and the like. The resistance can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^9$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes a circuit element that has a pair of electrodes and a dielectric between the electrodes. The term "capacitor", "parasitic capacitance", "gate capacitance", or the like can be replaced with the term "capacitance" or the like in some cases. Conversely, the term "capacitance" can be replaced with the term "capacitor", "parasitic capacitance", "gate capacitance", or the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can sometimes be replaced with each other in this specification and the like. In this specification and the like, expressions "one of a source and a drain" (or a first electrode or a first terminal) and "the other of the source and the drain" (or a second electrode or a second terminal) are used in description of the connection relationship of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of an off-state current can be reduced, and the withstand voltage of the transistor can be increased (the reliability can be improved). Alternatively, by providing the multi-gate structure, in the case of operation in a saturation region, a current flowing between the drain and the source does not change much even if the drain-source voltage changes, and thus the voltage-current characteristics having a flat slope can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of current is expressed as a positive value. In other words, the direction in which a carrier with a negative charge moves is opposite to the direction of a current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. In this specification and the like, for example, a "first" component in one embodiment can be referred to as a "second" component in other embodiments or the scope of claims. For another example, a "first" component in one embodiment in this specification and the like can be omitted in other embodiments or the scope of claims.

In this specification and the like, the terms for describing positioning, such as "over" and "under", are sometimes used for convenience to describe the positional relationship between components with reference to drawings. The positional relationship between components is changed as appropriate in accordance with the direction from which each component is described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", or the like can be interchanged with each other depending on the situation. For example, the term "conductive layer" can be changed into the term "conductive film" in some cases. Moreover, for example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a wiring in some cases, and vice versa. Furthermore, the terms "electrode" or "wiring" can also include the case where a plurality of "electrodes" or/and "wirings" are formed in an integrated manner, for example. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether a current flows or not. Alternatively, a switch has a function of selecting and changing a current path. Thus, a switch may have two or more terminals through which a current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to, for example, a state where a source electrode and a drain electrode of the transistor can be regarded as being electrically short-circuited or a state where a current can flow between the source electrode and the drain electrode. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a semiconductor device or the like that performs a product-sum operation and/or function operation can be provided. According to another object of one embodiment of the present invention, a semiconductor device or the like for AI (Artificial Intelligence) can be provided. According to another object of one embodiment of the present invention, a semiconductor device or the like for DNN (Deep Neural Network) can be provided. According to another object of one embodiment of the present invention, a semiconductor device with high arithmetic performance can be provided. According to another embodiment of the present invention, a semiconductor device or the like with low power consumption can be provided. According to another embodiment of the present invention, a semiconductor device or the like that is less affected by variations in a threshold voltage of a transistor can be provided. According to another embodiment of the present invention, a semiconductor device or the like that is less affected by variations in characteristics of a current source can be provided. According to another embodiment of the present invention, a novel semiconductor device or the like can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 28A is a diagram showing classification of crystal structures, FIG. 28B is a diagram showing an XRD spectrum of crystalline IGZO, and FIG. 28C is a diagram showing a nanobeam electron diffraction pattern of crystalline IGZO.

MODE FOR CARRYING OUT THE INVENTION

Figure 1:
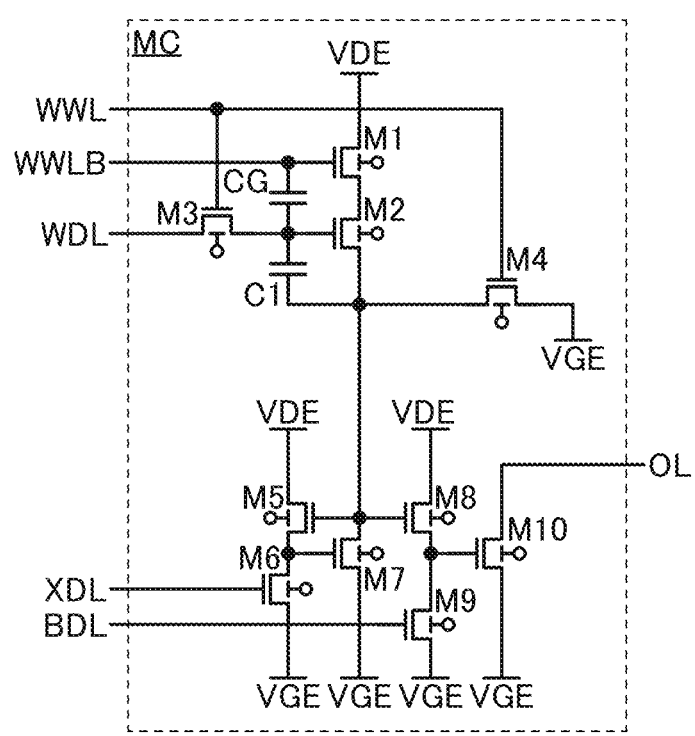
FIG. 1 is a circuit diagram illustrating a structure example of a circuit included in a semiconductor device.

In an artificial neural network (hereinafter, referred to as a neural network), the connection strength between synapses can be changed by providing the neural network with existing information. The processing for determining a connection strength by providing a neural network with existing information in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield type and a hierarchical type. In particular, a neural network with a multilayer structure is called a "deep neural network" (DNN), and machine learning using a deep neural network is called "deep learning" in some cases.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components may be omitted for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a structure of a semiconductor device of one embodiment of the present invention will be described.

Structure Example 1

FIG. 1 illustrates a structure example of a multiplication cell that is a semiconductor device of one embodiment of the present invention. For example, the multiplication cell performs multiplication with the use of the translinear principle. In addition, the multiplication cell has a function of retaining first data and has a function of outputting the product of the first data and second data when the second data is input to the multiplication cell.

A circuit MC illustrated in FIG. 1 includes a transistor M1 to a transistor M10, a capacitor C1, and a capacitor CG.

OS transistors can be used for example, as the transistor M1 to the transistor M10. In particular, as a metal oxide contained in a channel formation region of the OS transistor, an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) or the like is preferably used. A transistor other than the OS transistor can be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, and the like.

The transistor M1, the transistor M3, and the transistor M4 may function as switching elements, for example, unless otherwise specified. That is, voltages in a range where these transistors operate as switching elements may be appropriately input to the gate, the source, and the drain of each of these transistors. However, one embodiment of the present invention is not limited thereto. For example, at least one of these transistors in an on state can operate in a saturation region or a linear region. Alternatively, at least one of the transistor M1, the transistor M3, and the transistor M4 can operate in a subthreshold region in order to reduce the amount of current flowing through these transistors. Alternatively, at least one of the transistor M1, the transistor M3, and the transistor M4 can operate in a linear region, in a saturation region, and in a subthreshold region. Alternatively, at least one of the transistor M1, the transistor M3, and the transistor M4 can operate both in a linear region and in a saturation region, both in a saturation region and in a subthreshold region, or both in a linear region and in a subthreshold region.

In this specification and the like, the saturation region refers to a region where the gate-source voltage is higher than the threshold voltage, and a difference between the gate-source voltage and the threshold voltage is larger than the source-drain voltage. Alternatively, the saturation region refers to a region where a drain current of a transistor is hardly changed even when the source-drain voltage is changed. Alternatively, the saturation region refers to a region where the drain current is proportional to the square of the gate-source voltage. Alternatively, the saturation region includes a region that can be regarded as any region of the above description.

In this specification and the like, the linear region refers to a region where the gate-source voltage is higher than the threshold voltage, and a difference between the gate-source voltage and the threshold voltage is smaller than the source-drain voltage. Alternatively, the linear region refers to a region where the drain current of a transistor behaves so as to be changed linearly because the channel formation region functions as a resistor and the source-drain voltage is changed. Alternatively, the linear region includes a region that can be regarded as any region of the above description.

In this specification and the like, the subthreshold region refers to a region where a gate voltage is lower than the threshold voltage in a graph of gate voltage (Vg)-drain current (Id) characteristics of a transistor. Alternatively, the subthreshold region refers to a region where a current flows due to carrier diffusion, which is out of gradual channel approximation (a model in which only a drift current is considered). Alternatively, the subthreshold region refers to a region where a drain current is increased exponentially with respect to an increase in a gate voltage. Alternatively, the subthreshold region includes a region that can be regarded as any region of the above description.

A drain current when the transistor operates in the subthreshold region is referred to as a subthreshold current. The subthreshold current is increased exponentially with respect to the gate voltage, without depending on the drain voltage. The circuit operation using the subthreshold current can reduce the influence of a variation in a drain voltage.

An OS transistor has a drain current per micrometer of channel width of lower than $1\times10^{-20}$ A, lower than $1\times10^{-22}$ A, or lower than $1\times10^{-24}$ A. In addition, in an OS transistor, a drain current per micrometer of channel width of $1.0\times10^{-8}$ A or lower, $1.0\times10^{-12}$ A or lower, or $1.0\times10^{-15}$ A or lower flows with the threshold voltage of the transistor. That is, an OS transistor can have a wide range of the gate voltage where the transistor operates in a subthreshold region. Specifically, when the threshold voltage of an OS transistor is $V_{th}$, a circuit operation using the gate voltage in the voltage range of $V_{th}$-1.0 V to $V_{th}$ inclusive, or $V_{th}$-0.5 V to $V_{th}$ inclusive, is possible in the subthreshold region.

Meanwhile, a transistor including a silicon in its channel formation region (hereinafter referred to as a Si transistor) has a high off-state current and a narrow range of the gate voltage in which the transistor operates in the subthreshold region. In the case of utilizing the subthreshold current, an OS transistor can perform a circuit operation in a wider range of the gate voltage than that of a Si transistor.

Note that in this specification and the like, an off region of the transistor refers to a region where the gate-source voltage is lower than a voltage in a subthreshold region. When the gate-source voltage of the transistor is in the off region, the transistor is in an off state. In this specification and the like, current that flows when the transistor is in an off state is expressed as off-state current or leakage current.

Unless otherwise specified, each of the transistor M2 and the transistor M5 to the transistor M10 may operate in a subthreshold region.

A first terminal of the transistor M1 is electrically connected to a wiring VDE, a second terminal of the transistor M1 is electrically connected to a first terminal of the transistor M2, and a gate of the transistor M1 is electrically connected to a wiring WWLB and a first terminal of the capacitor CG. A first terminal of the transistor M3 is electrically connected to a wiring WDL, and a second terminal of the transistor M3 is electrically connected to a gate of the transistor M2, a second terminal of the capacitor CG, and a first terminal of the capacitor C1. A second terminal of the transistor M2 is electrically connected to a first terminal of the transistor M4, a second terminal of the capacitor C1, a gate of the transistor M5, a first terminal of the transistor M7, and a gate of the transistor M8. A second terminal of the transistor M4 is electrically connected to a wiring VGE, and a gate of the transistor M4 is electrically connected to a gate of the transistor M3 and the wiring WWL. A first terminal of the transistor M5 is electrically connected to the wiring VDE, and a second terminal of the transistor M5 is electrically connected to a first terminal of the transistor M6 and a gate of the transistor M7. A gate of the transistor M6 is electrically connected to a wiring XDL, and a second terminal of the transistor M6 is electrically connected to the wiring VGE. A second terminal of the transistor M7 is electrically connected to the wiring VGE. A first terminal of the transistor M8 is electrically connected to the wiring VDE, and a second terminal of the transistor M8 is electrically connected to a first terminal of the transistor M9 and a gate of the transistor M10. A gate of the transistor M9 is electrically connected to a wiring BDL, and a second terminal of the transistor M9 is electrically connected to the wiring VGE. A first terminal of the transistor M10 is electrically connected to a wiring OL, and a second terminal of the transistor M10 is electrically connected to the wiring VGE.

The wiring VDE functions as a wiring that supplies a constant voltage, for example. The constant voltage can be a high power supply voltage, for example.

The wiring VGE functions as a wiring that supplies a constant voltage, for example. The constant voltage can be a low power supply voltage or a ground potential, for example.

The wiring WWL functions as a write signal line for writing the first data to the circuit MC, for example.

The wiring WWLB functions as a wiring for transmitting an inverted signal of a writing signal transmitted to the wiring WWL, for example. Note that the wiring WWLB may be a wiring for supplying a variable potential (e.g., a high-level potential or a low level potential) instead of the inverted signal.

The wiring WDL functions as a write data line for writing a voltage corresponding to the first data to the circuit MC, for example.

The wiring XDL functions as a signal line for inputting a voltage corresponding to the second data to the circuit MC, for example.

Thus, the transistor M6 including the gate electrically connected to the wiring XDL functions as a current source. As described above, since the transistor M6 may operate in the subthreshold region, a current in the subthreshold region flows between the first terminal and the second terminal of the transistor M6.

The wiring BDL functions as a signal line for inputting a voltage for adjusting an amount of current corresponding to the arithmetic operation result of the first data and the second data to the circuit MC, for example.

Thus, the transistor M9 including the gate electrically connected to the wiring BDL functions as a current source. As described above, since the transistor M9 may operate in the subthreshold region, a current in the subthreshold region flows between the first terminal and the second terminal of the transistor M9.

Note that for the amount of current flowing through the transistor M9, for example, a variable, a constant, or the like used in an arithmetic operation according to a function system included in a circuit ACTV described later can be used.

The wiring OL functions as a wiring for outputting a current corresponding to the product of the first data and the second data, for example.

Operation Example

Next, an operation example of the circuit MC in FIG. 1 is described. Note that in this operation example, a potential supplied from the wiring VDE is a high power supply potential, and a potential supplied from the wiring VGE is a ground potential ($V_{GND}$).

<<Writing Operation>>

First, an operation example of writing the first data to the circuit MC is described.

A high-level potential is input to the wiring WWL. Thus, the high-level potential is input to gates of the transistor M3 and the transistor M4, so that the transistor M3 and the transistor M4 are turned on.

At this time, electrical continuity is established between the wiring VGE and the second terminal of the capacitor C1 (the second terminal of the transistor M2) through the transistor M4, so that the potential of the second terminal of the capacitor C1 (the second terminal of the transistor M2) becomes $V_{GND}$.

At this time, electrical continuity is established also between the wiring WDL and the first terminal of the capacitor C1 (the second terminal of the capacitor CG, the gate of the transistor M2, and the like) through the transistor M3. Here, by transmitting a signal corresponding to the first data to the wiring WDL (hereinafter referred to as voltage $V_W$), the voltage $V_W$ corresponding to the first data is written to the first terminal of the capacitor C1 (the second terminal of the capacitor CG, the gate of the transistor M2, and the like).

An inverted signal of a signal transmitted to the wiring WWL is input to the wiring WWLB. Specifically, a low-level potential is input to the wiring WWLB. Thus, the low-level potential is applied to the gate of the transistor M1 (the first terminal of the capacitor CG). Thus, the transistor M1 is turned off.

After the voltage $V_W$ is written to the first terminal of the capacitor C1 (the second terminal of the capacitor CG, the gate of the transistor M2, and the like), a low-level potential is input to the wiring WWL. Thus, the low-level potential is input to the gates of the transistor M3 and the transistor M4, so that the transistor M3 and the transistor M4 are turned off. Accordingly, the first terminal of the capacitor C1 is brought into a floating state, whereby the voltage $V_W$-$V_{GND}$ between the first terminal and the second terminal of the capacitor C1 is retained.

Strictly, when the potential supplied to the gate of the transistor M3 changes from a high-level potential to a low-level potential, the voltage $V_W$ written to the first terminal of the capacitor C1 decreases in some cases due to parasitic capacitance between the gate and the second terminal of the transistor M3. Note that in this specification, the voltage decreases from the voltage $V_W$ due to the parasitic capacitance between the gate and the second terminal of the transistor M3 can also be referred to as a voltage corresponding to the first data, for convenience. In the circuit MC in FIG. 1, the capacitor CG is provided to prevent the decrease in the voltage $V_W$. When the potential supplied to the gate of the transistor M3 changes from a high-level potential to a low-level potential, that is, when the potential supplied from the wiring WWL changes from a high-level potential to a low-level potential, the potential of the wiring WWLB changes from a low-level potential to a high-level potential since the inverted signal of the signal transmitted to the wiring WWL is input to the wiring WWLB. At this time, the potential of the first terminal of the capacitor CG increases from the low-level potential to the high-level potential, whereby the potential of the second terminal of the capacitor CG (the first terminal of the capacitor C1, the gate of the transistor M2, and the like) ideally increases by a potential difference between the high-level potential and the low-level potential by capacitive coupling of the capacitor CG. Here, the increased potential difference is equal to the potential difference in which the voltage $V_W$ decreases due to the parasitic capacitance between the gate and the second terminal of the transistor M3, whereby the decrease in the voltage $V_W$ when the transistor M3 is turned off can be prevented. Note that the structure of the capacitor CG in which the potential difference increased by the capacitive coupling of the capacitor CG is equal to the potential difference decreased by the parasitic capacitance between the gate and the second terminal of the transistor M3 will be described later.

At this time, instead of the inverted signal of the signal transmitted to the wiring WWL, a low-level potential may be supplied to the wiring WWLB to turn off the transistor M1. This enables retention of the first data in the circuit MC and the stop of the supply of a high power supply potential to the first terminal of the transistor M2 to be performed at the same time.

<<Multiplication Operation>>

Next, a multiplication operation example of the first data and the second data in the circuit MC is described.

Since the transistor M1 is turned on when a high-level potential is input to the wiring WWLB, a high power supply potential is input to the first terminal of the transistor M2, and a current corresponding to the voltage between the gate and the second terminal of the transistor M2 flows between the first terminal and the second terminal of the transistor M2. Here, the amount of current flowing between the first terminal and the second terminal of the transistor M2 is $I_W$. Note that in the case where the transistor M2 operates in the subthreshold region, $I_W$ is the amount of current within a current range in the subthreshold region.

The current flowing between the first terminal and the second terminal of the transistor M2 flows to the wiring VGE through the transistor M7. Here, the transistor M7 also operates in the subthreshold region, and a current with the amount of current $I_W$ flows between the first terminal and the second terminal of the transistor M7. At this time, the amount of current $I_W$ can be expressed by the following formula.

[Formula 1]

$$I_W = I_0 \exp(JV_{M7gs}) \quad (1.1)$$

Note that $V_{M7gs}$ is a voltage between the gate and the second terminal of the transistor M7. $I_0$ is a value of a current flowing when $V_{M7gs}$ is 0 and can be determined by the threshold voltage, the temperature, the device structure, and the like of the transistor M7. J is a correction coefficient determined by the temperature, the device structure, and the like.

$V_X$ is input to the wiring XDL as a voltage corresponding to the second data. At this time, the voltage between the gate and the second terminal of the transistor M6 becomes $V_X$-$V_{GND}$, and a current corresponding to $V_X$-$V_{GND}$ flows between the first terminal and the second terminal of the transistor M6. Here, the amount of current flowing between the first terminal and the second terminal of the transistor M6 is $I_X$. Note that in the case where the transistor M6 operates in the subthreshold region, $I_X$ is the amount of current within a current range in the subthreshold region.

The current flowing between the first terminal and the second terminal of the transistor M6 flows from the wiring VDE to the first terminal of the transistor M6 through the transistor M5. Here, the transistor M5 also operates in the subthreshold region, and a current having the amount of current $I_X$ flows between the first terminal and the second terminal of the transistor M5. At this time, the amount of current $I_X$ can be expressed by the following formula.

[Formula 2]

$$I_X = I_0 \exp(JV_{M5gs}) \quad (1.2)$$

Note that $V_{M5gs}$ is a voltage between the gate and the second terminal of the transistor M5. $I_0$ is a value of a current flowing when $V_{M5gs}$ is 0 and can be determined by the threshold voltage, the temperature, the device structure, and the like of the transistor M5. J is a correction coefficient determined by the temperature, the device structure, and the like. Note that $I_0$ and J used in Formula (1.2) are equal to $I_0$ and J used in Formula (1.1), respectively.

$V_B$ is input to the wiring BDL as a voltage for adjusting an output current. At this time, the voltage between the gate and the second terminal of the transistor M9 becomes $V_B$-$V_{GND}$, and a current corresponding to $V_B$-$V_{GND}$ flows between the first terminal and the second terminal of the transistor M9. Here, the amount of current flowing between the first terminal and the second terminal of the transistor M9 is $I_B$. Note that in the case where the transistor M9 operates in the subthreshold region, $I_B$ is the amount of current within a current range in the subthreshold region.

The current flowing between the first terminal and the second terminal of the transistor M9 flows from the wiring VDE to the first terminal of the transistor M9 through the transistor M8. Here, the transistor M8 also operates in the subthreshold region, and a current having the amount of current $I_B$ flows between the first terminal and the second terminal of the transistor M8. At this time, the amount of current $I_B$ can be expressed by the following formula.

[Formula 3]

$$I_B = I_0 \exp(JV_{M8gs}) \quad (1.3)$$

Note that $V_{M8gs}$ is a voltage between the gate and the second terminal of the transistor M8. $I_0$ is a value of a current flowing when $V_{M5gs}$ is 0 and can be determined by the threshold voltage, the temperature, the device structure, and the like of the transistor M8. J is a correction coefficient determined by the temperature, the device structure, and the like. Note that $I_0$ and J used in Formula (1.3) are equal to $I_0$ and J used in Formula (1.1) and Formula (1.2), respectively.

A current flowing between the first terminal and the second terminal of the transistor M10 is determined in accordance with a voltage between the gate and the second terminal of the transistor M10. When the amount of current flowing between the first terminal and the second terminal of the transistor M10 is $I_Y$, the amount of current $I_Y$ can be expressed by the following formula.

[Formula 4]

$$I_Y = I_0 \exp(JV_{M10gs}) \quad (1.4)$$

Note that $V_{M10gs}$ is a voltage between the gate and the second terminal of the transistor M10. $I_0$ is a value of a current flowing when $V_{M10gs}$ is 0 and can be determined by the threshold voltage, the temperature, the device structure, and the like of the transistor M10. J is a correction coefficient determined by the temperature, the device structure, and the like. Note that $I_0$ and J used in Formula (1.4) are equal to $I_0$ and J used in Formula (1.1) to Formula (1.3), respectively.

Here, a closed circuit in which the wiring VGE, the second terminal of the transistor M7, the gate of the transistor M7, the second terminal of the transistor M5, the gate of transistor M5, the gate of the transistor M8, the second terminal of the transistor M8, the gate of the transistor M10, the second terminal of the transistor M10, and the wiring VGE are provided in this order is considered. In the closed circuit, the following formula holds according to Kirchhoff's second law (voltage side).

[Formula 5]

$$V_{M5gs} + V_{M7gs} = V_{M8gs} + V_{M10gs} \quad (1.5)$$

The term of each voltage in Formula (1.5) is rewritten using Formula (1.1) to Formula (1.4), so that the following formula is obtained.

[Formula 6]

$$I_Y = \frac{I_W I_X}{I_B} \quad (1.6)$$

That is, the current $I_Y$ flowing between the first terminal and the second terminal of the transistor M10 can be expressed by the product of $I_W$ and $I_X$. Thus, by measuring the amount of current $I_Y$ flowing from the wiring OL, a value corresponding to the product of $I_W$ and $I_X$ can be calculated.

Structure Example 2

Note that the structure of the multiplication cell included in the semiconductor device of one embodiment of the present invention is not limited to the circuit MC illustrated in FIG. 1. The multiplication cell included in the semiconductor device of one embodiment of the present invention can have a structure in which the circuit MC illustrated in FIG. 1 is changed depending on the situation.

Variation Example 1

The transistor M1 to the transistor M10 illustrated in FIG. 1 are each an n-channel transistor having a structure including gates over and under a channel, and the transistor M1 to the transistor M10 each include a first gate and a second gate. Note that in this specification and the like, for convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

Figure 2A:
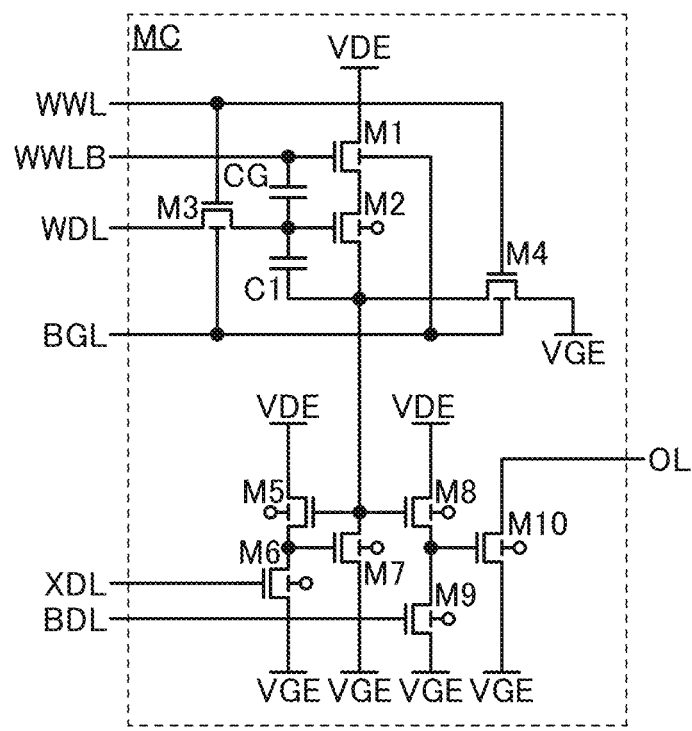
FIG. 2A and FIG. 2B are block diagrams each illustrating a structure example of a circuit included in a semiconductor device.

The semiconductor device of one embodiment of the present invention does not depend on the connection structure of a back gate of a transistor. Back gates of the transistor M1 to the transistor M10 are illustrated in FIG. 1, but the connection structures of the back gates are not illustrated. A target to which each of the back gates is electrically connected can be determined at the design stage. For example, in a transistor including a back gate, a gate and the back gate may be electrically connected to each other to increase the on-state current of the transistor. Alternatively, for example, in a transistor including a back gate, a wiring electrically connected to an external circuit or the like may be provided and a fixed potential or a variable potential may be supplied to the back gate of the transistor by the external circuit or the like to change the threshold voltage of the transistor or to reduce the off-state current of the transistor. Specifically, the structure illustrated in FIG. 1 may have a structure in which the back gates of the transistor M1, the transistor M3, and the transistor M4 may be electrically connected to the wiring BGL as illustrated in FIG. 2A for example. In the structure of FIG. 2A, the threshold voltages of the transistor M1, the transistor M3, and the transistor M4 can be heightened by supplying a low-level potential, a ground potential, a negative potential, or the like to the wiring BGL, whereby off-state currents of the transistor M1, the transistor M3, and the transistor M4 can be decreased. Note that the above connection structure of a back gate of a transistor can be determined at the design stage, for not only the transistors in FIG. 1 but also transistors described in other parts in the specification or transistors illustrated in other drawings similarly.

Variation Example 2

Figure 3:
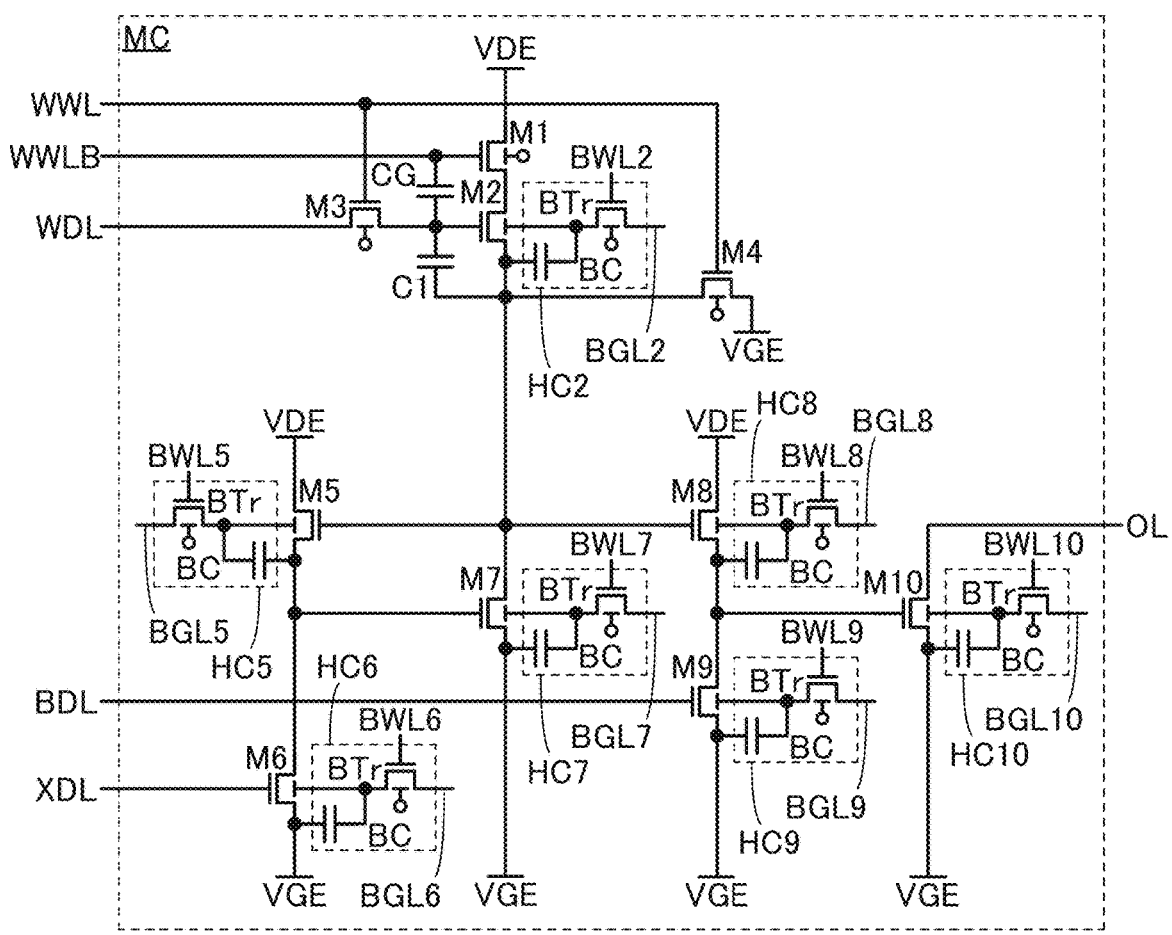
FIG. 3 is a circuit diagram illustrating a structure example of a circuit included in a semiconductor device.

In the structure of the circuit MC in FIG. 1, a potential of a back gate of at least one of the transistor M1 to the transistor M10 may be retained. The circuit MC illustrated in FIG. 3 is a variation example of FIG. 1 and includes a circuit HC2 and a circuit HC5 to a circuit HC10 for retaining potentials of back gates of the transistor M2 and the transistor M5 to the transistor M10, respectively.

Each of the circuit HC2 and the circuit HC5 to the circuit HC10 includes a transistor BTr and a capacitor BC.

As the transistor BTr, for example, a transistor that can be used as the transistor M1, the transistor M3, the transistor M4, or the like can be used. To a gate, a source, and a drain of the transistor BTr, a voltage similar to a voltage in the range where the transistor M1, the transistor M3, the transistor M4, or the like operates is appropriately input.

A capacitor usable for the capacitor C1, the capacitor CG, or the like described in this specification and the like can be used as the capacitor BC.

In each of the circuit HC2 and the circuit HC5 to the circuit HC10, a first terminal of the transistor BTr is electrically connected to a first terminal of the capacitor BC.

In the circuit HC2, the first terminal of the transistor BTr is electrically connected to a back gate of the transistor M2. A second terminal of the capacitor BC is electrically connected to the second terminal of the transistor M2. The gate of the transistor BTr is electrically connected to a wiring BWL2, and the second terminal of the transistor BTr is electrically connected to a wiring BGL2.

Similarly, the first terminals of the transistors BTr in the circuit HC5 to the circuit HC10 are electrically connected to the back gates of the transistor M5 to the transistor M10, respectively. The second terminals of the capacitors BC in the circuit HC5 to the circuit HC10 are electrically connected to the second terminals of the transistor M5 to the transistor M10, respectively. In addition, the gates of the transistors BTr in the circuit HC5 to the circuit HC10 are electrically connected to the wiring BWL5 to the wiring BWL10, respectively, and the second terminals of the transistors BTr in the circuit HC5 to the circuit HC10 are electrically connected to the wiring BGL5 to the wiring BGL10, respectively.

The wiring BGL2 and the wiring BGL5 to the wiring BGL10 each function as a wiring for supplying correction potentials, described later, to the circuit HC2 and the circuit HC5 to the circuit HC10, as an example.

In addition, the wiring BWL2 and the wiring BWL5 to the wiring BWL10 each function as a wiring for switching between on states and off states of the transistors BTr included in the circuit HC2 and the circuit HC5 to the circuit HC10, as an example.

For example, in the circuit HC2, when the transistor BTr is an on state by the wiring BWL2, a correction potential for controlling the threshold voltage of the transistor M2 can be written to the first terminal of the capacitor BC from the wiring BGL2. Note that it is preferable that the second terminal of the transistor M2 not be in a floating state (the second terminal of the transistor M2 be in a conduction state with a wiring for supplying a constant voltage).

Also in the circuit HC5 to the circuit HC10, the threshold voltages of the transistor M5 to the transistor M10 can be adjusted by writing correction potentials to the first terminals of the capacitors BC in the circuit HC5 to the circuit HC10 similarly.

In particular, in the case where the threshold voltage of each of the transistor M2 and the transistor M5 to the transistor M10 is different from a desired value, the amount of current flowing between the first terminal and the second terminal of each of the transistors is changed greatly. Therefore, the circuit MC preferably includes the circuit HC2 and the circuit HC5 to the circuit HC10 for retaining correction potentials to adjust the threshold voltages of the transistor M2 and the transistor M5 to the transistor M10.

The wiring BGL2 and the wiring BGL5 to the wiring BGL10 may be combined into one wiring, for example. At this time, it is preferable that each of the wiring BWL2 and the wiring BWL5 to the wiring BWL10 function as a selection signal line for selecting any one of the circuit HC2 and the circuit HC5 to the circuit HC10 as a writing destination of the correction potential.

In the structure illustrated in FIG. 3, the circuit HC2 and the circuit HC5 to the circuit HC10 are electrically connected to the transistor M2 and the transistor M5 to the transistor M10, respectively; however, one embodiment of the present invention is not limited to the structure. For example, one or some but not all of the transistor M2 and the transistor M5 to the transistor M10 may be electrically connected to the circuit(s) for retaining correction potentials. Moreover, for example, the transistor M1, transistor M3, and/or transistor M4 may also be electrically connected to a circuit(s) for retaining correction potentials, like the circuit HC2 and the circuit HC5 to the circuit HC10. In other words, one or more transistors included in the circuit MC illustrated in FIG. 1 are selected and the circuit(s) for retaining correction potentials may be provided for the selected one or more transistors.

Variation Example 3

Any one of a planar-type capacitor, a trench-type capacitor, and the like can be applied to the capacitor C1 and/or the capacitor CG in the circuit MC illustrated in FIG. 1, for example. The capacitor C1 and/or the capacitor CG can be a capacitor including a transistor.

Figure 2B:
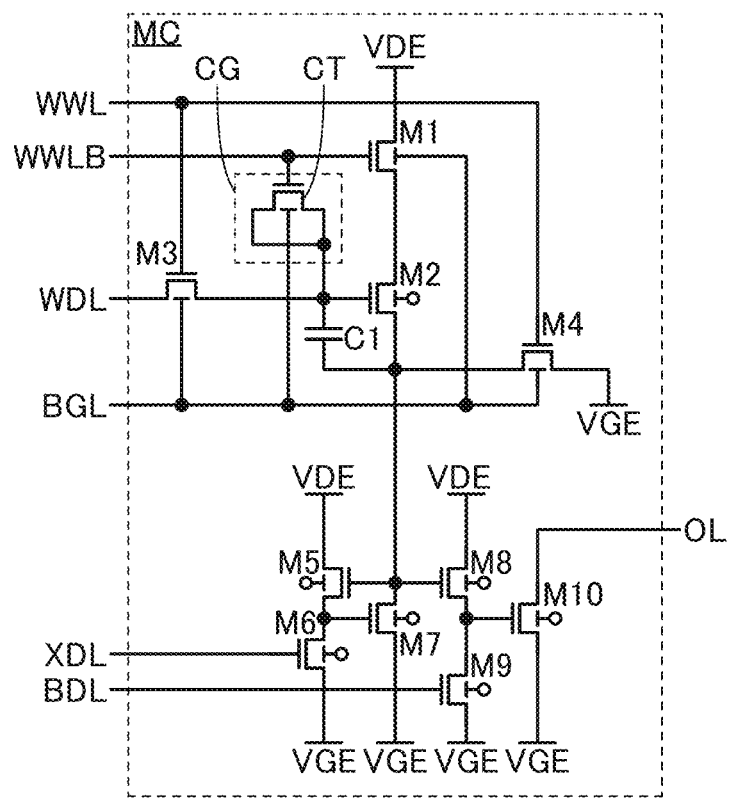

For example, FIG. 2B illustrates a structure of the circuit MC in the case where the capacitor CG in the circuit MC of FIG. 2A includes a transistor. The capacitor CG includes a transistor CT, a gate of the transistor CT is electrically connected to the wiring WWLB and the gate of the transistor M1, and a first terminal and a second terminal of the transistor CT are electrically connected to the second terminal of the transistor M3, the gate of the transistor M2, and the first terminal of the capacitor C1. That is to say, this is a structure in which a gate capacitance of the transistor CT is used as the capacitor CG included in the circuit MC illustrated in FIG. 2B.

As illustrated in FIG. 2B, the gate capacitance of the transistor CT is used as the capacitor CG included in the circuit MC, so that a potential difference of a voltage drop of the first terminal (the gate of the transistor M2) of the capacitor C1 due to parasitic capacitance between the gate and the second terminal of the transistor M3 at the time of transition from the on state to the off state of the transistor M3 can be approximately equal to a potential difference of a voltage rise of the second terminal of the capacitor CG due to transition in the potential of the first terminal of the capacitor CG from a low-level potential to a high-level potential. Thus, the gate capacitance of the transistor CT is used as the capacitor CG included in the circuit MC, whereby it is possible to prevent a drop of a voltage $V_W$ written to the first terminal of the capacitor C1 due to the parasitic capacitance between the gate and the second terminal of the transistor M3. In this case, the size of the transistor CT is preferably equal to the size of the transistor M3. Note that the size of a transistor in this specification and the like refers to, for example, a channel length, a channel width, a transistor structure, or the like.

Although FIG. 1 to FIG. 3, FIG. 4, and FIG. 5, described later, and the like each illustrate the structure in which the circuit MC includes the capacitor CG, the structure of the circuit MC of the semiconductor device of one embodiment of the present invention is not limited thereto. For example, in the circuit MC of the semiconductor device of one embodiment of the present invention, the capacitor CG may be omitted in FIG. 1 to FIG. 3, FIG. 4 and FIG. 5, described later, and the like. In this case, in consideration of a difference of a potential that drops due to the parasitic capacitance between the gate and the second terminal of the transistor M3, a voltage written to the first terminal of the capacitor C1 is preferably a voltage obtained by addition of the difference of the potential to the voltage $V_W$ corresponding to the first data.

Variation Example 4

In the circuit MC illustrated in FIG. 1, for example, the amount of current flowing between the first terminal and the second terminal of the transistor M2 depends on the voltage between the gate and the second terminal of the transistor M2; however, when a high power supply potential is applied to the first terminal of the transistor M2, drain-induced barrier lowering (DIBL) might occur in the transistor M2. Drain-induced barrier lowering in the transistor M2 reduces the threshold voltage of the transistor M2, so that the voltage range where the transistor M2 operates in the subthreshold region might be varied.

Thus, the transistors included in the circuit MC in FIG. 1 may each have a structure in which two or more transistors are connected in series. Such a structure in which two or more transistors are connected in series is referred to as a multi-gate transistor in some cases.

Figure 4:
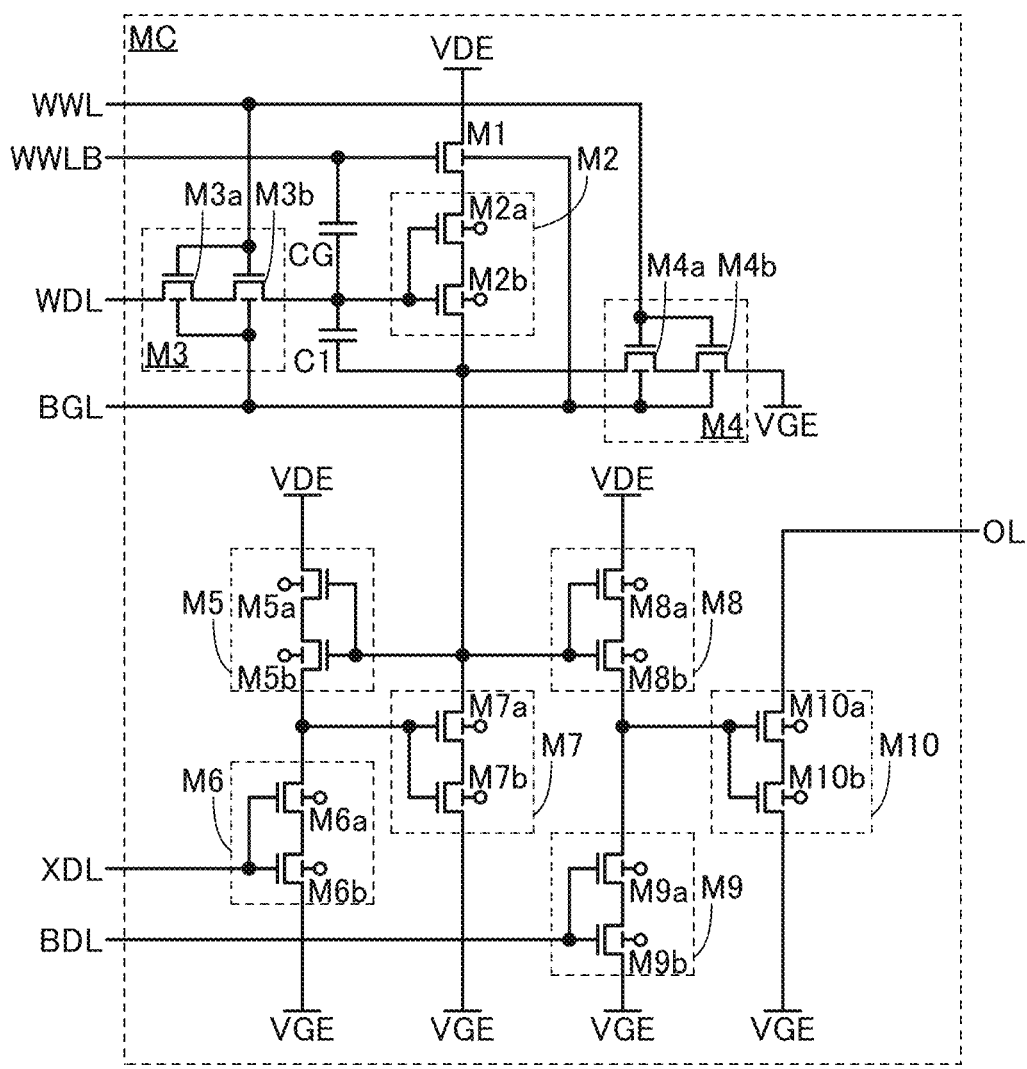
FIG. 4 is a circuit diagram illustrating a structure example of a circuit included in a semiconductor device.

FIG. 4 illustrates a structure example in which each of the transistor M2 to the transistor M10 in FIG. 2A is replaced with a multi-gate transistor in which two transistors are connected in series.

In FIG. 4, the transistor M2 includes a transistor M2a and a transistor M2b; the transistor M3 includes a transistor M3a and a transistor M3b; and the transistor M4 includes a transistor M4a and a transistor M4b, for example. The transistor M5 includes a transistor M5a and a transistor M5b; the transistor M6 includes a transistor M6a and a transistor M6b; and the transistor M7 includes a transistor M7a and a transistor M7b. In addition, the transistor M8 includes a transistor M8a and a transistor M8b; the transistor M9 includes a transistor M9a and a transistor M9b; and the transistor M10 includes a transistor M10a and a transistor M10b.

A gate of each of the transistor M2a and the transistor M2b corresponds to the gate of the transistor M2 in FIG. 2A, a back gate of each of the transistor M2a and the transistor M2b corresponds to the back gate of the transistor M2 in FIG. 2A, and a first terminal of the transistor M2a corresponds to the first terminal of the transistor M2 in FIG. 2A. A second terminal of the transistor M2a is electrically connected to a first terminal of the transistor M2b. A second terminal of the transistor M2b corresponds to the second terminal of the transistor M2 in FIG. 2A.

The above-described connection structure of the transistor M2a and transistor M2b can be referred to, for the transistor M3a, the transistor M3b, the transistor M4a, the transistor M4b, the transistor M5a, the transistor M5b, the transistor M6a, the transistor M6b, the transistor M7a, the transistor M7b, the transistor M8a, the transistor M8b, the transistor M9a, the transistor M9b, the transistor M10a, and the transistor M10b.

As illustrated in FIG. 4, when the transistor M3 and transistor M4 included in the circuit MC are each a multi-gate transistor, a leakage current flowing in the off-state of each of the transistor M3 and transistor M4 can be further reduced. In addition, when the transistor M3 or the transistor M4 is in an on-state, drain-induced barrier lowering can be prevented from occurring in the transistor.

Note that although the transistor M2 to the transistor M10 are each a multi-gate transistor in the illustration of FIG. 4, at least one of the transistor M2 to the transistor M10 included in the circuit MC of the semiconductor device of one embodiment of the present invention may be a multi-gate transistor. Although FIG. 4 illustrates the structure in which the transistor M1 included in the circuit MC is not replaced with a multi-gate transistor, the transistor M1 may be replaced with a multi-gate transistor (not illustrated).

It is described above that the drain-induced barrier lowering in the transistor can be prevented and/or the off-leakage current of the transistor can be reduced by replacing the transistors included in the circuit MC in FIG. 2A with multi-gate transistors. Another structure may be employed so as to prevent the drain-induced barrier lowering in a transistor and/or reduce the off-leakage current of the transistor. For example, the drain-induced barrier lowering in a transistor can be prevented and/or the off-leakage current of the transistor can be reduced also by setting the channel lengths of the transistors in the circuit MC in FIG. 2A to appropriate lengths.

For example, it is preferable that the channel length (referred to as L length in some cases) of each of the transistor M1 to transistor M10 be, specifically, 200 nm, further preferably 300 nm, still further preferably 400 nm in FIG. 2A. Furthermore, in FIG. 4, it is preferable that the channel length of each transistor included in the transistor M2 to transistor M10 that are multi-gate transistors be specifically 100 nm, further preferably 150 nm, still further preferably 200 nm.

Variation Example 5

In the structure of the circuit MC in FIG. 1, it is determined whether or not a high power supply potential from the wiring VDE is supplied to the first terminal of the transistor M2, depending on the on state or off state of the transistor M1. The wiring VDE is also electrically connected to the first terminal of the transistor M5 and the first terminal of the transistor M8; thus, a switching element for controlling supply of a high power supply potential from the wiring VDE may also be provided for the first terminal of the transistor M5 and the first terminal of the transistor M8.

Figure 5:
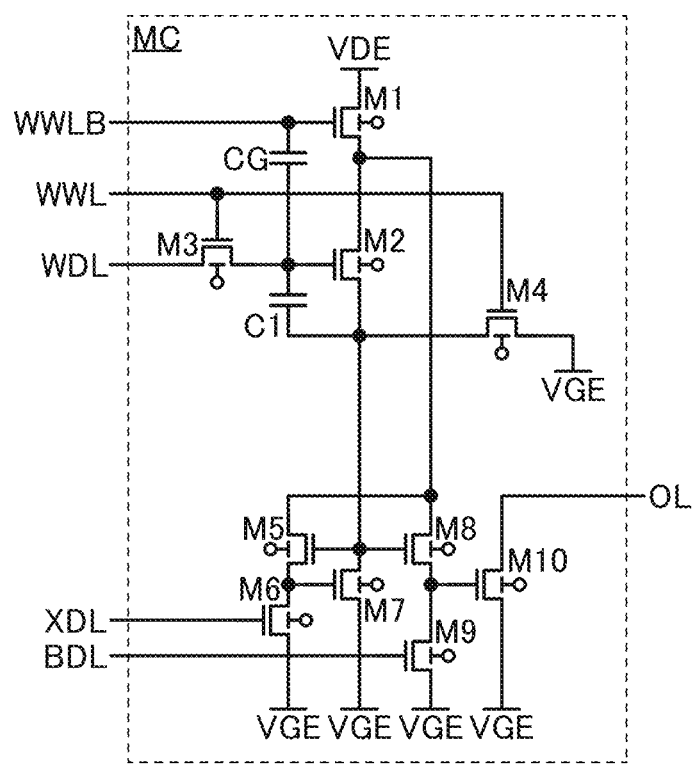
FIG. 5 is a circuit diagram illustrating a structure example of a circuit included in a semiconductor device.

The circuit MC in FIG. 5 is a variation example of the circuit MC in FIG. 1, and the first terminal of the transistor M5 and the first terminal of the transistor M8 are electrically connected to the second terminal of the transistor M1.

Since the wiring VDE is electrically connected to the first terminal of the transistor M5 and the first terminal of the transistor M8 in the circuit MC in FIG. 1, a current constantly flows between the first terminal and the second terminal of each of the transistor M5 and the transistor M8. On the other hand, in the circuit MC in FIG. 5, a current flows between the first terminal and the second terminal of each of the transistor M2, the transistor M5, and the transistor M8 when the transistor M1 is turned on. Thus, the supply of the high power supply potential can be stopped when multiplication is not performed in the circuit MC, leading to reduction of power consumption.

A low-level potential is input to the wiring WWLB to turn off the transistor M1, while a high-level potential is input to the wiring WWL. When a high-level potential is also input to the wiring WDL, the transistor M2 is turned on. Thus, the first terminals of the transistor M5 and the transistor M8 are in electrical continuity states with the wiring VGE through the first terminal and the second terminal of the transistor M2 and the first terminal and the second terminal of the transistor M4. In this case, the constant voltage supplied from the wiring VGE is a ground potential, whereby the second terminal of the transistor M2, the second terminal of the transistor M1, the first terminal of the transistor M5, and the first terminal of the transistor M8 can be set to the ground potential. Before the multiplication is performed in the circuit MC in FIG. 5, the second terminal of the transistor M2, the second terminal of the transistor M1, the first terminal of the transistor M5, the first terminal of the transistor M8, and the like in the circuit MC are set to the ground potential in advance described above, enabling the circuit MC to perform a multiplication operation stably.

Note that the circuit MC of one embodiment of the present invention can have a structure obtained by combining structures selected from the above structure examples as appropriate.

Structure Example 1 of Semiconductor Device

Here, structure examples of a semiconductor device for which the circuit MC illustrated in FIG. 1 can be used are described.

Figure 6A:
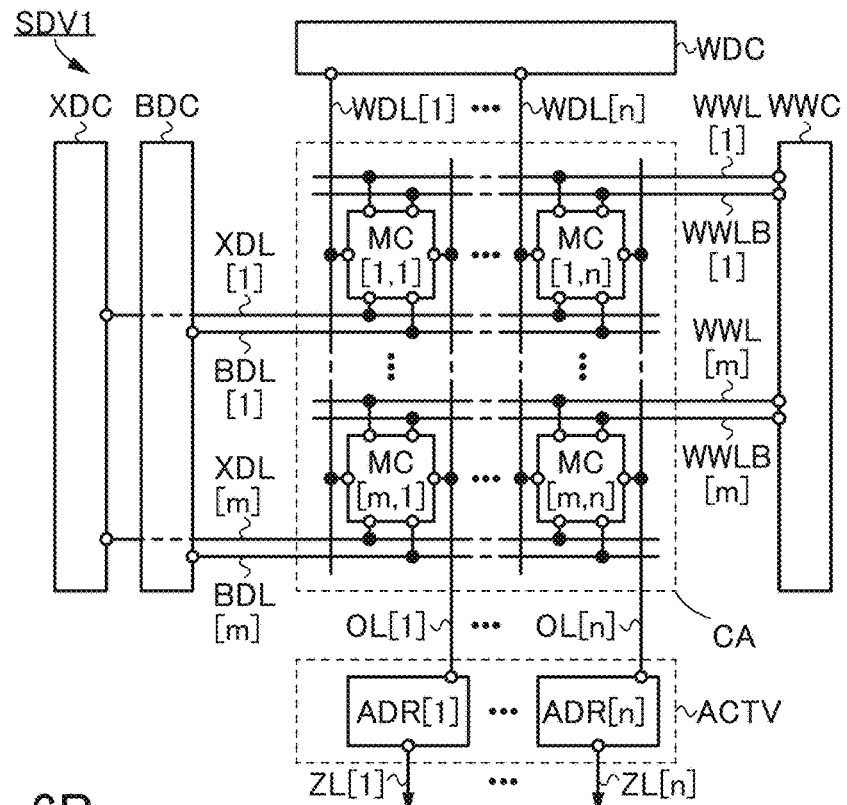
FIG. 6A and FIG. 6B are block diagrams illustrating structure examples of a semiconductor device.

FIG. 6A is a circuit diagram illustrating a structure example of the semiconductor device for which the circuit MC in FIG. 1, FIG. 4, or the like can be used. A semiconductor device SDV1 illustrated in FIG. 6A includes a circuit WDC, a circuit XDC, a circuit BDC, a circuit WWC, a cell array CA, and the circuit ACTV, for example. The circuit ACTV includes a circuit ADR[1] to a circuit ADR[n], for example.

The cell array CA includes a plurality of circuits MC in FIG. 1, FIG. 4, or the like, for example. Specifically, in the cell array CA, the plurality of circuits MC are arranged in a matrix of m rows and n columns (m is an integer greater than or equal to 1 and n is an integer greater than or equal to 1).

In the cell array CA, a circuit MC[1,1], a circuit MC[m,1], a circuit MC[1,n], and a circuit MC[m,n] are selected and illustrated as the circuits MC in FIG. 6A, for example.

The circuit MC[1,1] is electrically connected to a wiring WDL[1], a wiring WWL[1], a wiring WWLB[1], a wiring XDL[1], a wiring BDL[1], and a wiring OL[1]. The circuit MC[m,1] is electrically connected to the wiring WDL[1], a wiring WWL[m], a wiring WWLB[m], a wiring XDL[m], a wiring BDL[m], and the wiring OL[1]. The circuit MC[1,n] is electrically connected to a wiring WDL[n], the wiring WWL[1], the wiring WWLB[1], the wiring XDL[1], the wiring BDL[1], and a wiring OL[n]. The circuit MC[m,n] is electrically connected to the wiring WDL[n], the wiring WWL[m], the wiring WWLB[m], the wiring XDL[m], the wiring BDL[m], and the wiring OL[n].

That is, when i is an integer greater than or equal to 1 and less than or equal to m and j is an integer greater than or equal to 1 and less than or equal to n, it can be said that the circuit MC[i, j](not illustrated in FIG. 6A) is electrically connected to a wiring WDL[j], a wiring WWL[i], a wiring WWLB[i], a wiring XDL[i], a wiring BDL[i], and a wiring OL[j].

Note that the wiring WDL[j] corresponds to the wiring WDL illustrated in FIG. 1 or the like. The wiring WWL[i] corresponds to the wiring WWL illustrated in FIG. 1 or the like, and the wiring WWLB[i] corresponds to the wiring WWLB illustrated in FIG. 1 or the like. The wiring XDL[i] corresponds to the wiring XDL illustrated in FIG. 1 or the like, and the wiring BDL[i] corresponds to the wiring BDL illustrated in FIG. 1 or the like. The wiring OL[j] corresponds to the wiring OL illustrated in FIG. 1 or the like.

The circuit WDC is electrically connected to the wiring WDL[1] to the wiring WDL[n]. The circuit XDC is electrically connected to the wiring XDL[1] to the wiring XDL[m]. The circuit BDC is electrically connected to the wiring BDL[1] to the wiring BDL[m]. The circuit WWC is electrically connected to the wiring WWL[1] to the wiring WWL[m] and the wiring WWLB[1] to the wiring WWLB[m]. The circuit ADR[1] to the circuit ADR[n] are electrically connected to the wiring OL[1] to the wiring OL[n], respectively, and a wiring ZL[1] to a wiring ZL[n], respectively.

The circuit WDC functions as a driver circuit for supplying, to the wiring WDL[1] to the wiring WDL[n], a voltage corresponding to the first data to be written to the circuits MC included in the cell array CA, for example.

The circuit XDC functions as a driver circuit for supplying, to the wiring XDL[1] to the wiring XDL[m], a voltage corresponding to the second data to be input to the circuits MC included in the cell array CA, for example.

For example, the circuit BDC functions as a driver circuit for supplying, to the wiring BDL[1] to the wiring BDL[m], a voltage to be input to the circuits MC included in the cell array CA, for adjusting an amount of current flowing through the wiring OL corresponding to the arithmetic operation result.

The circuit WWC has a function of selecting the circuit MC to which the first data is written when the first data is written to the circuit MC included in the cell array CA through the wiring WWL[1] to the wiring WWL[m], for example. Specifically, for example, when the first data is written to a circuit MC[i,1] to a circuit MC[i,n] in the i-th row of the cell array CA, the circuit WWC supplies a high-level potential to the wiring WWL[i] and supplies a low-level potential to the wiring WWL[1] to the wiring WWL[m] except the wiring WWL[i], thereby selecting the circuit MC[i,1] to the circuit MC[i,n] to which the first data is to be written.

The circuit WWC has a function of transmitting, to the wiring WWLB[i], an inverted signal of a selection signal transmitted to the wiring WWL[i], for example. The circuit WWC may transmit a different signal to the wiring WWLB[i] instead of the inverted signal. For example, when a low-level potential is input to the wiring WWL[i], the circuit WWC may have a function of inputting a low-level potential also to the wiring WWLB[i]. This enables retention of the first data and the stop of supply of a high power supply potential to the first terminal of the transistor M2 to be performed at the same time in the circuit MC in FIG. 1 or the like.

When the j-th column of the cell array CA is focused on, the sum of the amounts of current $I_Y$ output from a circuit MC[11] to a circuit MC[m,j] flows to the wiring OL. Here, a current flowing through the transistor M2 in the circuit MC[i,j] is $I_W[i,j]$, a current flowing through the transistor M6 in the circuit MC[i,j] is $I_X[i]$, and the amount of current flowing from the wiring OL to the circuit MC[i,j] is $I_Y[i,j]$. In addition, when the amount of current flowing through the transistor M9 in each of the circuit MC[1,j] to the circuit MC[m,j] is $I_B$, the amount of current $I_S[j]$ flowing through the wiring OL can be expressed by the following formula.

[Formula 7]

$$I_S[j] = \sum_{i=1}^{m} I_Y[i,j] = \frac{1}{I_B}\sum_{i=1}^{m} I_W[i,j] I_X[i] \quad (1.7)$$

The circuit ADR[j] has a function of outputting a voltage corresponding to the amount of current flowing from the wiring OL[j] to the circuit ADR[j], a function of performing an arithmetic operation according to a function system preliminarily defined using the voltage, and a function of outputting a result of the arithmetic operation of the function to the wiring ZL[j], for example.

Figure 7A:
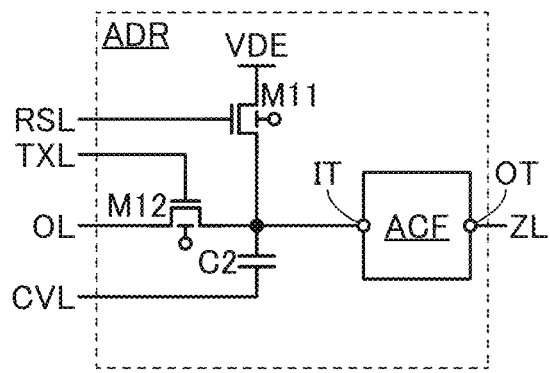
FIG. 7A to FIG. 7C are circuit diagrams each illustrating a structure example of a circuit included in a semiconductor device.

For example, a structure of the circuit ADR illustrated in FIG. 7A can be applied to the circuit ADR[j]. The circuit ADR illustrated in FIG. 7A includes a transistor M11, a transistor M12, a capacitor C2, and a circuit ACF as an example. The circuit ACF includes a terminal IT serving as an input terminal and a terminal OT serving as an output terminal.

As the transistor M11 and the transistor M12, for example, a transistor that can be used as the transistor M1, the transistor M3, the transistor M4, or the like can be used. To a gate, a source, and a drain of the transistor M11 or the transistor M12, a voltage similar to a voltage in the range where the transistor M1, the transistor M3, the transistor M4, or the like operates is appropriately input.

In FIG. 7A, a first terminal of the transistor M11 is electrically connected to the wiring VDE, and the gate of the transistor M11 is electrically connected to a wiring RSL. Furthermore, a first terminal of the transistor M12 is electrically connected to the wiring OL, a second terminal of the transistor M12 is electrically connected to a second terminal of the transistor M11, a first terminal of the capacitor C2, and the terminal IT of the circuit ACF, and the gate of the transistor M12 is electrically connected to a wiring TXL. A second terminal of the capacitor C2 is electrically connected to a wiring CVL. The terminal OT of the circuit ACF is electrically connected to a wiring ZL.

In the case where the circuit ADR in FIG. 7A is used as the circuit ADR[j] (not illustrated) in the semiconductor device SDV1 in FIG. 6A, the wiring OL illustrated in FIG. 7A corresponds to the wiring OL[j] (not illustrated) in FIG. 6A, the wiring ZL illustrated in FIG. 7A corresponds to the wiring ZL[j] (not illustrated) in FIG. 6A.

For example, the wiring CVL functions as a wiring for supplying a constant voltage to the second terminal of the capacitor C2 to retain a potential between the first terminal and the second terminal of the capacitor C2. The constant voltage can be, for example, a low-level potential, a ground potential, a negative potential, or the like. The potential supplied from the wiring CVL may be equal to the potential supplied from the wiring VGE, for example. Alternatively, the wiring CVL may be the same wiring as the wiring VGE.

For example, the wiring RSL functions as a wiring for transmitting a reset signal to write an initialization potential to the first terminal of the capacitor C2 in the circuit ADR. Specifically, for example, in the case where an initialization potential is supplied to the first terminal of the capacitor C2, a low-level potential is input to the wiring TXL to turn off the transistor M12, a high-level potential is input to the wiring RSL to turn on transistor M11, and then a high power supply potential (initialization potential) is supplied to the first terminal of the capacitor C2 from the wiring VDE. After that, a low-level potential is input to the wiring RSL to turn off the transistor M11, whereby initialization of the potential of the first terminal of the capacitor C2 is completed.

The wiring TXL functions as a wiring for transmitting a signal to read out a current flowing through the wiring OL, as an example. Specifically, when a current flowing through the wiring OL is read out, the potential of the first terminal of the capacitor C2 is set to be an initialization potential as described above, and then a high-level potential is input to the wiring TXL to turn on the transistor M12, whereby electrical continuity is established between the first terminal of the capacitor C2 and the wiring OL. In this case, when the circuit ADR in FIG. 7A is used as the circuit ADR[j] (not illustrated) in FIG. 6A, the amount of current $I_S[j]$ represented by the formula (1.7) flows to the wiring OL[j] (not illustrated) from the circuit ADR[j]. In this case, the high-level potential is supplied to the wiring TXL in a certain period, whereby the amount of charge retained in the first terminal of the capacitor C2 is determined by the product of the time in which the high-level potential is supplied to the wiring TXL and the amount of current $I_S[j]$. Therefore, the potential of the first terminal of the capacitor C2 is determined by the capacitance and the amount of charge of the capacitor C2.

The circuit ACF has, for example, a function of outputting a potential of the input terminal of the circuit ACF, i.e., a voltage based on the potential of the first terminal of the capacitor C2, to an output terminal of the circuit ACF. Note that a specific structure example of the circuit ACF will be described later.

Note that the circuit ADR that can be used for the semiconductor device SDV1 in FIG. 6A is not limited to the structure of FIG. 7A. The circuit ADR that can be used for the semiconductor device SDV1 may have a structure of a circuit ADR illustrated in FIG. 7B, for example. The circuit ADR illustrated in FIG. 7B has a structure in which a wiring BGLA is electrically connected to back gates of the transistor M11 and the transistor M12. In particular, a low-level potential, a ground potential, a negative potential, or the like is supplied to the wiring BGLA in the structure of FIG. 7B, so that the threshold voltages of the transistor M11 and the transistor M12 can be heightened, which can lower the off-state currents of the transistor M11 and the transistor M12. The potential supplied to the wiring BGLA may be not a fixed potential but a variable potential as described for the wiring BGL in FIG. 2A.

Figure 7B:
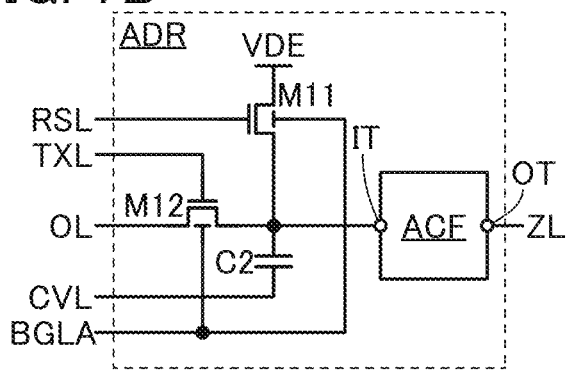
Figure 7C:
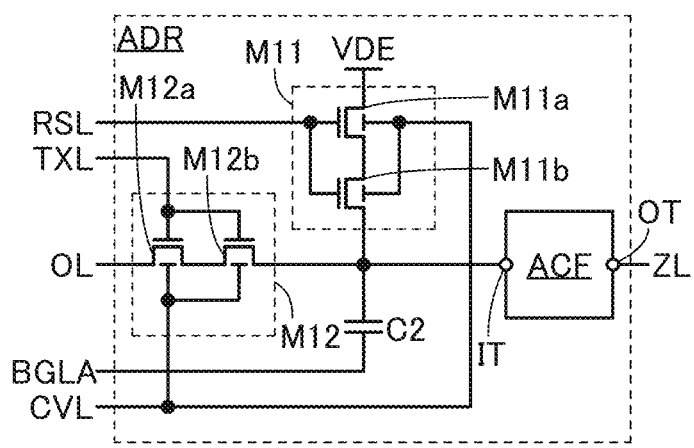

As the circuit ADR that can be used in the semiconductor device SDV1, for example, each of the transistor M11 and the transistor M12 in the circuit ADR in FIG. 7B may be replaced with a multi-gate transistor, as illustrated in FIG. 7C. In FIG. 7C, the transistor M11 includes a transistor M11a and a transistor M11b, and the transistor M12 includes a transistor M12a and a transistor M12b, for example.

Gates of the transistor M11a and the transistor M11b correspond to the gate of the transistor M11 in FIG. 7B, back gates of the transistor M11a and the transistor M11b correspond to the back gate of the transistor M11 in FIG. 7B, and a first terminal of the transistor M11a corresponds to the first terminal of the transistor M11 in FIG. 7B. A second terminal of the transistor M11a is electrically connected to a first terminal of the transistor M11b. A second terminal of the transistor M11b corresponds to the second terminal of the transistor M11 in FIG. 7B.

For the transistor M12a and the transistor M12b as well, the description of connection structure of the transistor M11a and the transistor M11b is referred to.

As illustrated in FIG. 7C, a multi-gate transistor is used for each of the transistor M11 and the transistor M12 included in the circuit ADR, so that off-state leakage currents of the transistor M11 and transistor M12 can be further lowered. In addition, when the transistor M11 or the transistor M12 is in an on state, drain-induced barrier lowering can be prevented from occurring in the transistor.

Figure 8A:
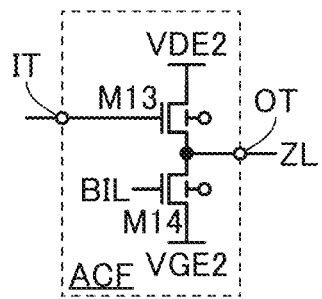
FIG. 8A to FIG. 8D are circuit diagrams each illustrating a structure example of a circuit included in a semiconductor device.

In an example of a specific structure of the circuit ACF, a source follower circuit in FIG. 8A can be employed. A circuit ACF illustrated in FIG. 8A includes a transistor M13 and a transistor M14.

As the transistor M13 and transistor M14, for example, a transistor that can be used as transistor M2, the transistor M5 to the transistor M10, or the like can be used. To a gate, a source, and a drain of the transistor M13 or the transistor M14, a voltage similar to a voltage in the range where the transistor M2, the transistor M5 to the transistor M10, or the like operates is appropriately input.

The gate of the transistor M13 is electrically connected to the terminal IT of the circuit ACF, a first terminal of the transistor M13 is electrically connected to a wiring VDE2, and a second terminal of the transistor M13 is electrically connected to a first terminal of the transistor M14 and the terminal OT. A second terminal of the transistor M14 is connected to a wiring VGE2, and the gate of the transistor M14 is electrically connected to a wiring BIL.

The wiring VDE2 functions as a wiring that supplies a constant voltage, for example. The constant voltage can be a high power supply potential or the like. Note that the high power supply potential supplied from the wiring VDE2 can be equal to a high power supply potential supplied from the wiring VDE. Alternatively, the high power supply potential supplied from the wiring VDE2 may be different from the high power supply potential supplied from the wiring VDE.

The wiring VGE2 functions as a wiring that supplies a constant voltage, for example. The constant voltage can be a low power supply voltage or the like. Note that a high power supply potential supplied from the wiring VGE2 can be equal to a low power supply potential supplied from the wiring VGE. Alternatively, the low power supply potential supplied from the wiring VGE2 may be different from the low power supply potential supplied from the wiring VGE2.

The wiring BIL functions as a wiring for supplying a constant voltage to be input to the gate of the transistor M14, for example.

By using the source follower circuit illustrated in FIG. 8A for each of the circuits ACF in FIG. 7A to FIG. 7C, the circuit ACF can output a potential approximately equal to the potential input to the terminal IT of the circuit ACF, from the terminal OT.

Figure 8B:
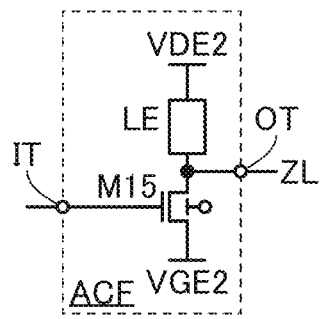

As the specific structures of the circuits ACF in FIG. 7A to FIG. 7C, a common source circuit illustrated in FIG. 8B can be used, for example. A circuit ACF illustrated in FIG. 8B includes a transistor M15 and a load LE, for example.

As the load LE, for example, a resistor, a diode, a transistor, or the like can be used.

As the transistor M15, for example, a transistor that can be used as the transistor M2, the transistor M5 to the transistor M10, or the like can be used. To a gate, a source, and a drain of the transistor M15, a voltage similar to a voltage in the range where the transistor M2, the transistor M5 to the transistor M10, or the like operates is appropriately input.

The gate of the transistor M15 is electrically connected to the terminal IT of the circuit ACF, a first terminal of the transistor M15 is electrically connected to a first terminal of the load LE and the terminal OT of the circuit ACF, and a second terminal of the transistor M15 is electrically connected to the wiring VGE2. A second terminal of the load LE is electrically connected to the wiring VDE2.

For the wiring VDE2 and wiring VGE2, the description of the wiring VDE2 and the wiring VGE2 in the circuit ACF in FIG. 8A is referred to.

When the common source circuit illustrated in FIG. 8B is used as the circuits ACF in FIG. 7A to FIG. 7C, the circuit ACF can output a potential corresponding to a potential input to the terminal IT of the circuit ACF, from the terminal OT. For example, when the amount of current $I_S[j]$ is large, the potential of the first terminal of the capacitor C2 is greatly decreased from the initialization potential, which decreases a current flowing between the first terminal and the second terminal of the transistor M15 and increases a voltage output from the terminal OT (closer to a voltage supplied from the wiring VDE2). On the other hand, when the amount of current $I_S[j]$ is small, a voltage drop of the potential of the first terminal of the capacitor C2 from the initialization potential is small, which increases a current flowing between the first terminal and the second terminal of the transistor M15 and decreases the voltage output from the terminal OT (closer to a voltage supplied from the wiring VGE2).

As specific structures of the circuits ACF in FIG. 7A to FIG. 7C, a digital circuit can be adopted, for example. As the digital circuit, a buffer circuit illustrated in FIG. 8C can be used, for example. The circuit ACF illustrated in FIG. 8C includes an inverter circuit INV1 and an inverter circuit INV2, for example.

An input terminal of the inverter circuit INV1 is electrically connected to the terminal IT of the circuit ACF, an output terminal of the inverter circuit INV1 is electrically connected to an input terminal of the inverter circuit INV2, and an output terminal of the inverter circuit INV2 is electrically connected to the terminal OT of the circuit ACF.

Figure 8C:
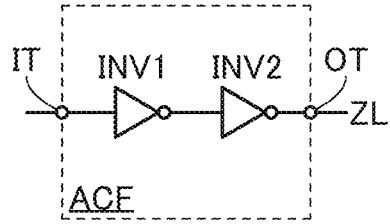

By using the buffer circuit in FIG. 8C as the circuits ACF in FIG. 7A to FIG. 7C, the circuit ACF can output either a high-level potential or a low-level potential in accordance with a potential input to the terminal IT of the circuit ACF, from the terminal OT. For example, when the amount of current $I_S[j]$ is large, the potential of the first terminal of the capacitor C2 is greatly decreased from the initialization potential; therefore, the potential of the input terminal of the inverter circuit INV1 becomes lower, and a voltage output from the terminal OT becomes a low-level potential. Meanwhile, when the amount of current $I_S[j]$ is small, a voltage drop of the potential of the first terminal of the capacitor C2 from the initialization potential becomes small. In the case where the potential supplied to the input terminal of the inverter circuit INV1 is not below the threshold voltage of the inverter circuit INV1, the voltage output from the terminal OT becomes a high-level potential.

The structure of the buffer circuit applied to the circuits ACF in FIG. 7A to FIG. 7C is not limited to that illustrated in FIG. 8C. The structure of the buffer circuit applied to the circuits ACF in FIG. 7A to FIG. 7C may be a structure illustrated in FIG. 8D, for example. A circuit ACF illustrated in FIG. 8D includes a NAND circuit ND and an inverter circuit INV3.

A first input terminal of the NAND circuit ND is electrically connected to the terminal IT of the circuit ACF, a second input terminal of the NAND circuit ND is electrically connected to a wiring PI, an output terminal of the NAND circuit ND is electrically connected to an input terminal of an inverter circuit INV3, and an output terminal of the inverter circuit INV3 is electrically connected to the terminal OT of the circuit ACF.

Figure 8D:
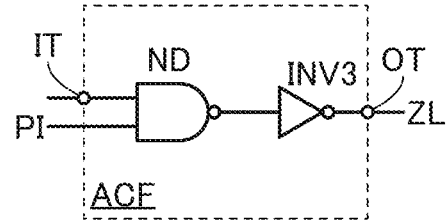

When a low-level potential is input to the wiring PI in the circuit ACF in FIG. 8D, the circuit ACF outputs from the terminal OT either a high-level potential or a low-level potential in accordance with a potential input to the terminal IT in the circuit ACF, like the circuit ACF illustrated in FIG. 8C. In other words, the circuit ACF in FIG. 8D can operate as a buffer circuit when a signal (such as a pulse voltage) is input to the wiring PI, like the circuit ACF illustrated in FIG. 8C.

Note that in the circuit ACF illustrated in FIG. 8D, a NOR circuit may be used instead of the NAND circuit ND. In the case where a first input terminal of the NOR circuit is electrically connected to the terminal IT, a second input terminal of the NOR circuit is electrically connected to the wiring PI, and an output terminal of the NOR circuit is electrically connected to the input terminal of the inverter circuit INV3, the circuit ACF can operate as a buffer circuit when a high-level potential is input to the wiring PI, like the circuit ACF illustrated in FIG. 8C.

Note that in the circuits ACF illustrated in FIG. 8A to FIG. 8D or the like, the amount of current $I_B$ flowing through the first terminal and the second terminal of the transistor M9 included in the circuit MC[1,1] to the circuit MC[m,n] can be treated as a variable or a constant of an arithmetic operation performed in the circuit ACF. Specifically, in the circuits ACF in FIG. 8A and FIG. 8B, when a current $I_Y$ represented by the formula (1.7) is input to the terminal IT of the circuit ACF, $1/I_B$ can be regarded as a constant by which $\Sigma I_W \times I_X$ is multiplied in the circuit ACF. The constant can be a coefficient for normalizing $\Sigma I_W \times I_X$ in the range of 0 to 1, inclusive. For example, in the circuits ACF in FIG. 8C and FIG. 8D, when the current $I_Y$ represented by the Formula (1.7) is input to the terminal IT in the circuit ACF, $1/I_B$ can be regarded as a variable that varies the threshold value of an activation function performed in the circuit ACF. Specifically, as $1/I_B$ becomes smaller, $I_Y$ is decreased, so that the threshold voltage can be increased relatively. Furthermore, for example, as $1/I_B$ becomes larger, $I_Y$ is increased, so that the threshold voltage can be decreased relatively.

Note that for the arithmetic operation of the semiconductor device SDV1 in FIG. 6A, a product-sum operation and an activation function operation of a neural network can be performed. In particular, as an operation circuit for an activation function in the neural network, the common source circuit of FIG. 8B or the buffer circuit in FIG. 8C or FIG. 8D can be applied.

Structure Example 2 of Semiconductor Device

Next, a semiconductor device to which the circuit MC of FIG. 1 or the like can be applied to, which is different from the semiconductor device SDV1 illustrated in FIG. 6A, is described.

Figure 6B:
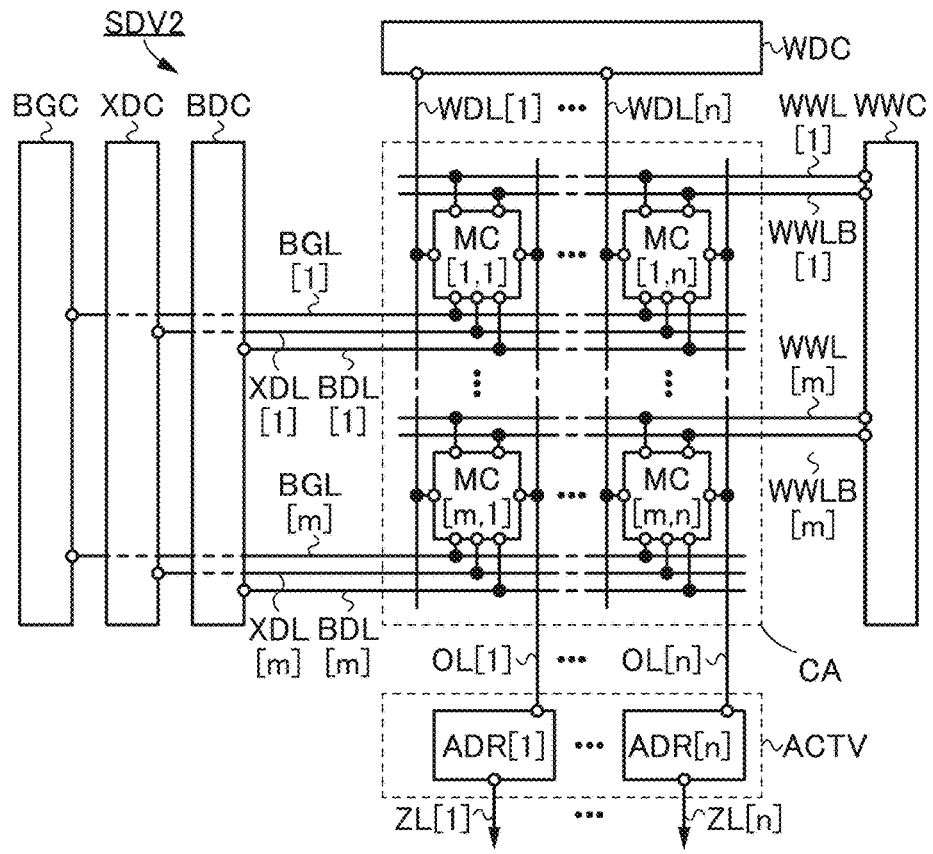

A semiconductor device SDV2 in FIG. 6B is a variation example of the semiconductor device SDV1 in FIG. 6A and includes a circuit BGC. The circuit BGC is electrically connected to a wiring BGL[1] to a wiring BGL[m].

The circuit BGC has a function of inputting a desired constant voltage to each of the wiring BGL[1] to the wiring BGL[m], for example. That is, the circuit BGC functions as a circuit for supplying a constant voltage to back gates of the transistors included in the circuit MC[1,1] to the circuit MC[m,n].

Therefore, for example, the above-described circuits MC in FIG. 2A, FIG. 2B, FIG. 4, and the like can be given as a circuit applicable to the circuit MC[1,1] to the circuit MC[m,n] in the semiconductor device SDV2 in FIG. 6B.

<Example of Stacked Structure of Semiconductor Device>

A structure example in the case where the semiconductor device SDV1, the semiconductor device SDV2, or the like has a stacked structure will be described next.

Figure 9A:
FIG. 9A to FIG. 9D are perspective views each illustrating a structural example of a stacked structure of a semiconductor device.

FIG. 9A illustrates an example of a structure in which a structure body SIL and a structure body OSL are provided above a substrate BSE. In other words, the semiconductor device SDV1, the semiconductor device SDV2, or the like can be formed with circuit elements and the like formed over one substrate BSE.

As the substrate BSE, a variety of substrates can be used, for example. Examples of a variety of substrates include a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

Alternatively, a flexible substrate may be used as the substrate BSE, and a transistor may be directly formed over the flexible substrate. Alternatively, a separation layer may be provided between the substrate and the transistor. After part or the whole of a semiconductor device is completed over the separation layer, the separation layer can be used for separation from the substrate and transfer to another substrate. In that case, the transistor can be transferred to even a substrate having low heat resistance, a flexible substrate, or the like. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then transferred to another substrate, and after that, the transistor may be positioned further over another substrate (e.g., the substrate BSE). Examples of the substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, manufacturing a device with high durability, providing high heat resistance, reducing weight, or reducing thickness can be achieved.

Note that all the circuits necessary to achieve a predetermined function can be formed over one substrate (e.g., a glass substrate, a plastic substrate, a single crystal substrate, or an SOI substrate). In this manner, the cost can be reduced by a reduction in the number of components or the reliability can be improved by a reduction in the number of connection points to circuit components.

Note that it is possible that not all the circuits necessary to achieve a predetermined function are formed over one substrate. That is, it is possible to form part of the circuits necessary to achieve the predetermined function over a given substrate and form the other part of the circuits necessary to achieve the predetermined function over another substrate. For example, part of the circuits necessary to achieve the predetermined function can be formed over a glass substrate, and the other part of the circuits necessary to achieve the predetermined function can be formed over a single crystal substrate (or an SOI substrate). The single crystal substrate where the other part of the circuits necessary to achieve the predetermined function is formed (also referred to as an IC chip) can be connected to the glass substrate by COG (Chip On Glass), and the IC chip can be placed over the glass substrate. Alternatively, the IC chip can be connected to the glass substrate by TAB (Tape Automated Bonding), COF (Chip On Film), or SMT (Surface Mount Technology), or using a printed circuit board, for example. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed over a substrate (e.g., a single crystal substrate) different from a substrate where a pixel portion is formed, whereby an IC chip is formed. The use of this IC chip can prevent the increase in power consumption.

For example, a semiconductor substrate is used as the substrate BSE, whereby a transistor including the semiconductor in its channel formation region can be formed on the top surface of the substrate BSE. In this embodiment, the transistor formed on the top surface of the substrate BSE is included in the structure body SIL. That is, it can be said that the structure body SIL includes a circuit including the transistor.

For example, when a semiconductor substrate containing silicon is used as the substrate BSE, the transistor included in the structure body SIL can be a Si transistor. Therefore, it can be said that the structure body SIL includes a circuit including a Si transistor.

In the example of the stacked structure illustrated in FIG. 9A, the structure body OSL is provided above the structure body SIL. The structure body OSL includes a circuit including an OS transistor, for example. Although detailed description is made in Embodiment 5, the OS transistor can be provided over a planarized insulator, a planarized conductor, or the like, for example. That is, by applying an example of the stacked structure illustrated in FIG. 9A to the semiconductor device of one embodiment of the present invention, two or more transistors whose semiconductor materials in their channel formation regions are different from each other can be used in the semiconductor device.

For example, when the substrate BSE is a semiconductor substrate containing silicon and the transistor included in the structure body OSL is an OS transistor, the example of the stacked structure in FIG. 9A is applied to the above semiconductor devices SDV1, the above semiconductor device SVD2, or the like. Thus, OS transistors and Si transistors can be used in circuits or the like included in the semiconductor device.

Specifically, the structure body OSL includes for example, the circuit WDC, the circuit XDC, the circuit BDC, the circuit WWC, the circuit MC, the circuit ACTV, or the like, the circuits can each include an OS transistor, the structure body SIL includes, for example, a voltage source or the like for supplying a voltage to the circuits, and the voltage source can include a Si transistor. In addition, the structure body OSL includes, for example, a circuit selected from the circuit WDC, the circuit XDC, the circuit BDC, the circuit WWC, the circuit MC, the circuit ACTV, and the like, the selected circuit can include an OS transistor, the structure body SIL includes, for example, the rest of the circuits, which are not selected, and the rest of the circuits can each include a Si transistor.

In addition, it is also possible that the structure body OSL includes, for example, the circuit WDC, the circuit XDC, the circuit BDC, the circuit WWC, the circuit MC, the circuit ACTV, or the like, and the circuits each include an OS transistor, while the structure body SIL includes, for example, a digital arithmetic circuit or the like, and the digital arithmetic circuit may include a Si transistor. With the semiconductor device having such a structure, the semiconductor device can transmit a result obtained by an arithmetic operation of the structure body OSL to the digital arithmetic circuit in the structure body SIL, and can perform a digital operation using the result. For example, in the case where the semiconductor device performs a neural network operation, an arithmetic operation in a first layer in the neural network can be performed by the structure body OSL and arithmetic operations in second and subsequent layers in the neural network can be performed by the digital arithmetic circuit or the like included in the structure body SIL.

Figure 9B:

Alternatively, a stacked structure illustrated in FIG. 9B may be applied to examples of the stacked structure of the semiconductor device SDV1, the semiconductor device SDV2, or the like. The stacked structure illustrated in FIG. 9B is different from the stacked structure in FIG. 9A in that a structure body OSL1 is provided above the structure body SIL and a structure body OSL2 is provided above the structure body OSL1. Each of the structure body OSL1 and the structure body OSL2 can include a circuit including an OS transistor, like the structure body OSL in FIG. 9A. In other words, another structure body including an OS transistor can be stacked over the structure body including an OS transistor. FIG. 9B illustrates the stacked structure in which two structure bodies, the structure body OSL1 and the structure body OSL2, are provided over the structure body SIL; however, three or more structure bodies each including an OS transistor may be provided over the structure body SIL. In a large circuit scale, the area of the substrate BSE provided with circuits could be reduced by stacking a plurality of structure bodies each including an OS transistor.

Figure 9C:
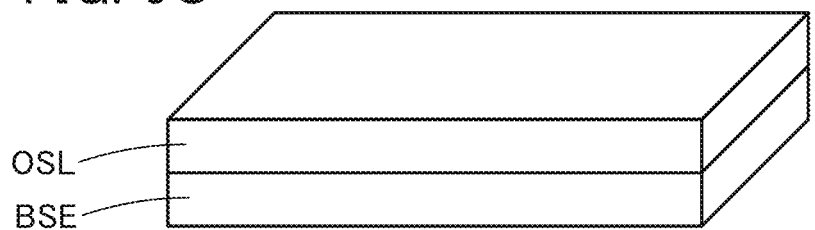

In the case where the substrate BSE is a semiconductor substrate, an insulator substrate, or the like, a structure in which the structure body OSL is provided over the substrate BSE as illustrated in FIG. 9C can be employed for the semiconductor device SDV1, the semiconductor device SDV2, or the like. That is, a structure body including an OS transistor may be provided over the substrate BSE. In other words, a circuit including an OS transistor may be provided over the substrate BSE.

Figure 9D:
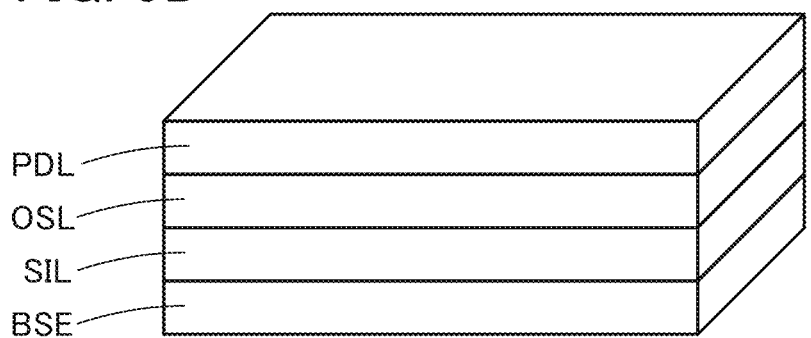

Moreover, a sensor may be provided above the structures in FIG. 9A to FIG. 9C. FIG. 9D illustrates an example of a stacked structure in which a structure body PDL including a sensor is provided over the structure body OSL of FIG. 9A. The sensor included in the structure body PDL can sense information from the outside and convert the sensed information to a current or a voltage. As described above, the sensor can be, for example, an optical sensor including a photosensor (photodiode), a pressure sensor, a gyroscope sensor, an acceleration sensor, an auditory sensor, a temperature sensor, a humidity sensor, a taste sensor, an odor sensor, or the like. At this time, information obtained by the sensor is input to the semiconductor device SDV1, the semiconductor device SDV2, or the like as second data (current or voltage), whereby an arithmetic operation can be performed based on the information obtained by the sensor. In particular, when a neural network operation is performed with use of the semiconductor device SDV1, the semiconductor device SDV2, or the like, inference of input data can be performed with the information obtained by the sensor as the input data. In addition, Embodiment 3 will describe a semiconductor device in which a photosensor (photodiode) is used as the sensor included in the structure body PDL.

As described above, with the use of the circuit MC illustrated in any of FIG. 1 to FIG. 5, a voltage corresponding to the first data can be written to the circuit MC. The circuit MC can output the current $I_Y$ corresponding to the product of the first data and the second data to the wiring OL. With the use of the semiconductor device SDV1 in FIG. 6A or the semiconductor device SDV2 in FIG. 6B, a product-sum operation of a plurality of pieces of first data and a plurality of pieces of second data can be performed.

Note that this embodiment can be combined with any of the other embodiments in this specification as appropriate.

Embodiment 2

The circuits MC described in Embodiment 1 each have a structure in which a voltage corresponding to the first data is written to the first terminal of the capacitor C2 to generate the current $I_W$ in the transistor M2 (voltage writing method). However, a structure in which a current corresponding to the first data is written to generate the current $I_W$ in the transistor M2 (current writing method) may be employed as a semiconductor device of one embodiment of the present invention. In this embodiment, a circuit MC that generates a current $I_W$ by the current writing method is described.

Figure 10:
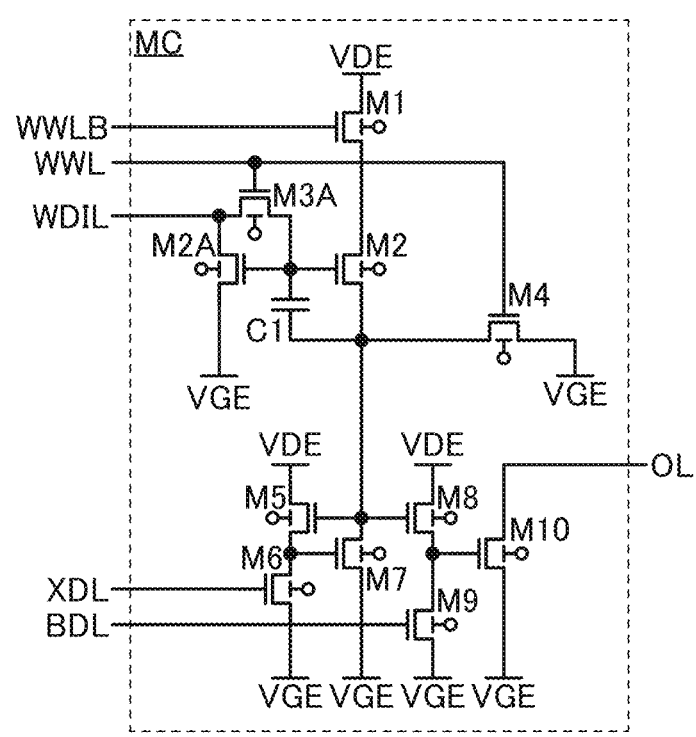
FIG. 10 is a circuit diagram illustrating a structure example of a circuit included in a semiconductor device.

The circuit MC illustrated in FIG. 10 is a variation example of the circuit MC in FIG. 1 and includes a transistor M3A and a transistor M2A, without including the transistor M3 and the capacitor CG.

For example, as the transistor M3A, a transistor that can be used as the transistor M3 included in the circuit MC in FIG. 1 can be used. To a gate, a source, and a drain of the transistor M3A, a voltage similar to a voltage in the range where the transistor M3 operates is appropriately input.

As the transistor M2A, a transistor that can be used as the transistor M2 included in the circuit MC in FIG. 1 can be used, for example. To a gate, a source, and a drain of the transistor M2A, a voltage similar to a voltage in the range where the transistor M2 operates is appropriately input. In addition, the size of the transistor M2A is preferably equal to the size of the transistor M2 illustrated in FIG. 10. In particular, by setting the transistor M2 and the transistor M2A to have substantially the same size, the amount of current flowing between the first terminal and the second terminal of the transistor M2 can be approximately equal to the amount of current flowing between a first terminal and a second terminal of the transistor M2A, when the transistor M2 and the transistor M2A serve as a current mirror circuit due to their electrical connection.

A first terminal of the transistor M3A is electrically connected to the first terminal of the transistor M2A and a wiring WDIL, a second terminal of the transistor M3A is electrically connected to the gate of the transistor M2, the gate of the transistor M2A, and the first terminal of the capacitor C1, and a gate of the transistor M3A is electrically connected to the wiring WWL. The second terminal of the transistor M2A is electrically connected to the wiring VGE.

For the connection structure of the other parts of the circuit MC in FIG. 10, the description of the circuit MC in FIG. 1 is referred to.

The wiring WDIL functions as a write data line (current line) for supplying a current corresponding to the first data to the circuit MC, for example. In particular, when a circuit including the transistor M2 and the transistor M2A functions as a current mirror circuit, the amount of current approximately equal to the amount of current corresponding to the first data from the wiring WDIL can made to flow between the first terminal and the second terminal of the transistor M2.

Next, an operation example of writing a current corresponding to the first data to the circuit MC is described. Note that in this operation example, a potential supplied from the wiring VDE is a high power supply potential, and a potential supplied from the wiring VGE is a ground potential ($V_{GND}$).

A high-level potential is input to the wiring WWL. Thus, the high-level potential is input to gates of the transistor M3A and the transistor M4, so that the transistor M3A and the transistor M4 are turned on.

At this time, electrical continuity is established between the wiring VGE and the second terminal of the capacitor C1 (the second terminal of the transistor M2) through the transistor M4, so that the potential of the second terminal of the capacitor C1 (the second terminal of the transistor M2) becomes $V_{GND}$.

At this time, electrical continuity is established also between the wiring WDIL and the first terminal of the capacitor C1 (the gate of the transistor M2 or the like) through the transistor M3A. That is, the transistor M2A has a diode-connected structure.

Here, when the amount of current (hereinafter, $I_W$) corresponding to the first data is supplied to the circuit MC from the wiring WDIL, the potentials of the first terminal and the gate of the transistor M2A become a potential corresponding to the current (hereinafter, $V_W$). In this case, the voltage $V_W$ is written to the first terminal of the capacitor C1. In addition, a current with the amount of current $I_W$ flows between the first terminal and the second terminal of the transistor M2A.

An inverted signal of a signal transmitted to the wiring WWL is input to the wiring WWLB. Specifically, a low-level potential is input to the wiring WWLB. Thus, the low-level potential is applied to the gate of the transistor M1. Thus, the transistor M1 is turned off.

After the voltage $V_W$ is written to the first terminal of the capacitor C1 (the gate of the transistor M2, or the like), a low-level potential is input to the wiring WWL. Thus, the low-level potential is input to the gates of the transistor M3A and the transistor M4, so that the transistor M3A and the transistor M4 are turned off. Accordingly, the first terminal of the capacitor C1 is brought into a floating state, whereby the voltage $V_W$-$V_{GND}$ between the first terminal and the second terminal of the capacitor C1 is retained. That is, the voltage between the gate and the second terminal of the transistor M2 is approximately equal to the voltage between the gate and second terminal of the transistor M2A.

Since an inversion signal of a signal transmitted to the wiring WWL is input to the wiring WWLB, a high-level potential is input to the wiring WWLB. Thus, the high-level potential is applied to the gate of the transistor M1 to turn on the transistor M1. This brings the wiring VDE into an electrical continuity state with the first terminal of the transistor M2, so that a high power supply potential of the wiring VDE is supplied to the first terminal of the transistor M2.

Furthermore, the voltage $V_W$-$V_{GND}$ between the gate and the second terminal of the transistor M2 is approximately equal to the voltage between the gate and the second terminal voltage of the transistor M2A; thus, when the size of the transistor M2 is equal to the size of the transistor M2A, the amount of current flowing between the first terminal and the second terminal of the transistor M2 is approximately equal to the amount of current $I_W$ flowing between the first terminal and the second terminal of the transistor M2A.

Through the above operation, the amount of current $I_W$ can be written to the circuit MC as a current corresponding to the first data.

Figure 11:
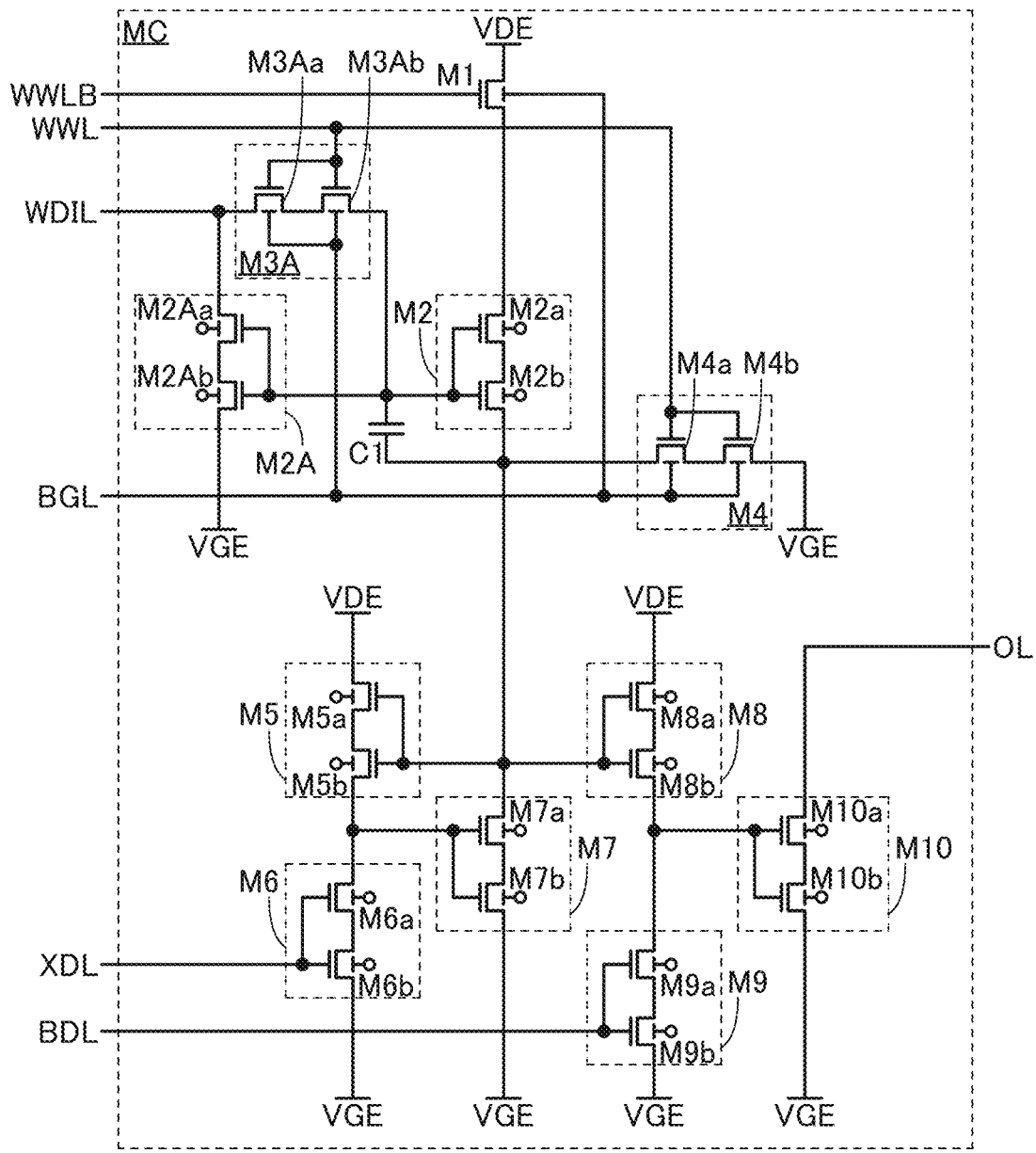
FIG. 11 is a circuit diagram illustrating a structure example of a circuit included in a semiconductor device.

In addition, as the transistors included in the circuit MC of FIG. 10, multi-gate transistors may be used, as in the circuit MC in FIG. 4. The circuit MC illustrated in FIG. 11 is a structure example in which the transistor M2, the transistor M2A, the transistor M3A, and the transistor M4 to the transistor M10 included in the circuit MC in FIG. 10 are replaced with multi-gate transistors. Specifically, the transistor M2 includes the transistor M2a and the transistor M2b; the transistor M2A includes a transistor M2Aa and a transistor M2Ab; the transistor M3A includes a transistor M3Aa and a transistor M3Ab; the transistor M4 includes the transistor M4a and the transistor M4b; the transistor M5 includes the transistor M5a and the transistor M5b; the transistor M6 includes the transistor M6a and the transistor M6b; the transistor M7 includes the transistor M7a and the transistor M7b; the transistor M8 includes the transistor M8a and the transistor M8b; the transistor M9 includes the transistor M9a and the transistor M9b; and the transistor M10 includes the transistor M10a and the transistor M10b. As illustrate in FIG. 11, the transistor M2, the transistor M2A, the transistor M3A, and the transistor M4 to the transistor M10 are replaced with multi-gate transistors, whereby drain-induced barrier lowering can be prevented from occurring in an on-state of each transistor, and/or off-state leakage current of each transistor can be reduced.

In illustration of FIG. 11, the transistor M2, the transistor M2A, the transistor M3A, and the transistor M4 to the transistor M10 are multi-gate transistors; however, at least one of the transistor M2, the transistor M2A, the transistor M3A, and the transistor M4 to the transistor M10 included in the circuit MC of the semiconductor device of one embodiment of the present invention may be a multi-gate transistor. Although the transistor M1 included in the circuit MC in FIG. 11 is not replaced with a multi-gate transistor, the transistor M1 may be replaced with a multi-gate transistor (not illustrated).

Structure Example 1 of Semiconductor Device

A structure example of a semiconductor device to which the circuit MC illustrated in FIG. 10 or FIG. 11 can be applied is described next.

Figure 12:
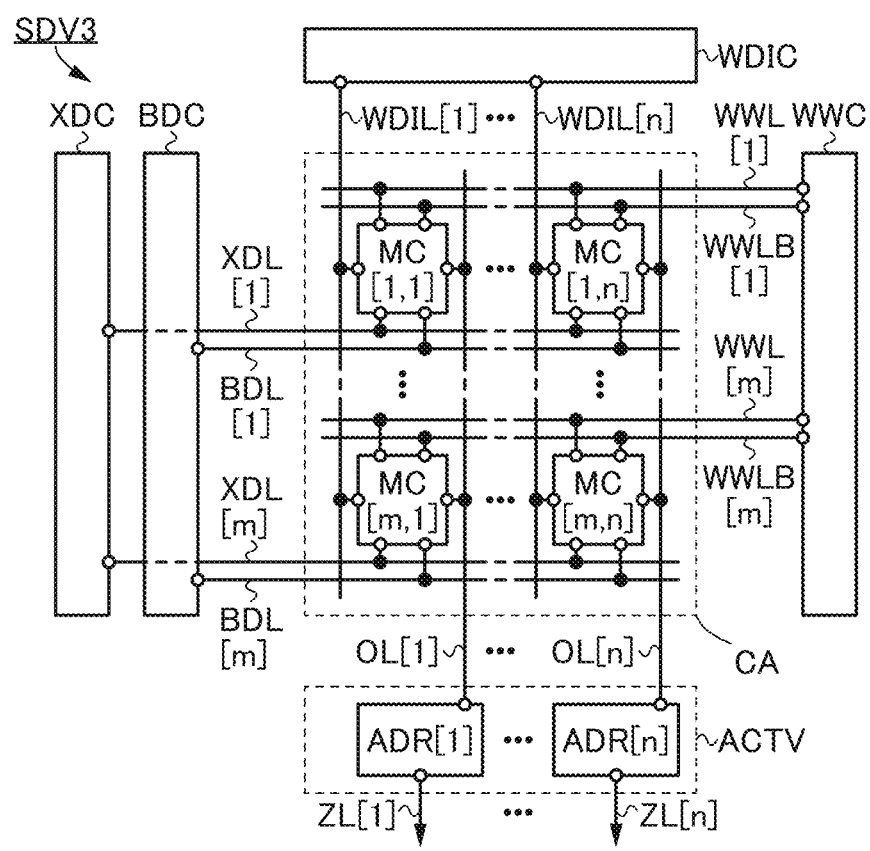
FIG. 12 is a block diagram illustrating a structure example of a semiconductor device.

FIG. 12 is a circuit diagram illustrating a structure example of a semiconductor device to which the circuit MC illustrated in FIG. 10 or FIG. 11 can be applied. Note that a semiconductor device SDV3 illustrated in FIG. 12 is a variation example of the semiconductor device SDV1 illustrated in FIG. 6A, and includes a circuit WDIC instead of the circuit WDC. Furthermore, in the semiconductor device SDV3 in FIG. 12, wiring WDIL[1] to wiring WDIL[n] are extended instead of the wiring WDL[1] to the wiring WDL[n].

The semiconductor device SDV3 in FIG. 12 is the variation example of the semiconductor device SDV1 in FIG. 6A; therefore, the description of semiconductor device SDV1 is referred to for portions that are common to both the semiconductor device SDV3 and the semiconductor device SDV1.

The circuit WDIC has a function of supplying, to the wiring WDIL[1] to the wiring WDIL[n], a current with an amount corresponding to the first data. The circuit WDIC is electrically connected to the wiring WDIL[1] to the wiring WDIL[n], for example.

Figure 13A:
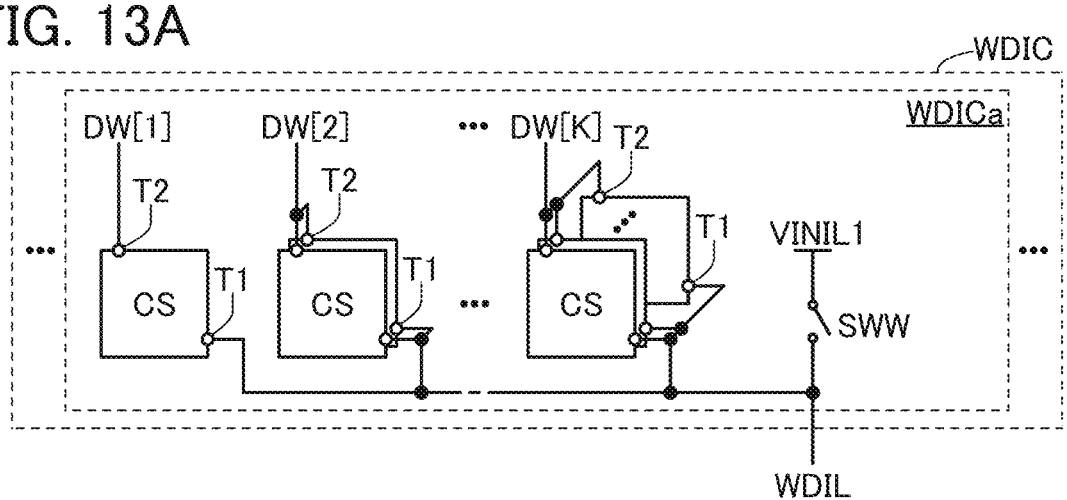
FIG. 13A is a block diagram illustrating a structure example of a circuit included in a semiconductor device.

Next, a specific structure example of the circuit WDIC is described. FIG. 13A is a block diagram illustrating an example of the circuit WDIC. FIG. 13A also illustrates the wiring WDIL to show the electrical connection between the circuit WDIC and its peripheral circuits.

The circuit WDIC includes, for example, circuits WDICa the number of which is the same as that of wirings WDIL. That is, the circuit WDIC includes n circuits WDICa. Thus, the wiring WDIL in FIG. 13A can be any one of the wiring WDIL[1] to the wiring WDIL[n] included in the semiconductor device SDV3 in FIG. 12. Accordingly, the wiring WDIL[1] to the wiring WDIL[n] are electrically connected to the respective circuits WDICa.

The circuit WDICa illustrated in FIG. 13A includes a switch SWW, for example. A first terminal of the switch SWW is electrically connected to the wiring WDIL, and a second terminal of the switch SWW is electrically connected to a wiring VINIL1. The wiring VINIL1 functions as a wiring for supplying an initialization potential to the wiring WDIL, and the initialization potential can be set to a negative potential, a ground potential (GND), a low-level potential, a high-level potential, or the like. The initialization potential is, for example, a potential when the first data is "0".

As the switch SWW, an electrical switch such as an analog switch or a transistor can be used, for example. When a transistor is used as the switch SWW, for example, the transistor can be a transistor having a structure similar to that of the transistor M1, the transistor M3, and the transistor M4. Other than the electrical switch, a mechanical switch may be used.

The circuit WDICa in FIG. 13A includes a plurality of current sources CS, for example. Specifically, the circuit WDICa has a function of outputting K-bit first data ($2^K$ values) (K is an integer greater than or equal to 1) as the current amount; in this case, the circuit WDICa includes $2^K-1$ current sources CS. The circuit WDICa includes one current source CS that outputs information corresponding to the value of the first bit as a current, two current sources CS that output information corresponding to the value of the second bit as a current, and the $2^{K-1}$ current sources CS that output information corresponding to the value of the K-th bit as a current.

Each of the current sources CS in FIG. 13A includes a terminal T1 and a terminal T2. The terminal T1 of the current source CS is electrically connected to the wiring WDIL. The terminal T2 of the one current source CS is electrically connected to a wiring DW[1], the terminals T2 of the two current sources CS are electrically connected to a wiring DW[2], and the terminals T2 of the $2^{K-1}$ current sources CS are electrically connected to a wiring DW[K].

The plurality of current sources CS included in the circuit WDICa have a function of outputting the same constant currents $I_{Wut}$ from the terminals T1. In practice, at the manufacturing stage of the semiconductor device SDV3, transistors included in the current sources CS may have different electrical characteristics; this may yield an error. The error in the constant current $I_{Wut}$ output from each of the terminals T1 of the plurality of current sources CS is thus preferably within 10%, further preferably within 5%, still further preferably within 1%. In this embodiment, the description is made on the assumption that there is no error in the constant current $I_{Wut}$ output from each of the terminals T1 of the plurality of current sources CS included in the circuit WDICa.

The wiring DW[1] to the wiring DW[K] function as wirings for transmitting control signals to allow the current sources CS, which are electrically connected to the wiring DW[1] to the wiring DW[K], to output the constant current $I_{Wut}$. Specifically, for example, when a high-level potential is supplied to the wiring DW[1], the current source CS electrically connected to the wiring DW[1] supplies $I_{Wut}$ as a constant current to the wiring WDIL, and when a low-level potential is supplied to the wiring DW[1], the current source CS electrically connected to the wiring DW[1] does not output $I_{Wut}$. For example, when a high-level potential is supplied to the wiring DW[2], the two current sources CS electrically connected to the wiring DW[2] supply the sum of constant currents $2I_{Wut}$ to the wiring WDIL, and when a low-level potential is supplied to the wiring DW[2], the current sources CS electrically connected to the wiring DW[2] do not output the sum of constant currents $2I_{Wut}$. For example, when a high-level potential is supplied to the wiring DW[K], the $2^{K-1}$ current sources CS electrically connected to the wiring DW[K] supply the sum of constant currents $2^{K-1}I_{Wut}$ to the wiring WDIL, and when a low-level potential is supplied to the wiring DW[K], the current sources CS electrically connected to the wiring DW[K] do not output the sum of constant currents $2^{K-1}I_{Wut}$.

The current flowing from the one current source CS electrically connected to the wiring DW[1] corresponds to the value of the first bit, the current flowing from the two current sources CS electrically connected to the wiring DW[2] corresponds to the value of the second bit, and the amount of current flowing from the K current sources CS electrically connected to the wiring DW[K] corresponds to the value of the K-th bit. The circuit WDICa with K of 2 is considered. For example, when the value of the first bit is "1" and the value of the second bit is "0", a high-level potential is supplied to the wiring DW[1], and a low-level potential is supplied to the wiring DW[2]. In this case, the constant current $I_{Wut}$ flows from the circuit WDICa to the wiring WDIL. For example, when the value of the first bit is "0" and the value of the second bit is "1", a low-level potential is supplied to the wiring DW[1], and a high-level potential is supplied to the wiring DW[2]. In this case, the constant current $2I_{Wut}$ flows from the circuit WDICa to the wiring WDIL. For example, when the value of the first bit is "1" and the value of the second bit is "1", a high-level potential is supplied to the wiring DW[1] and the wiring DW[2]. In this case, the constant current $3I_{Wut}$ flows from the circuit WDICa to the wiring WDIL. For example, when the value of the first bit is "0" and the value of the second bit is "0", a low-level potential is supplied to the wiring DW[1] and the wiring DW[2]. In this case, the constant current does not flow from the circuit WDICa to the wiring WDIL.

FIG. 13A illustrates the circuit WDICa with K of an integer greater than or equal to 3; when K is 1, the current sources CS electrically connected to the wiring DW[2] to the wiring DW[K] are not provided in the circuit WDICa in FIG. 13A. When K is 2, the current sources CS electrically connected to the wiring DW[3] (not illustrated) to the wiring DW[K] are not provided in the circuit WDICa in FIG. 13A.

Next, a specific structure example of the current source CS is described.

Figure 14A:
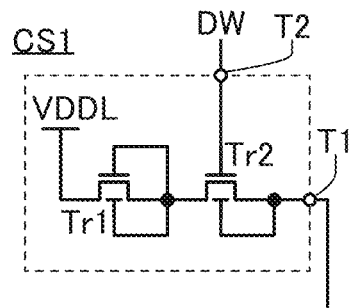
FIG. 14A to FIG. 14D are circuit diagrams each illustrating a structure example of a circuit included in a semiconductor device.

A current source CS1 illustrated in FIG. 14A is a circuit that can be used as the current source CS included in the circuit WDICa in FIG. 13A, and the current source CS1 includes a transistor Tr1 and a transistor Tr2.

A first terminal of the transistor Tr1 is electrically connected to a wiring VDDL, and a second terminal of the transistor Tr1 is electrically connected to a gate of the transistor Tr1, a back gate of the transistor Tr1, and a first terminal of the transistor Tr2. A second terminal of the transistor Tr2 is electrically connected to the terminal T1, and a gate of the transistor Tr2 is electrically connected to the terminal T2. The terminal T2 is electrically connected to the wiring DW.

The wiring DW is any one of the wiring DW[1] to the wiring DW[K] in FIG. 13A.

The wiring VDDL functions as a wiring for supplying a constant voltage. The constant voltage can be a high-level potential, for example.

When a constant voltage supplied from the wiring VDDL is set at a high-level potential, a high-level potential is input to the first terminal of the transistor Tr1. The potential of the second terminal of the transistor Tr1 is lower than the high-level potential. At this time, the first terminal of the transistor Tr1 functions as a drain, and the second terminal of the transistor Tr1 functions as a source. Since the gate of the transistor Tr1 is electrically connected to the second terminal of the transistor Tr1, the gate-source voltage of the transistor Tr1 is 0 V. When the threshold voltage of the transistor Tr1 is within an appropriate range, a current in the current range of the subthreshold region (drain current) flows between the first terminal and the second terminal of the transistor Tr1.

The transistor Tr2 functions as a switching element. When the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected to each other, a back gate-source voltage becomes 0 V. Thus, when the threshold voltage of the transistor Tr2 is within an appropriate range and a high-level potential is input to the gate of the transistor Tr2, the transistor Tr2 is brought into an on state; when a low-level potential is input to the gate of the transistor Tr2, the transistor Tr2 is brought into an off state. Specifically, when the transistor Tr2 is in an on state, a current within the current range of the subthreshold region flows from the second terminal of the transistor Tr1 to the terminal T1, and when the transistor Tr2 is in an off state, the current does not flow from the second terminal of the transistor Tr1 to the terminal T1.

Figure 14B:
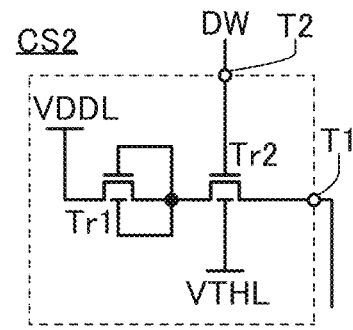

The circuit that can be used as the current source CS included in the circuit WDICa in FIG. 13A is not limited to the current source CS1 in FIG. 14A. For example, the current source CS1 has a structure in which the back gate of the transistor Tr2 and the second terminal of the transistor Tr2 are electrically connected to each other; however, a structure in which the back gate of the transistor Tr2 is electrically connected to another wiring may be employed. Such a structure example is illustrated in FIG. 14B. In a current source CS2 illustrated in FIG. 14B, the back gate of the transistor Tr2 is electrically connected to a wiring VTHL. When the wiring VTHL of the current source CS2 is electrically connected to an external circuit or the like, the external circuit or the like supplies a predetermined potential to the wiring VTHL and the back gate of the transistor Tr2 can be supplied with the predetermined potential. This can change the threshold voltage of the transistor Tr2. In particular, the off-state current of the transistor Tr2 can be reduced by an increase in the threshold voltage of the transistor Tr2.

Figure 14C:
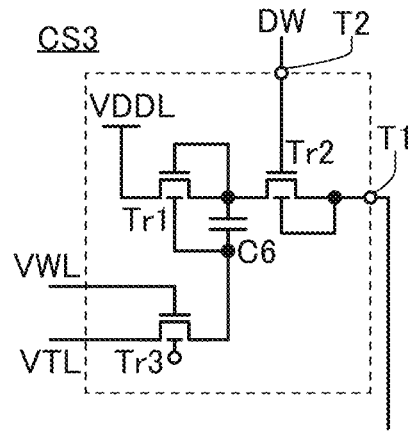

For example, the current source CS1 in FIG. 14A has a structure in which the back gate of the transistor Tr1 and the second terminal of the transistor Tr1 are electrically connected to each other; however, a structure in which the voltage between the back gate and the second terminal of the transistor Tr2 is retained with a capacitor may be employed, for example. Such a structure example is illustrated in FIG. 14C. A current source CS3 illustrated in FIG. 14C includes a transistor Tr3 and a capacitor C6 in addition to the transistor Tr1 and the transistor Tr2. The current source CS3 is different from the current source CS1 in that the second terminal of the transistor Tr1 and the back gate of the transistor Tr1 are electrically connected to each other through the capacitor C6, and the back gate of the transistor Tr1 and a first terminal of the transistor Tr3 are electrically connected to each other. In the current source CS3, a second terminal of the transistor Tr3 is electrically connected to a wiring VTL, and a gate of the transistor Tr3 is electrically connected to a wiring VWL. In the current source CS3, the wiring VWL is supplied with a high-level potential to turn on the transistor Tr3, so that electrical continuity can be established between the wiring VTL and the back gate of the transistor Tr1. In this case, a predetermined potential can be input to the back gate of the transistor Tr1 from the wiring VTL. The wiring VWL is supplied with a low-level potential to turn off the transistor Tr3, so that a voltage between the second terminal of the transistor Tr1 and the back gate of the transistor Tr1 can be retained in the capacitor C6. The threshold voltage of the transistor Tr1 can be changed when the voltage supplied to the back gate of the transistor Tr1 is determined by the wiring VTL, and the threshold voltage of the transistor Tr1 can be fixed with the transistor Tr3 and the capacitor C6.

Figure 14D:
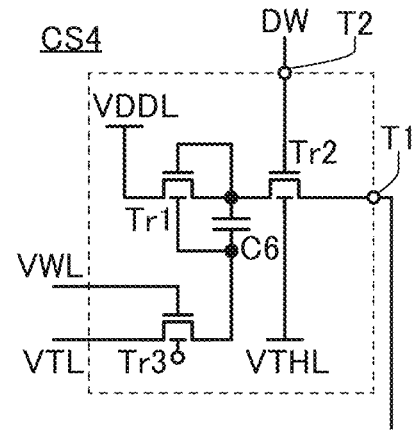

For example, as the circuit that can be used as the current source CS included in the circuit WDICa in FIG. 13A, a current source CS4 illustrated in FIG. 14D may be used. The current source CS4 has a structure in which the back gate of the transistor Tr2 is electrically connected not to the second terminal of the transistor Tr2 but to the wiring VTHL in the current source CS3 in FIG. 14C. That is, the current source CS4 can change the threshold voltage of the transistor Tr2 with the potential supplied from the wiring VTHL, as in the current source CS2 in FIG. 14B.

When a high current flows between the first terminal and the second terminal of the transistor Tr1 in the current source CS4, the on-state current of the transistor Tr2 needs to be increased to supply the current from the terminal T1 to the outside of the current source CS4. In this case, in the current source CS4, the wiring VTHL is supplied with a high-level potential to decrease the threshold voltage of the transistor Tr2 and increase the on-state current of the transistor Tr2, whereby a high current flowing between the first terminal and the second terminal of the transistor Tr1 can be supplied from the terminal T1 to the outside of the current source CS4.

The use of the current source CS1 to the current source CS4 illustrated in FIG. 14A to FIG. 14D as the current sources CS included in the circuit WDICa in FIG. 13A enables the circuit WDICa to output a current corresponding to the K-bit first data. The amount of the current can be the amount of current flowing between the first terminal and the second terminal of the transistor M2A in the range where the transistor M2A operates in the subthreshold region.

Figure 13B:
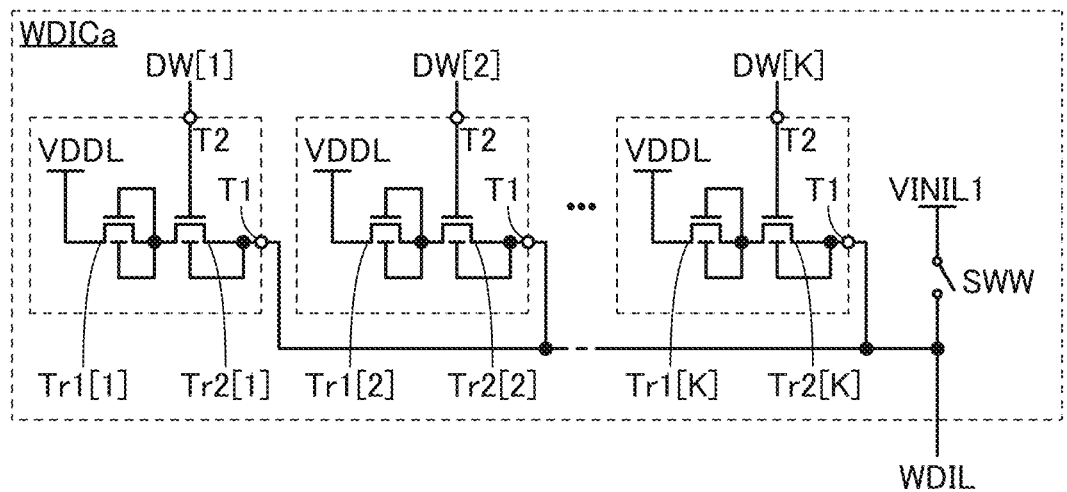
FIG. 13B is a circuit diagram illustrating a structure example of a circuit included in the semiconductor device.

As the circuit WDICa in FIG. 13A, the circuit WDICa illustrated in FIG. 13B can be used. In the circuit WDICa in FIG. 13B, one current source CS1 in FIG. 14A is connected to each of the wiring DW[1] to the wiring DW[K]. When the channel width of a transistor Tr1 [1] is w[1], the channel width of a transistor Tr1 [2] is w[2], and the channel width of a transistor Tr1 [K] is w[K], the ratio of the channel widths is w[1]:w[2]:w[K]=1:2:$2^{K-1}$. Since a current flowing between a source and a drain of a transistor that operates in the subthreshold region is proportional to the channel width, the circuit WDICa illustrated in FIG. 13B can output a current corresponding to the K-bit first data like the circuit WDICa in FIG. 13A.

As the transistor Tr1 (including the transistor Tr1[1] to the transistor Tr2[K]), the transistor Tr2 (including the transistor Tr2[1] to the transistor Tr2[K]), and the transistor Tr3, a transistor that can be used as the transistor M1 to the transistor M10 and the like can be used, for example. In particular, as the transistor Tr1 (including the transistor Tr1 [1] to the transistor Tr1 [K]), the transistor Tr2 (including the transistor Tr2[1] to the transistor Tr2[K]), and the transistor Tr3, OS transistors are preferably used.

As described above, with the use of the circuit MC illustrated in FIG. 10, a current corresponding to the first data can be written to the circuit MC. In addition, by setting the transistor M2 and the transistor M2A to have substantially the same size, the amount of current approximately equal to the amount of current corresponding to the first data from the wiring WDIL can flow between the first terminal and the second terminal of the transistor M2. Thus, the circuit MC can output the current $I_Y$ corresponding to the product of the first data and the second data to the wiring OL.

Note that this embodiment can be combined with any of the other embodiments in this specification as appropriate.

Embodiment 3

In this embodiment, a structure in which image data captured with an imaging device is input as second data to the circuit MC described in the above embodiment is described.

Structure Example 1

Figure 15A:
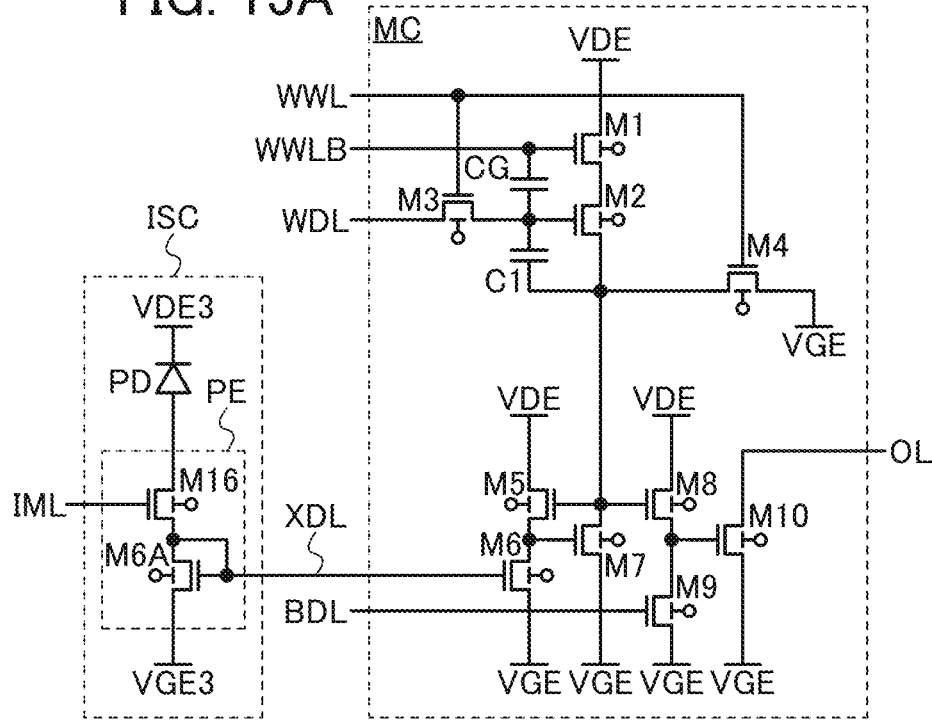
FIG. 15A and FIG. 15B are circuit diagrams each illustrating a structure example of a circuit included in a semiconductor device.

FIG. 15A is a circuit diagram illustrating structure examples of the circuit MC and a circuit ISC included in a semiconductor device described in this embodiment. For the circuit MC of FIG. 15A, the description of the circuit MC in FIG. 1 is referred to. The circuit ISC in FIG. 15A is an example of a pixel circuit including an imaging device, and includes a photodiode PD and a circuit PE. The circuit PE includes the transistor M6A and a transistor M16.

For example, a transistor that can be used as the transistor M6 included in the circuit MC in FIG. 1 can be used as the transistor M6A. To a gate, a source, and a drain of the transistor M6A, a voltage similar to a voltage in the range where the transistor M6 operates is appropriately input. In addition, the size of the transistor M6A is preferably equal to the size of the transistor M6. In particular, by setting the transistor M6 and the transistor M6A to have substantially the same size, the amount of current flowing between the first terminal and the second terminal of the transistor M6 can be approximately equal to the amount of current flowing between the first terminal and the second terminal of the transistor M6A, when the transistor M6 and the transistor M6A serve as a current mirror due to their electrical connection.

In addition, for example, a transistor that can be used as the transistor M1, the transistor M3, the transistor M4, or the like included in the circuit MC in FIG. 1 can be used as the transistor M16. To a gate, a source, and a drain of the transistor M16, a voltage similar to a voltage in the range where the transistor M1, the transistor M3, the transistor M4, or the like operate is appropriately input.

The first terminal of the transistor M6A is electrically connected to the gate of the transistor M6A and a first terminal of the transistor M16, and the second terminal of the transistor M6A is electrically connected to a wiring VGE3. The first terminal and the gate of the transistor M6A are electrically connected to the wiring XDL. A second terminal of the transistor M16 is electrically connected to an input terminal (anode) of the photodiode PD, and an output terminal (cathode) of the photodiode PD is electrically connected to a wiring VDE3. The gate of the transistor M16 is electrically connected to a wiring IML.

The wiring VDE3 functions as a wiring that supplies a constant voltage, for example. The constant voltage can be a high power supply voltage, for example.

The wiring VGE3 functions as a wiring that supplies a constant voltage, for example. The constant voltage can be a low power supply voltage, a ground potential, or the like, for example. In the case where constant voltages supplied from the wiring VGE3 and the wiring VGE are equal to each other, the wiring VGE3 may be treated as the wiring VGE.

The wiring IML functions as a wiring for transmitting a signal to supply a current generated by the photodiode PD, between the first terminal and the second terminal of the transistor M6A, for example. Specifically, for example, when a current generated by the photodiode PD is supplied between the first terminal and the second terminal of the transistor M6A, a high-level potential is input to the wiring IML to turn on the transistor M16, so that electrical continuity is established between the input terminal of the photodiode PD and the first terminal of the transistor M6A. At this time, when the photodiode PD is irradiated with light, a current generated by the photodiode PD flows between the first terminal and the second terminal of the transistor M6A.

In that case, the constant voltage applied from the wiring VDE3 is a high power supply potential or the like. Thus, when the photodiode PD is irradiated with light, a positive current flows from the output terminal toward the input terminal of the photodiode PD. Accordingly, when the photodiode PD is irradiated with light, a current flows from the wiring VDE3 to the input terminal of the photodiode PD through its output terminal.

In FIG. 15A, the input terminal and the output terminal of the photodiode PD may be interchanged with each other (not illustrated). In this case, for example, the input terminal (anode) of the photodiode PD is electrically connected to the wiring VDE3 (the high power supply potential side), and the output terminal (cathode) of the photodiode PD is electrically connected to the wiring VGE3 (the low power supply potential side), whereby the circuit ISC can operate in some cases. In that case, as necessary, one or more n-channel transistors included in the circuit ISC and the circuit MC may be replaced with a p-channel transistor(s).

Next, an operation example of a case where a current corresponding to the second data is written to the circuit MC by the circuit ISC is described. Note that in this operation example, potentials supplied from the wiring VDE and the wiring VDE3 are high power supply potentials, and potentials supplied from the wiring VGE and the wiring VGE3 are ground potentials ($V_{GND}$).

First, a high-level potential is input to the wiring IML. Thus, the high-level potential is input to the gate of the transistor M16 to turn on the transistor M16.

In this case, electrical continuity is established between the first terminal of the transistor M6A and the input terminal of the photodiode PD through the transistor M16.

At this time, when the photodiode PD is irradiated with light, the amount of current (hereinafter, $I_x$) corresponding to the second data (light intensity) is generated by the photodiode PD. A current with the amount of current $I_x$ flows to the first terminal of the transistor M6A through the transistor M16 from the input terminal of the photodiode PD, whereby the potential of the first terminal and the gate of the transistor M6A become the potential corresponding to the current (hereinafter, referred to as $V_X$). At this time, the voltage $V_W$ is written to the first terminal of the capacitor C1. Furthermore, a current with the amount of current $I_W$ flows between the first terminal and the second terminal of the transistor M6A.

At this time, the voltage between the gate and the second terminal of the transistor M6 becomes $V_X$-$V_{GND}$, and the voltage between the gate and the second terminal of the transistor M6A becomes $V_X$-$V_{GND}$. That is, the gate-second terminal voltage of the transistor M6 is approximately equal to the gate-second terminal voltage of the transistor M6A.

Furthermore, since the gate-second terminal voltage $V_X$-$V_{GND}$ of the transistor M6 is approximately equal to the gate-second terminal voltage of the transistor M2A, the amount of current flowing between the first terminal and the second terminal of the transistor M6 is approximately equal to the amount of current $I_X$ flowing between the first terminal and the second terminal of the transistor M6A at this time, in the case where the size of the transistor M6 is equal to the size of the transistor M6A.

Through the above operation, the amount of current $I_X$ can be input to the circuit MC as the current corresponding to the second data.

Structure Example 2

In the circuit ISC and the circuit MC illustrated in FIG. 15A, the current with $I_X$ flows between the first terminal and the second terminal of the transistor M6 only in a period in which a high-level potential is input to the wiring IML (a period in which the transistor M16 is in an on state). For example, it is also acceptable to adopt a structure in which a capacitor can retain a voltage between the gate and the second terminal of the transistor M6 is provided in the circuit MC, and a transistor is provided to make the gate of the transistor M6 to be floating, so that the potential ($V_X$) of the gate of the transistor M6 can be retained.

Figure 15B:
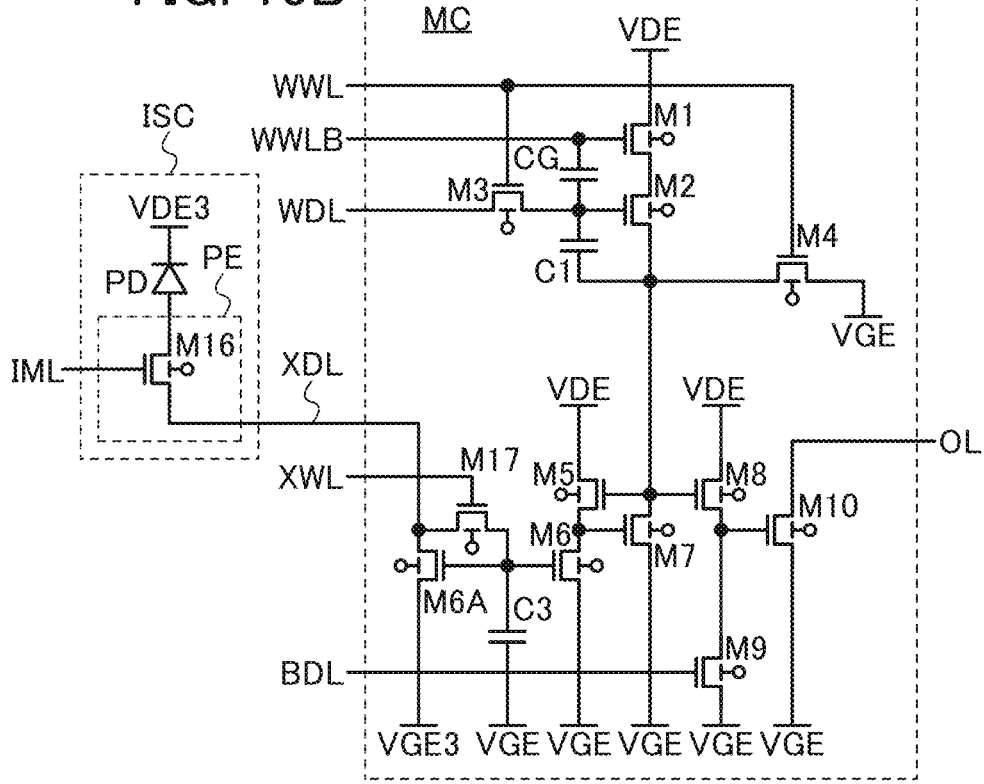

FIG. 15B illustrates structures of the circuit ISC and the circuit MC in this case. The circuit ISC and the circuit MC in FIG. 15B are variation examples of the circuit ISC and the circuit MC in FIG. 15A, and the circuit MC includes the transistor M6A, a transistor M17, and a capacitor C3. In addition, the circuit ISC in FIG. 15B is different from the circuit ISC in FIG. 15A in that the transistor M6A is not provided.

As the transistor M17, for example, a transistor that can be used as the transistor M1, the transistor M3, the transistor M4, or the like included in the circuit MC in FIG. 1 can be used. To a gate, a source, and a drain of the transistor M17, a voltage similar to a voltage in the range where the transistor M1, the transistor M3, the transistor M4, or the like operates is approximately input.

As the capacitor C3, a capacitor that can be used as the capacitor C1, the capacitor CG, or the like described in the specification and the like can be used.

A first terminal of the transistor M17 is electrically connected to the first terminal of the transistor M6A, a second terminal of the transistor M17 is electrically connected to the gate of the transistor M6A and the gate of the transistor M6, and the gate of the transistor M17 is electrically connected to a wiring XWL. A first terminal of the capacitor C3 is electrically connected to the gate of the transistor M6A and the gate of the transistor M6, and a second terminal of the capacitor C3 is electrically connected to the wiring VGE.

The wiring XWL functions as a wiring for controlling switching of the on state and the off state of the transistor M17, for example. Specifically, for example, the wiring XWL functions as a selection signal line for selecting a circuit MC to which a current corresponding to the second data is to be written.

In a specific operation example, when the transistor M16 is in an on state and a current is generated by the photodiode PD, a high-level potential is input to the wiring XWL to turn on the transistor M17, so that $V_X$ is written to the first terminal of the capacitor C3. After $V_X$ is written to the first terminal of the capacitor C3, a low-level potential is input to the wiring XWL to turn off the transistor M17, whereby $V_X$ can be retained in the first terminal of the capacitor C3. Accordingly, even when the transistor M16 is turned off by inputting a low-level potential to the wiring IML, the voltage between the gate and the second terminal of the transistor M6 is retained by the capacitor C3, so that a current can flow between the first terminal and the second terminal of the transistor M6.

Structure Example 3

Figure 16:
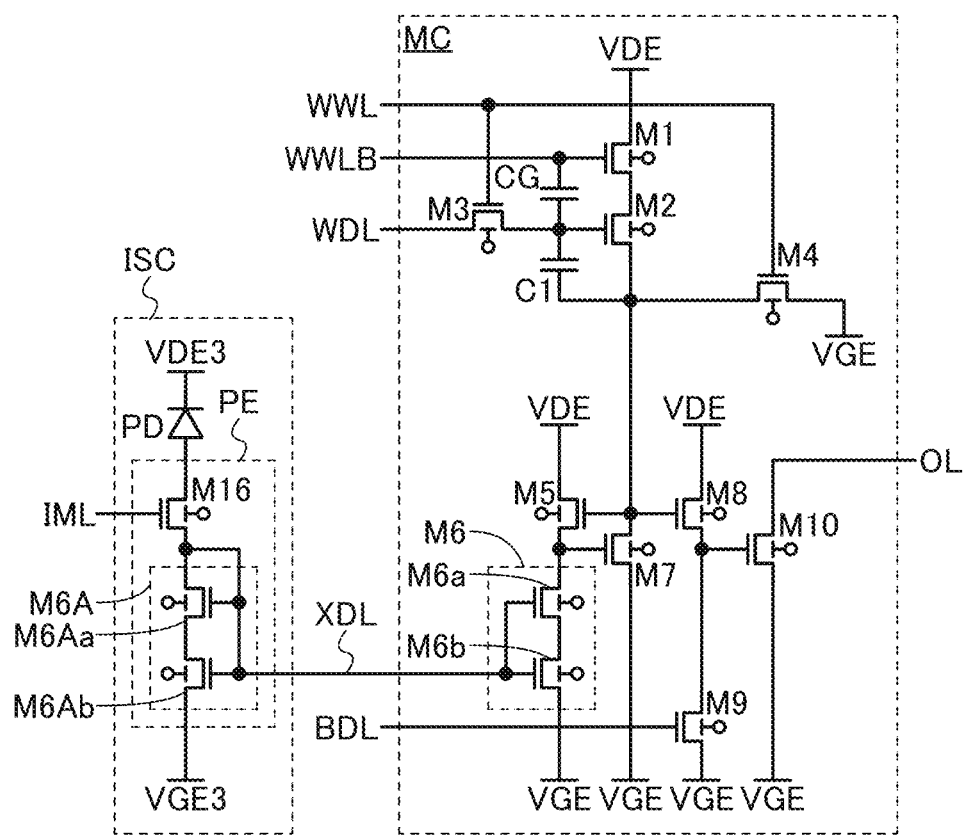
FIG. 16 is a circuit diagram illustrating a structure example of a circuit included in a semiconductor device.

Furthermore, as the transistor M6 and the transistor M6A included in the circuit MC and the circuit ISC in FIG. 15A, multi-gate transistors may be adopted as in the circuit MC in FIG. 4. The circuit MC and the circuit ISC in FIG. 16 are illustrated as structure examples in which the transistor M6 and the transistor M6A included in the circuit MC in FIG. 15A are replaced with multi-gate transistors. As illustrated in FIG. 16, by replacing the transistor M6 and the transistor M6A with the multi-gate transistors, drain-induced barrier lowering can be prevented from occurring in an on-state of each transistor, and/or off-state leakage current of the transistor can be reduced.

Note that in FIG. 16, the transistor M6 includes the transistor M6a and the transistor M6b, and the transistor M6A includes a transistor M6Aa and a transistor M6Ab, for example. Each gate of the transistor M6a and the transistor M6b corresponds to the gate of the transistor M6 in FIG. 15A, and the first terminal of the transistor M6a corresponds to the first terminal of the transistor M6 in FIG. 15A. The second terminal of the transistor M6a is electrically connected to a first terminal of the transistor M6b. A second terminal of the transistor M6b corresponds to the second terminal of the transistor M6 in FIG. 15A. Each gate of the transistor M6Aa and the transistor M6Ab corresponds to the gate of the transistor M6A in FIG. 15A, and a first terminal of the transistor M6Aa corresponds to the first terminal of the transistor M6A in FIG. 15A. A second terminal of the transistor M6Aa is electrically connected to a first terminal of the transistor M6Ab. The second terminal of the transistor M6b corresponds to the second terminal of the transistor M6 in FIG. 15A.

Although each of the transistor M6 and the transistor M6A is a multi-gate transistor in illustration of FIG. 16, at least one of the transistor M1 to the transistor M10, the transistor M6A, and the transistor M16 of the semiconductor device of one embodiment of the present invention may be a multi-gate transistor. In FIG. 15B, at least one of the transistor M1 to the transistor M10, the transistor M6A, the transistor M16, and the transistor M17 may be a multi-gate transistor.

Structure Example 1 of Semiconductor Device

Next, a semiconductor device to which the circuit MC and the circuit ISC illustrated in FIG. 15A, FIG. 16, or the like can be applied will be described.

Figure 17:
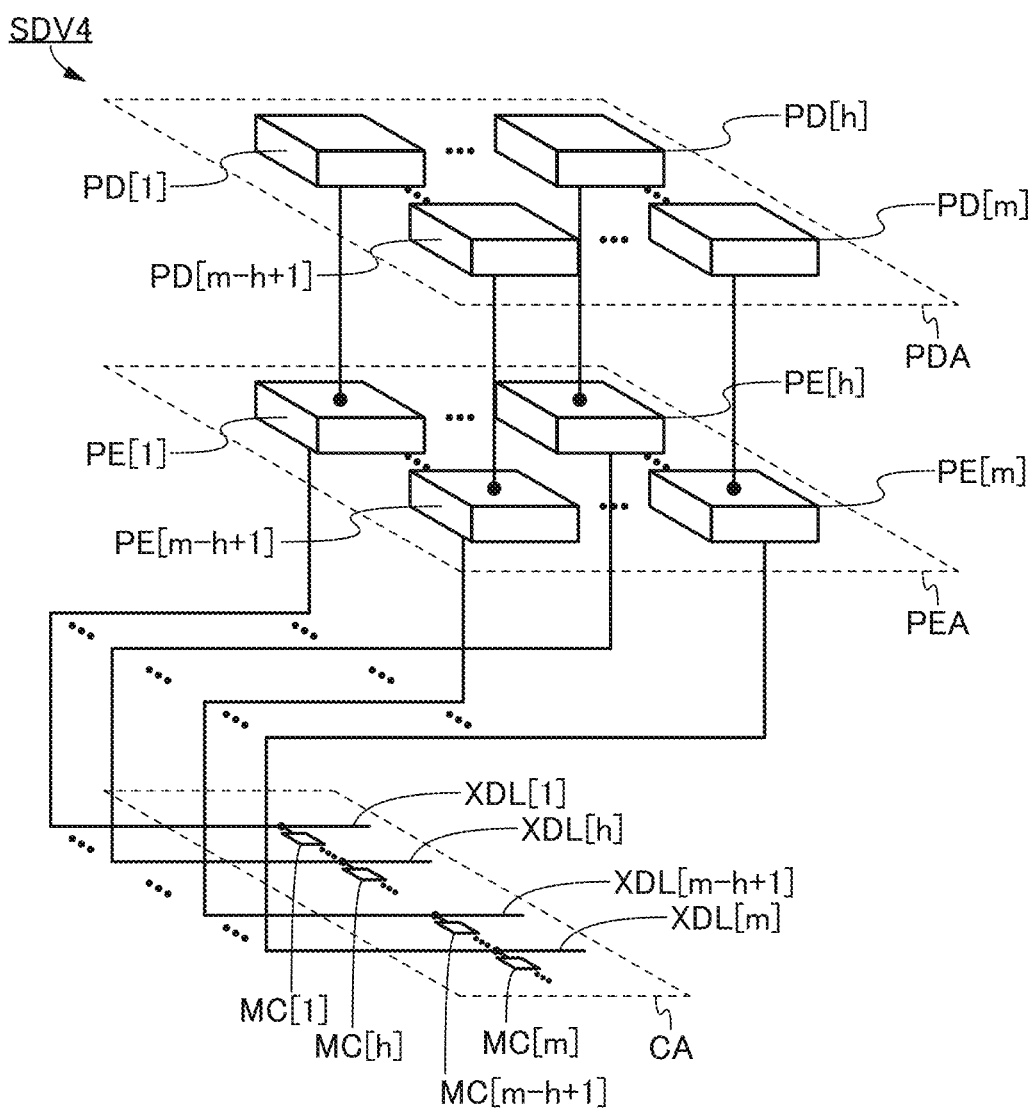
FIG. 17 is a block diagram illustrating a structure example of a semiconductor device.

FIG. 17 illustrates a structure example of a semiconductor device including the circuit MC and the circuit ISC such as FIG. 15A, FIG. 16, or the like. A semiconductor device SDV4 illustrated in FIG. 17 includes, for example, a circuit PDA, a circuit PEA, and the cell array CA.

In the semiconductor device SDV4 in FIG. 17, the circuit PEA is positioned above the cell array CA as an example. The circuit PDA is positioned above the circuit PEA as an example. In addition, in the case where a transistor included in the circuit PEA has a structure similar to that of a transistor included in the cell array CA, the circuit PEA and the cell array CA can be formed in the same layer through the same step (not illustrated).

The circuit PDA includes a photodiode PD[1] to a photodiode PD[m] (m is an integer greater than or equal to 1). In the circuit PDA, the photodiode PD[1] to the photodiode PD[m] are arranged in a matrix of m/h rows and h columns (h is an integer greater than or equal to 1 and is a divisor of m). Any one of the photodiode PD[1] to the photodiode PD[m] corresponds to the photodiode PD included in the circuit ISC in FIG. 15A or FIG. 16.

The circuit PEA includes a circuit PE[1] to a circuit PE[m]. In addition, in the circuit PEA, the circuit PE[1] to the circuit PE[m] are arranged in a matrix with m/h rows and h columns, as in the circuit PDA. Any one of the circuit PE[1] to the circuit PE[m] corresponds to the circuit PE included in the circuit ISC in FIG. 15A or FIG. 16.

The cell array CA includes a circuit MC[1] to a circuit MC[m]. Furthermore, in the cell array CA, the circuit MC[1] to the circuit MC[m] are arranged in a matrix with m rows and one column. Any one of the circuit MC[1] to the circuit MC[m] corresponds to the circuit MC illustrated in FIG. 15A or FIG. 16.

Although not illustrated in FIG. 17, the circuit WDC, the circuit BDC, the circuit WWC, the circuit ACTV, or the like may be provided around the cell array CA, as in the semiconductor device SDV1 in FIG. 6A, the semiconductor device SDV2 in FIG. 6B, or the semiconductor device SDV3 in FIG. 12.

In FIG. 17, the photodiode PD[1] is electrically connected to the circuit MC[1] through the circuit PE[1] and the wiring XDL[1]. The photodiode PD[h] is electrically connected to the circuit MC[h] through the circuit PE[h] and a wiring XDL[h]. A photodiode PD[m-h+1] is electrically connected to a circuit MC [m-h+1] through a circuit PE[m-h+1] and a wiring XDL[m-h+1]. The photodiode PD[m] is electrically connected to the circuit MC[m] through the circuit PE[m] and the wiring XDL[m].

The structure of the semiconductor device SDV4 illustrated in FIG. 17 enables capturing of image data as a plurality of pieces of second data by the photodiode PD[1] to the photodiode PD[m] included in the circuit PDA. After a plurality of pieces of first data are written in advance in the circuit MC[1] to the circuit MC[m] in the cell array CA, the plurality of pieces of second data are transmitted to the circuit MC[1] to the circuit MC[m], whereby the product-sum operation of the first data and the second data can be performed. Moreover, an arithmetic operation of a function may be performed using the product-sum operation result.

In particular, the plurality of pieces of first data written to the circuit MC[1] to the circuit MC[m] are used as filter values for image processing or the like, and thus the product-sum operation can be regarded as convolution processing on image data captured by the photodiode PD[1] to the photodiode PD[m]. For the convolution processing, a ReLU function or the like can be used as the above-described arithmetic operation of the function, for example.

In other words, an arithmetic operation in a first layer of a convolutional neural network (CNN) can be performed in the cell array CA of the semiconductor device SDV4 in FIG. 17. In addition, the semiconductor device SDV4 has the stacked structure in FIG. 9D or the like and a digital arithmetic circuit is provided in the structure body SIL; thus arithmetic operations of second and subsequent layers in the convolutional neural network can be performed by the digital arithmetic circuit or the like, for example.

Figure 18:
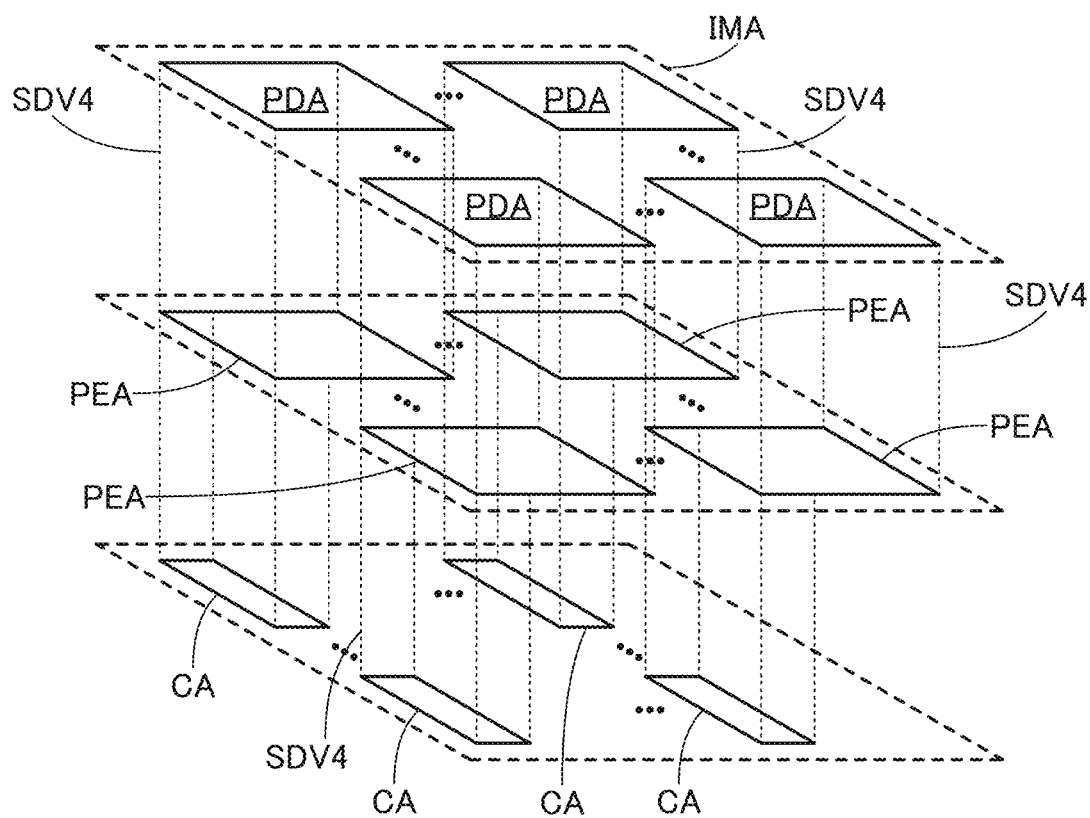
FIG. 18 is a block diagram illustrating a structure example of a semiconductor device.

Furthermore, the semiconductor device SDV4 in FIG. 17 has a structure in which image data is acquired by the circuit PDA in which the photodiodes PD are arranged in a matrix of m/h rows and h columns; however, one embodiment of the present invention is not limited thereto. For example, in one embodiment of the present invention, a plurality of semiconductor devices SDV4 may be arranged in a matrix such that the circuits PDA are in the top surface as illustrated in FIG. 18. The semiconductor device illustrated in FIG. 18 includes an imaging region IMA in the upper portion, and the imaging region IMA includes a plurality of circuits PDA. In other words, the plurality of photodiodes PD included in the imaging region IMA are divided by the plurality of circuits PDA. As illustrated in FIG. 18, the plurality of photodiodes PD included in the imaging region IMA are divided into the plurality of circuits PDA; thus image data obtained by the whole imaging region IMA is divided and acquired by the plurality of circuits PDA. A product-sum operation of the divided image data with the first data (such as a weight coefficient or a filter value) can be performed with the semiconductor device SDV4 corresponding to the divided image data. In this manner, one embodiment of the present invention may have a structure in which an imaging region is divided into a plurality of regions and image data obtained in each of the divided regions is used to perform a product-sum operation, as in the semiconductor device in FIG. 18.

Structure Example 2 of Semiconductor Device

A semiconductor device to which the circuit MC and the circuit ISC in FIG. 15B or the like can be applied will be described next.

Figure 19:
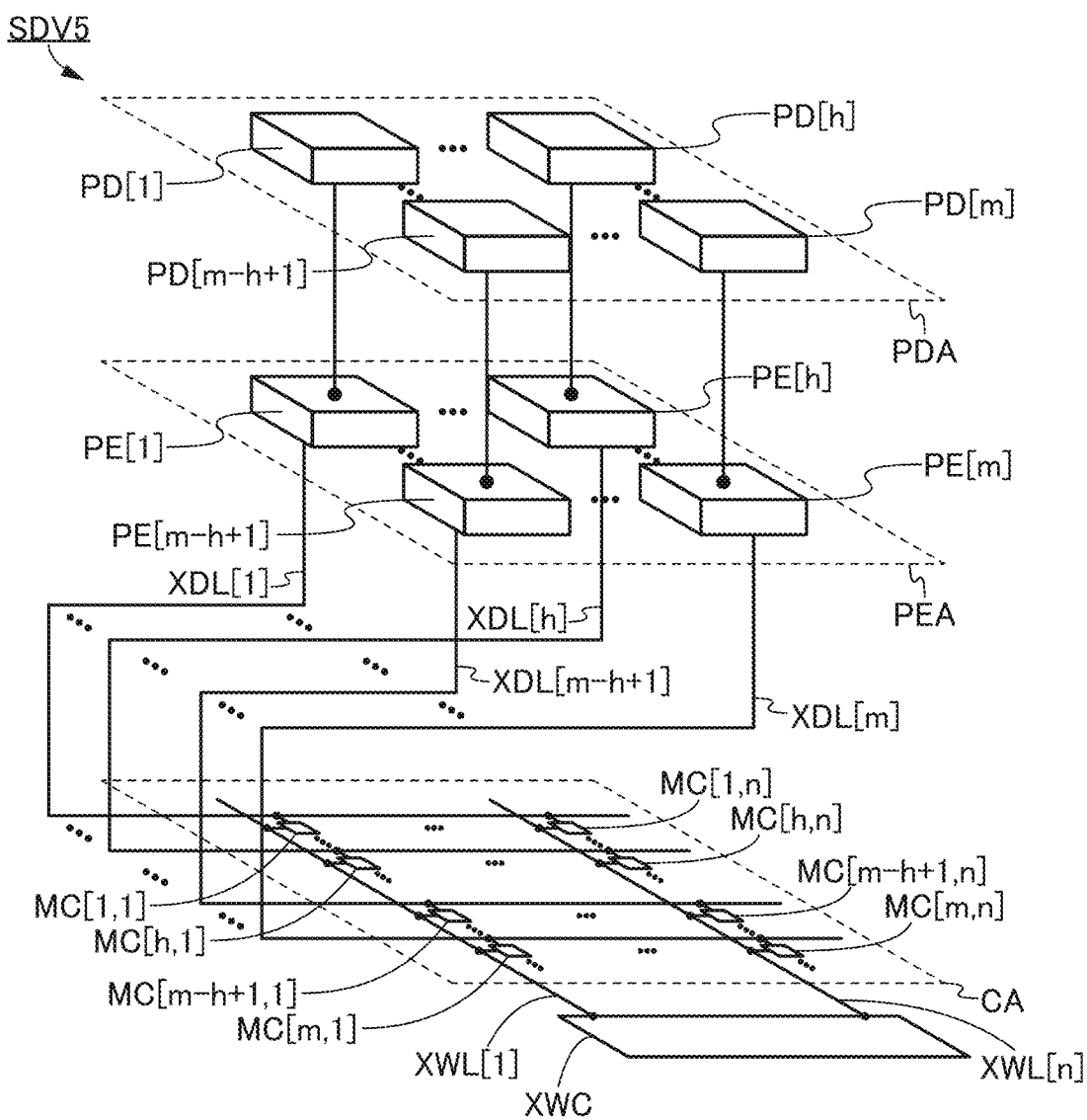
FIG. 19 is a block diagram illustrating a structure example of a semiconductor device.

A semiconductor device SDV5 illustrated in FIG. 19 is a circuit structure example to which the circuit MC and the circuit ISC in FIG. 15B are applied. The semiconductor device SDV5 illustrated in FIG. 19 is different from the semiconductor device SDV4 in FIG. 17 in that the circuits MC can be provided in a plurality of columns in the cell array CA and a circuit XWC is provided.

Figure 20:
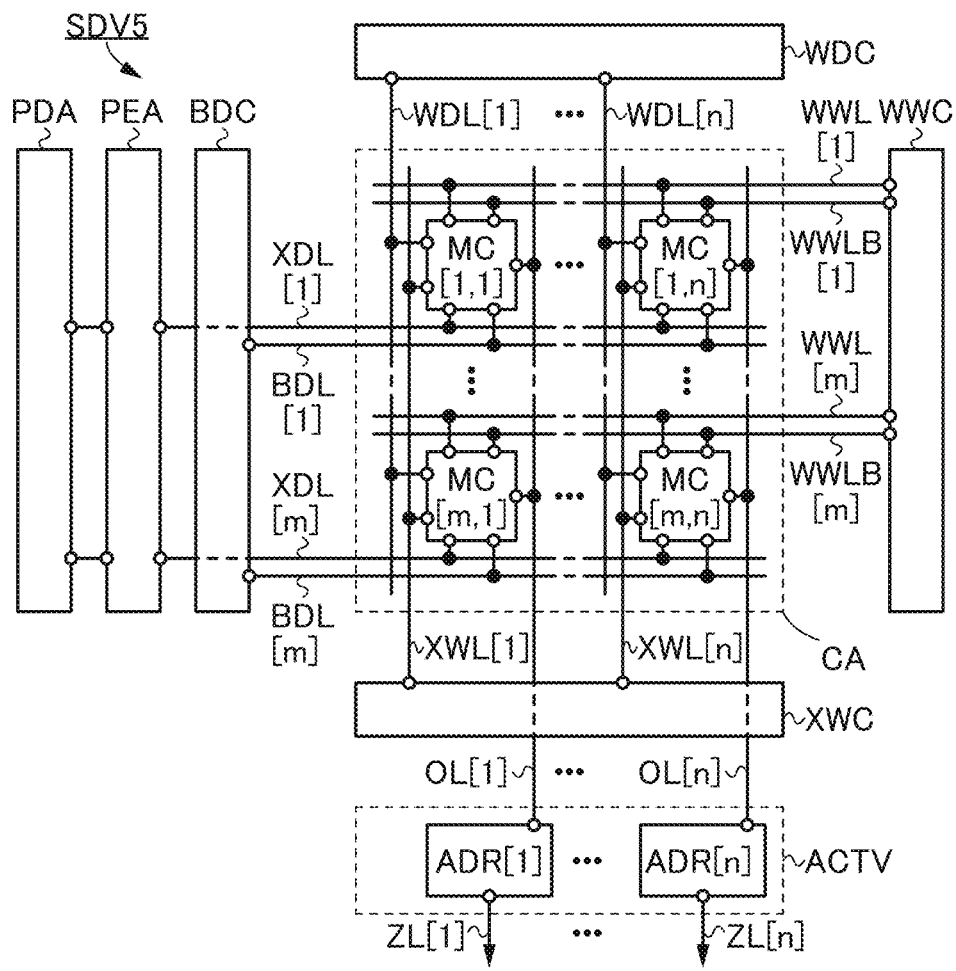
FIG. 20 is a block diagram illustrating a structure example of a semiconductor device.

FIG. 20 illustrates an example of a circuit structure including peripheral circuits around the cell array CA of the semiconductor device SDV5 in FIG. 19. That is, the cell array CA of the semiconductor device SDV5 in FIG. 19 includes the circuit WDC, the circuit WWC, the circuit BDC, and the circuit ACTV in addition to the circuit XWC. For the circuit WDC, the circuit WWC, the circuit BDC, and the circuit ACTV, description of the circuit structure of the semiconductor device SDV1 in FIG. 6A is referred to.

Note that the circuit PDA and the circuit PEA are provided above the cell array CA as illustrated in FIG. 19, whereas in FIG. 20, the circuit PDA and the circuit PEA are illustrated in the same plane as the cell array CA for convenience.

The plurality of circuits MC included in the cell array CA can be, for example, the circuits MC[1,1] to MC[m,n] arranged in a matrix of m rows and n columns (here, n is an integer greater than or equal to 1) as illustrated in FIG. 19. The circuit MC[1,j] to the circuit MC[m,j] located in the j-th column (here, j is an integer greater than or equal to 1 and less than or equal to n) in the cell array CA are electrically connected to a wiring XWL[j]. Specifically, for example, the circuit MC[1,1] to the circuit MC[m,1] located in the first column of the cell array CA are electrically connected to a wiring XWL[1], and the circuit MC[1,n] to the circuit MC[m,n] in the n-th column of the cell array CA are electrically connected to a wiring XWL[n], for example.

The wiring XWL[1] to the wiring XWL[n] are electrically connected to the circuit XWC. The circuit XWC has a function of selecting the circuit MC to which the second data is written when the second data is written to the circuit MC included in the cell array CA through the wiring XWL[1] to the wiring XWL[m], as an example. Specifically, for example, when the second data is written to the circuit MC [1,j] to the circuit MC[m,j] located in the j-th column of the cell array CA, the circuit WWC supplies a high-level potential to the wiring XWL[j] and supplies a low-level potential to the wiring XWL[1] to the wiring XWL[m] except the wiring XWL[j], thereby selecting the circuit MC[1,j] to the circuit MC[m,j] to which the second data is to be written.

As described above, the circuit MC and the circuit ISC illustrated in FIG. 15B are different from the circuit MC and the circuit ISC in FIG. 15A in that a voltage ($V_x$) corresponding to a current input as the second data can be retained. Thus, when the photodiode PD[1] to the photodiode PD[m] are each irradiated with light and a current is generated in each of the photodiode PD[1] to the photodiode PD[m], the transistor M16 is turned on and the circuits MC are selected in every column of the cell array CA by the circuit XWC, whereby a voltage corresponding to the current input as the second data can be written to the plurality of circuits MC in each column. Through the above operation, the same second data can be written to the plurality of circuits MC in each column of the cell array CA.

Here is a description of a case in which image processing is performed in the semiconductor device SDV5, as in the semiconductor device SDV4. Since the circuit MCs are arranged in the n-columns in the cell array CA of the semiconductor device SDV5, n filters can be allocated to every column in the cell array CA of the semiconductor device SDV5. One filter includes m filter values. Thus, m filter values can be retained as the first data in the corresponding m circuits MC arranged in a column of the cell array CA.

As described above, the filter values included in n filters are retained in the circuits MC of the cell array CA; thus, a product between the filter value (the first data) included in the filter and the image data (the second data) can be obtained by an arithmetic operation for every filter. For example, in the case where m filter values included in the first filter are retained in the circuit MC[1,1] to the circuit MC [m,1] arranged in the first column of the cell array CA and m filter values included in the n-th filter are retained in the circuit MC[1,n] to the circuit MC[m,n] arranged in the n-th column of the cell array CA, a product-sum operation between the m filter values included in the first filter and image data is performed and a current corresponding to the arithmetic operation result is input to the circuit ADR[1] in the first column of the cell array CA, while a product-sum operation between m filters included in the n-th filter and image data is performed and a current corresponding to the arithmetic operation result is input to the circuit ADR[n] in the n-th column of the cell array CA, in the semiconductor device SDV5. Thus, convolution processing with use of a plurality of filters is performed on the image data input to the cell array CA, and the results are output from the circuit ACTV to the wiring ZL[1] to the wiring ZL[n].

As described above, the semiconductor device SDV4 in FIG. 17, the semiconductor device SDV5 in FIG. 19, is the like is configured with use of the circuit MC and the circuit ISC illustrated in FIG. 15A, FIG. 15B, FIG. 16, or the like, whereby a product-sum operation between the image data acquired by the photodiode PD as the second data and the first data (such as a weight coefficient or a filter value) can be performed.

Note that this embodiment can be combined with any of the other embodiments in this specification as appropriate.

Embodiment 4

A hierarchical neural network is described in this embodiment. An arithmetic operation of a hierarchical neural network can be performed using the semiconductor device described in the above embodiments.

<Hierarchical Neural Network>

Figure 21A:
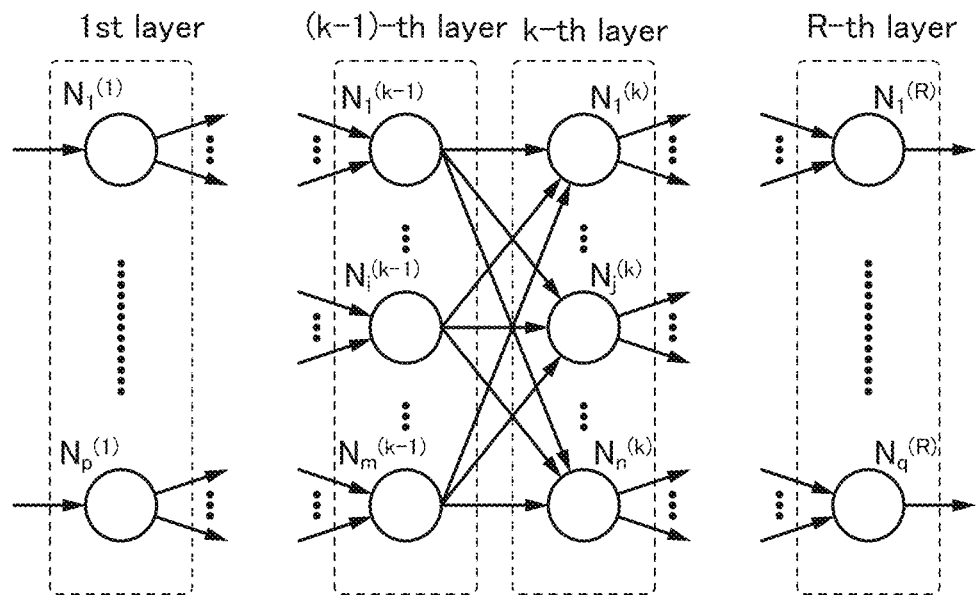
FIG. 21A and FIG. 21B are diagrams illustrating hierarchical neural networks.

A hierarchical neural network includes one input layer, one or a plurality of intermediate layers (hidden layers), and one output layer, for example, and is configured with a total of at least three layers. A hierarchical neural network 100 illustrated in FIG. 21A is one example of hierarchical neural networks, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 21A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 21A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

Note that FIG. 21A selectively illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$.

Next, signal transmission from a neuron in one layer to a neuron in the subsequent layer and signals input to and output from the neurons are described. Note that description here is made focusing on the neuron $N_j^{(k)}$ in the k-th layer.

Figure 21B:
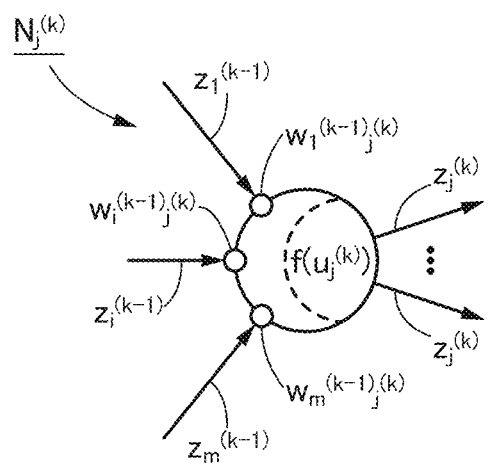

FIG. 21B illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter, referred to as a weight coefficient) of the synapse that connects the neurons to each other. In the neural network 100, a signal output from a neuron in one layer is multiplied by the respective weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)}{}_j^{(k)}$, a signal input to the neuron $N_j^{(k)}$ in the k-th layer can be expressed by Formula (4.1).

[Formula 8]

$$w_i^{(k-1)(k)} \cdot z_i^{(k-1)} \quad (4.1)$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by the respective weight coefficients ($w_1^{(k-1)(k)}_j$ to $w_m^{(k-1)(k)}_j$). Then, $w_1^{(k-1)(k)}_j \cdot z_1^{(k-1)}$ to $w_m^{(k-1)(k)}_j \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (4.2).

[Formula 9]

$$u_j^{(k)} = \sum_{i=1}^{m} w_{ij}^{(k-1)(k)} \cdot z_i^{(k-1)} \quad (4.2)$$

In addition, a bias may be added to the product-sum result of the weight coefficients $w_1^{(k-1)(k)}_j$ to $w_m^{(k-1)(k)}_j$ and the signals $z_1^{(k-1)}$ to $z_m^{(k-1)}$ of the neurons. When the bias is denoted by b, Formula (4.2) can be rewritten to the following formula.

[Formula 10]

$$u_j^{(k)} = \sum_{i=1}^{m} w_{ij}^{(k-1)(k)} \cdot z_i^{(k-1)} + b \quad (4.3)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 11]

$$z_j^{(k)} = f(u_j^{(k)}) \quad (4.4)$$

A function $f(u_j^{(k)})$ is an activation function in a hierarchical neural network, and a sigmoid function, a tan h function, a softmax function, a ReLU function (ramp function), a threshold function, or the like can be used. Note that the activation function can be the same or different among all neurons. In addition, the neuron activation function may be the same or different between the layers.

Signals output from the neurons in the layers, the weight coefficient w, or the bias b can be an analog value or a digital value. The digital value can be, for example, a value with the number of bits of two, or three or more. A value having a larger number of bits may be used. In the case of an analog value, for example, a linear ramp function or a sigmoid function is used as the activation function. In the case of a binary digital value, for example, a step function with an output of −1 or 1 or an output of 0 or 1 is used. Alternatively, the neurons in the layers can each output a ternary or higher-level signal; in this case, a step function with an output of −1, 0, or 1 or a step function with an output of 0, 1, or 2 is used as a ternary activation function. Furthermore, as an activation function for outputting five values, a step function with an output of −2, −1, 0, 1, or 2 may be used, for example. The use of a digital value as at least one of the signals output from the neurons in the layers, the weight coefficient w, and the bias b enables a reduction of the circuit scale, a reduction of power consumption, or an increase of arithmetic operation speed, for example. Furthermore, the use of an analog value as at least one of the signals output from the neurons in the layers, the weight coefficient w, and the bias b can improve the arithmetic operation accuracy.

The neural network 100 performs an operation in which by input of an input signal to the first layer (input layer), output signals are sequentially generated in the layers from the first layer (input layer) to the last layer (output layer) according to Formula (4.1), Formula (4.2) (or Formula (4.3)), and Formula (4.4) on the basis of the signals input from the previous layers, and the output signals are output to the subsequent layers. The signal output from the last layer (the output layer) corresponds to the calculation results of the neural network 100.

In the case where the semiconductor device SDV1 described in Embodiment 1 is used as the above-described hidden layer, the weight coefficient $w_{s[k-1]s[k]}^{(k-1)(k)}$ (s[k−1] is an integer greater than or equal to 1 and less than or equal to m, and s[k] is an integer greater than or equal to 1 and less than or equal to n) is used as the first data, the voltage corresponding to the first data is retained in the first terminal of the capacitor C1 in the circuit MC, the output signal $z_{s[k-1]}^{(k-1)}$ from the neuron $N_{s[k-1]}^{(k-1)}$ in the (k−1)-th layer is used as the second data, and the current with the amount corresponding to the second data is fed from the circuit XDC to the wiring XDL, so that the product-sum of the first data and the second data can be obtained from the amount of current $I_Y$ input to the circuit ADR. In addition, the value of the activation function is obtained using the product-sum value by the circuit ACF in the circuit ADR, so that the value of the activation function can be the output signal $z_{s[k]}^{(k)}$ of the neuron $N_{s[k]}^{(k)}$ in the k-th layer.

In the case where the semiconductor device SDV1 described in Embodiment 1 is used as the above-described output layer, the weight coefficient $w_{s[R-1]s[R]}^{(R-1)(R)}$ (s[R−1] is an integer greater than or equal to 1, and s[R] is an integer greater than or equal to 1 and less than or equal to q) is used as the first data, the voltage corresponding to the first data is retained in the first terminal of the capacitor C1 in the circuit MC, the output signal $z_{s[R-1]}^{(R-1)}$ from the neuron $N_{s[R-1]}^{(R-1)}$ in the (R−1)-th layer is used as the second data, and the current with the amount corresponding to the second data is fed from the circuit XDC to the wiring XDL, so that the product-sum of the first data and the second data can be obtained from the amount of current $I_Y$ input to the circuit ADR. In addition, the value of the activation function is obtained using the product-sum value by the circuit ACF in the circuit ADR, so that the value of the activation function can be the output signal $z_{s[R]}^{(R)}$ of the neuron $N_{s[R]}^{(R)}$ in the R-th layer.

Note that the input layer described in this embodiment may function as a buffer circuit that outputs an input signal to the second layer.

In the case where the semiconductor device SDV1 described in Embodiment 1 is used as the above-described hidden layer, for example, the weight coefficient $w_{s[k-1]s[k]}^{(k-1)(k)}$ is used as the first data, the voltage corresponding to the first data is stored in the circuit MC[1,1] to the circuit MC[m,n], the output signal $z_{s[k-1]}^{(k-1)}$ from the neuron $N_{s[k-1]}^{(k-1)}$ in the (k−1)-th layer is used as the second data, and the voltage corresponding to the second data is input from the circuit XDC to the wiring XDL[1] to the wiring XDL[m], whereby the value of the activation function corresponding to the product-sum of the first data and the second data can be calculated from the amount of current $I_S[j]$ input to the circuit ADR. That is, the value can be the output signal $z_{s[k]}^{(k)}$ from the neuron $N_{s[k]}^{(k)}$ in the k-th layer. When the circuit ADR outputs a voltage corresponding to the value, for example, the output signal $z_{s[k]}^{(k)}$ from the neuron $N_{s[k]}^{(k)}$ in the k-th layer input to the plurality of neurons in the (k+1)-th layer can be the voltage. That is, in the case where the semiconductor device SDV1 is used as the hidden layer of the (k+1)-th layer, the output signal $z_{s[k]}^{(k)}$ of the neuron $N_{s[k]}^{(k)}$ in the k-th layer input to the wiring XDL[1] to the wiring XDL[m] in the semiconductor device SDV1 can be the voltage output from circuit ADR of the semiconductor device SDV1 in the hidden layer of the k-th layer, without being generated in the circuit XDC.

Figure 22:
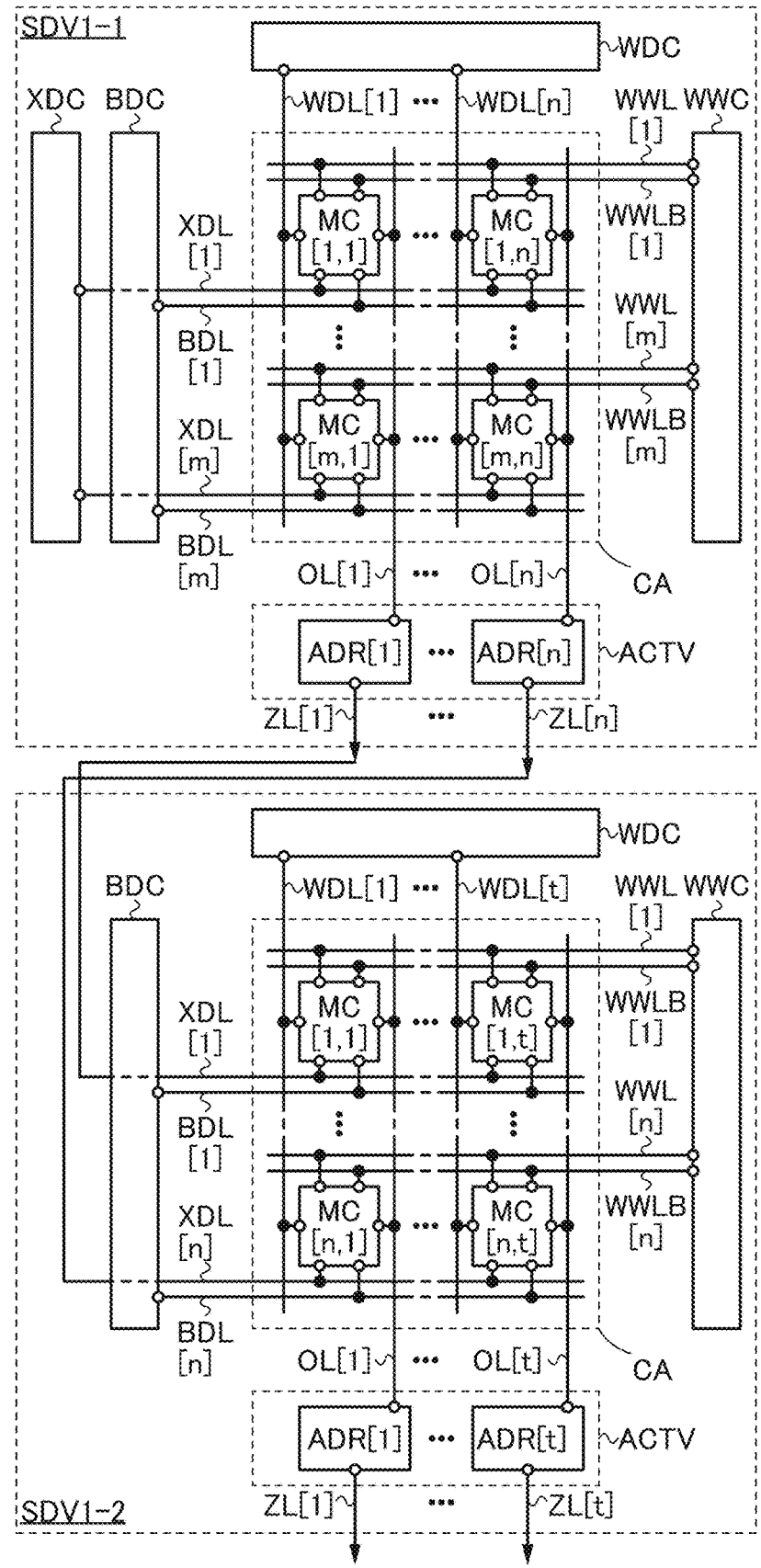
FIG. 22 is a block diagram illustrating a structure example of a semiconductor device.

Specifically, with the use of a semiconductor device illustrated in FIG. 22, an arithmetic operation of the hierarchical neural network can be performed. The semiconductor device in FIG. 22 includes, as an example, a semiconductor device SDV1-1 having a structure similar to that of the semiconductor device SDV1 in FIG. 6A, and a semiconductor device SDV1-2 which is not provided with the circuit XDC in the semiconductor device SDV1 in FIG. 6A. The cell array CA of the semiconductor device SDV1-1 includes the circuit MC[1,1] to the circuit MC[m,n]. Furthermore, the cell array CA of the semiconductor device SDV1-2 includes the circuit MC[1,1] to a circuit MC[n,t] (t is an integer greater than or equal to 1). The wiring ZL[1] to the wiring ZL[n] in the semiconductor device SDV1-1 are electrically connected to the wiring XDL[1] to the wiring XDL[n] in the semiconductor device SDV1-2, respectively.

For example, in the semiconductor device SDV1-1 in FIG. 22, the weight coefficient between the neurons in the (k−1)-th layer and the neurons in the k-th layer is used as the first data and retained in the circuit MC[1,1] to the circuit MC[m,n], the output signal $z_{s[k-1]}^{(k-1)}$ from the neuron $N_{s[k-1]}^{(k-1)}$ in the (k−1)-th layer is used as the second data, and the voltage corresponding to the second data is input to the wiring XDL[1] to the wiring XDL[m] from the circuit XDC, whereby the output signals $z_1^{(k)}$ to $z_n^{(k)}$ of the neuron $N_1^{(k)}$ to the neuron $N_n^{(k)}$ in the k-th layer can be output from the wiring ZL[1] to the wiring ZL[n], respectively. The values of the output signals $z_1^{(k)}$ to $z_n^{(k)}$ can be represented as the voltages output from the circuit ADR.

In the semiconductor device SDV1-2 in FIG. 22, the weight coefficient between the neurons in the k-th layer and the neurons in the (k+1)-th layer is used as the first data and retained in the circuit MC[1,1] to the circuit MC[n,t], and the voltage input to the wiring XDL[1] to the wiring XDL[n], i.e., the output signals $z_1^{(k)}$ to $z_n^{(k)}$ from the neuron $N_1^{(k)}$ to the neuron $N_n^{(k)}$ in the k-th layer, are used as the second data, whereby the wiring ZL[s[k+1]] (here, s[k+1] is an integer greater than or equal to 1 and less than or equal to t) can output the output signal $z_{s[k+1]}^{(k+1)}$ of the neuron $N_{s[k+1]}^{(k+1)}$ in the (k+1)-th layer.

In an hierarchical neural network operation, with the arithmetic circuit illustrated in FIG. 22, as described above, the value of the output signal of the neuron (voltage) output from the semiconductor device SDV1-1 can be directly input to the semiconductor device SDV1-2, whereby the hierarchical neural network operation can be performed successively from the first layer, for example. The output signals output from the wiring ZL[1] to the wiring ZL[n] of the semiconductor device SDV1-1 need not be temporarily stored with an external circuit or the like; thus, a memory device for temporarily storing the signal need not be provided. That is, with the semiconductor device in FIG. 22, the circuit area can be reduced and power necessary for transmitting data to be temporarily stored can be reduced.

Note that this embodiment can be combined with any of the other embodiments in this specification as appropriate.

Embodiment 5

This embodiment will describe structure examples of the semiconductor device described in the above embodiments and structure examples of transistors that can be used in the semiconductor device described in the above embodiments.

Structure Example of Semiconductor Device

Figure 23:
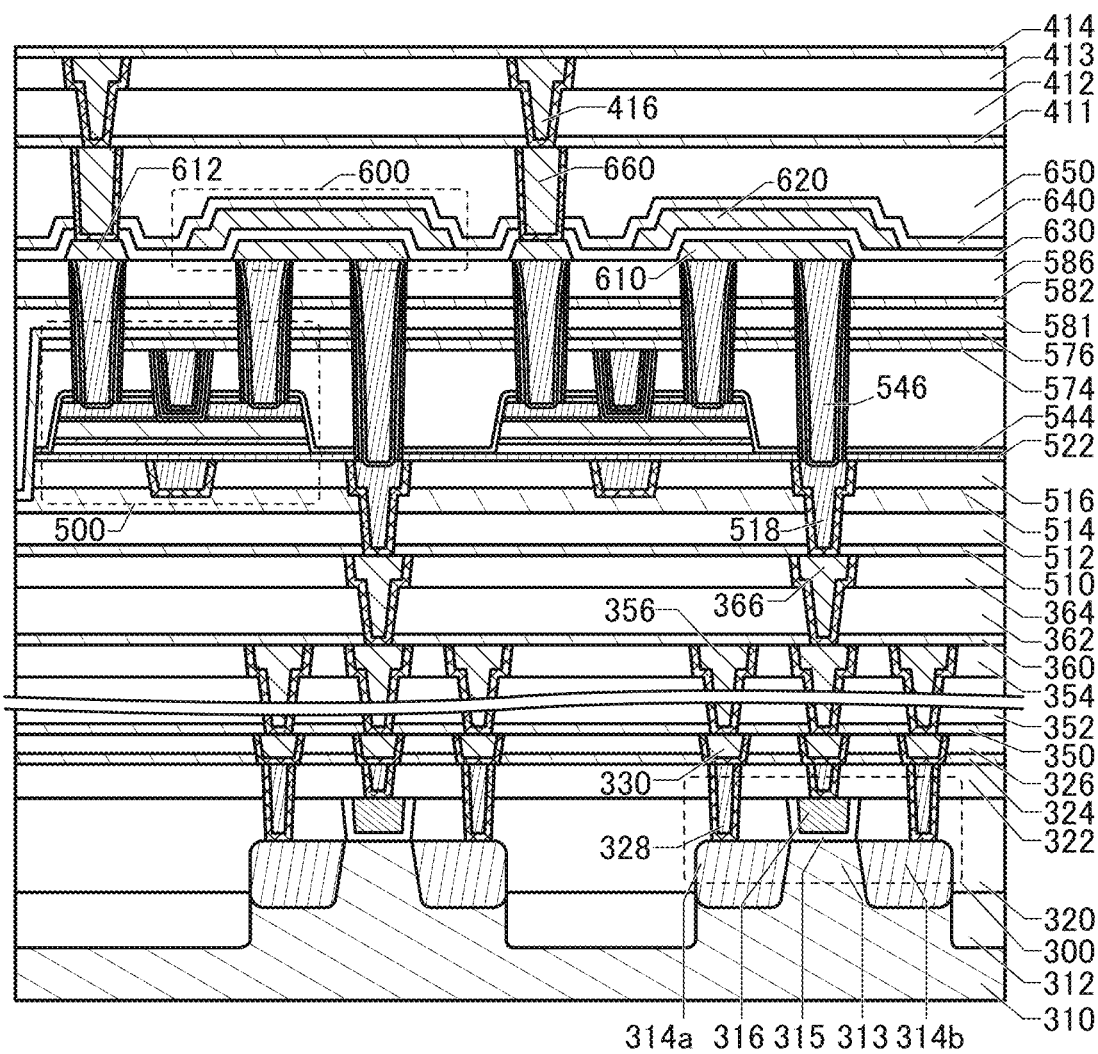
FIG. 23 is a schematic cross-sectional view illustrating a structure example of a semiconductor device.
Figure 24A:
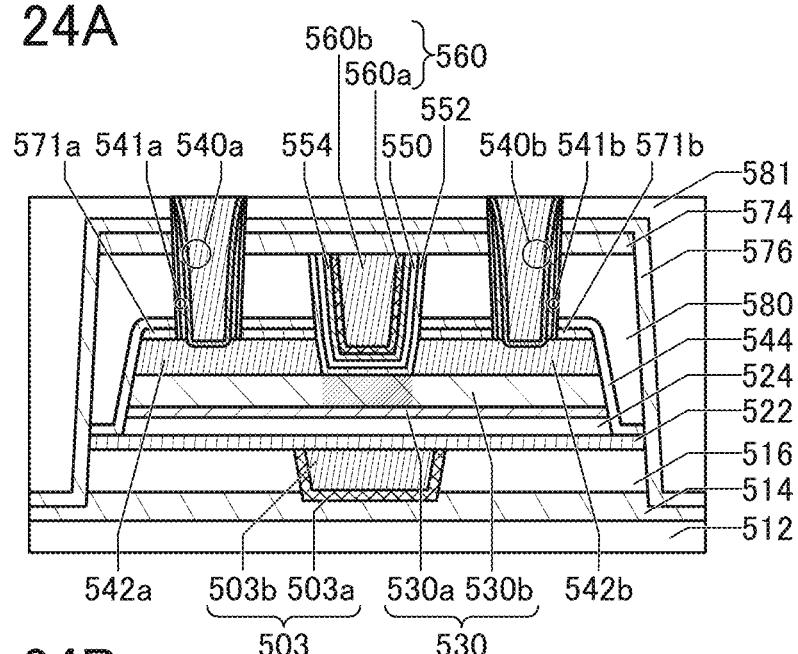
FIG. 24A to FIG. 24C are schematic cross-sectional views illustrating a structure example of a transistor.
Figure 24B:
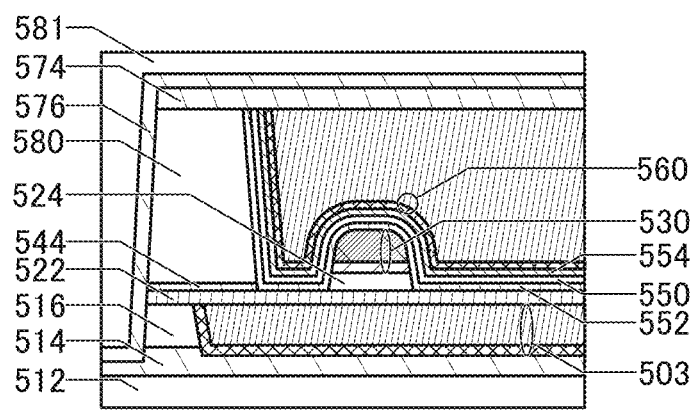
Figure 24C:
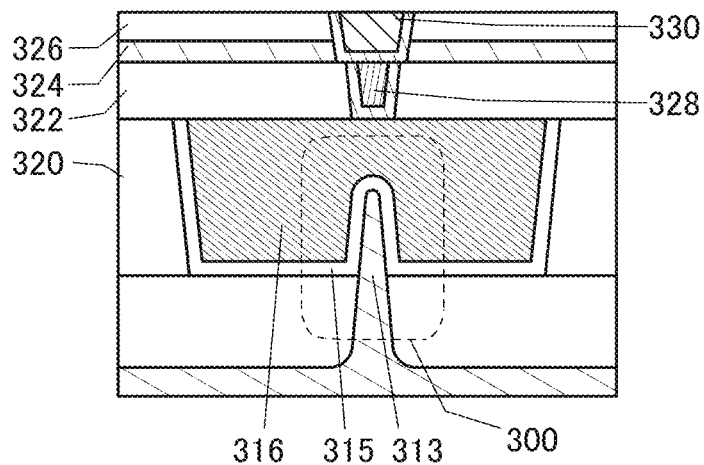

FIG. 23 illustrates the semiconductor device described in the above embodiment as an example, and the semiconductor device includes a transistor 300, a transistor 500, and a capacitor 600. FIG. 24A is a cross-sectional view of the transistor 500 in the channel length direction, FIG. 24B is a cross-sectional view of the transistor 500 in the channel width direction, and FIG. 24C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as a transistor included in a semiconductor device, for example, the semiconductor device SVD1, the semiconductor device SVD2, the semiconductor device SVD3, the semiconductor device SVD4, the semiconductor device SVD5, or the like described in the above embodiment, whereby a semiconductor device whose operating performance hardly deteriorates even at high temperatures can be obtained. In particular, when the transistor 500 is used as the transistor M3, a potential written to the first terminal of the capacitor C1 in the circuit MC can be retained for a long time by utilizing the feature of a low off-state current.

The transistor 500 is provided above the transistor 300, for example, and the capacitor 600 is provided above the transistor 300 and the transistor 500, for example. Note that the capacitor 600 can be the capacitor or the like included in the semiconductor device SVD1, the semiconductor device SVD2, the semiconductor device SVD3, the semiconductor device SVD4, the semiconductor device SVD5, or the like described in the above embodiment. Note that depending on a circuit structure, the capacitor 600 illustrated in FIG. 23 is not necessarily provided.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used as, for example, a transistor or the like included in the semiconductor device SVD1, the semiconductor device SVD2, the semiconductor device SVD3, the semiconductor device SVD4, the semiconductor device SVD5, or the like described in the above embodiment. Specifically, for example, the transistor 300 can be a transistor included in the inverter circuit, the NAND circuit, or the like included in the circuit ACF illustrated in FIG. 8A and FIG. 8B. Note that FIG. 23 illustrates a structure in which a gate of the transistor 300 is electrically connected to one of a source and a drain of the transistor 500 through a pair of electrodes of the capacitor 600; however, depending on the structure of the semiconductor device SVD1, the semiconductor device SVD2, the semiconductor device SVD3, the semiconductor device SVD4, the semiconductor device SVD5, or the like, a structure in which one of a source and a drain of the transistor 300 is electrically connected to one of the source and the drain of the transistor 500 through the pair of electrodes of the capacitor 600 can be employed, a structure in which one of the source and the drain of the transistor 300 is electrically connected to a gate of the transistor 500 through the pair of electrodes of the capacitor 600 can be employed, or a structure in which the terminals of the transistor 300 are not electrically connected to the terminals of the transistor 500 or the terminals of the capacitor 600 can be employed.

A semiconductor substrate (e.g., a single crystal substrate or a silicon substrate) is preferably used as the substrate 310.

In the transistor 300, a top surface and a side surface in the channel width direction of the semiconductor region 313 are covered with the conductor 316 with the insulator 315 therebetween, as illustrated in FIG. 24C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 25:
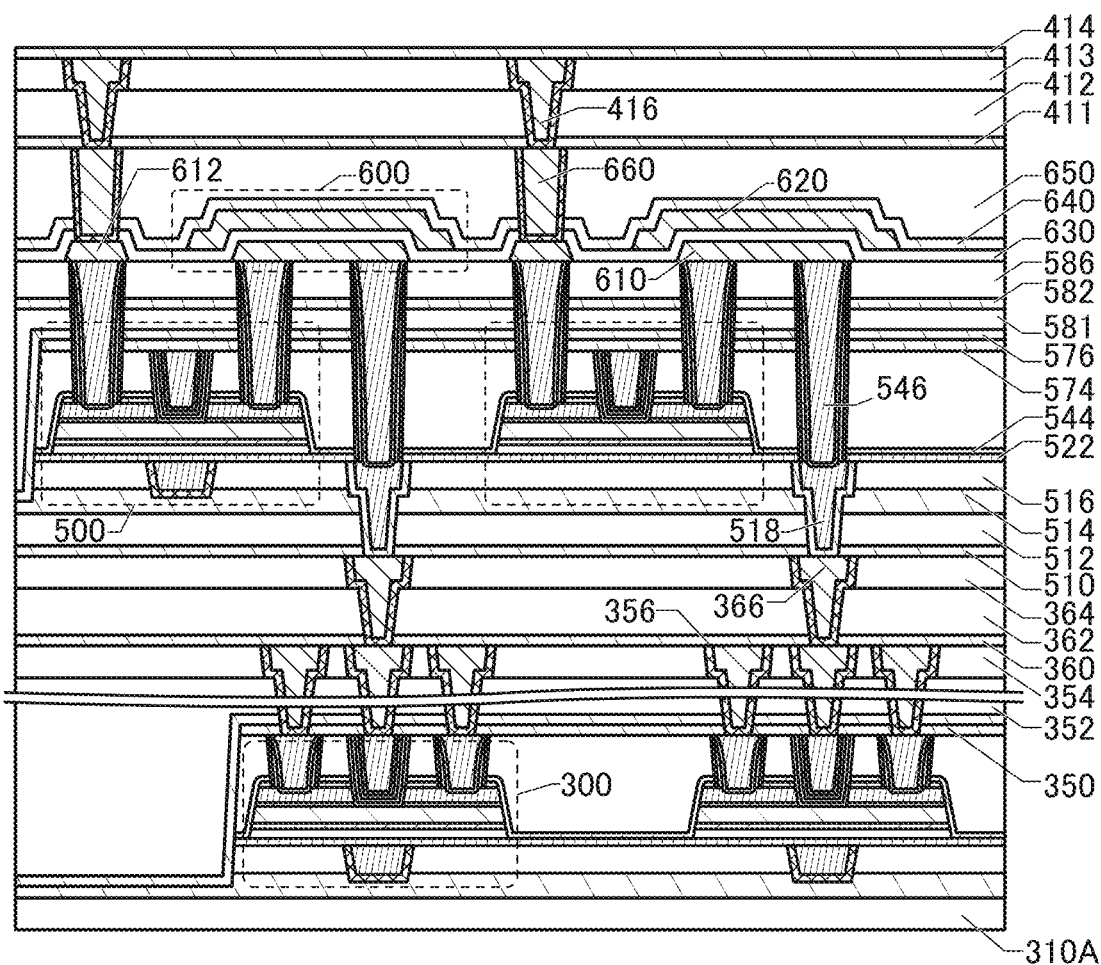
FIG. 25 is a schematic cross-sectional view illustrating a structure example of a semiconductor device.

Note that the transistor 300 illustrated in FIG. 23 is an example and the structure is not limited thereto; an appropriate transistor is used in accordance with a circuit structure, a driving method, or the like. For example, the transistor 300 may have a planar structure instead of a FIN-type structure illustrated in FIG. 24C. For example, when a semiconductor device is a single-polarity circuit using only OS transistors, the transistor 300 may have a structure similar to that of the transistor 500 using an oxide semiconductor, as illustrated in FIG. 25. Note that the details of the transistor 500 will be described later. In this specification and the like, a single-polarity circuit refers to a circuit including only either n-channel transistors or p-channel transistors.

Note that in FIG. 25, the transistor 300 is provided over a substrate 310A; in this case, a semiconductor substrate may be used as the substrate 310A, as in the case of the substrate 310 in the semiconductor device in FIG. 23. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

In the transistor 300 illustrated in FIG. 23, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320 and the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 may be less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 23, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride or the like is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and the conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked in this order over the insulator 364 and the conductor 366. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents passage of both oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from an oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

A conductor 518, a conductor included in the transistor 500 (e.g., a conductor 503 illustrated in FIG. 24A and FIG. 24B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, diffusion of hydrogen from the transistor 300 into the transistor 500 can be inhibited.

The transistor 500 is provided above the insulator 516.

As illustrated in FIG. 24A and FIG. 24B, the transistor 500 includes the insulator 516 over the insulator 514, the conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542a, the conductor 542b, the insulator 571a, and insulator 571b. Here, as illustrated in FIG. 24A and FIG. 24B, the insulator 552 is in contact with the top surface of the insulator 522, the side surface of the insulator 524, the side surface of the oxide 530a, the side surface and the top surface of the oxide 530b, the side surface of the conductor 542, the side surface of the insulator 571, the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are placed in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from a component formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 26A:
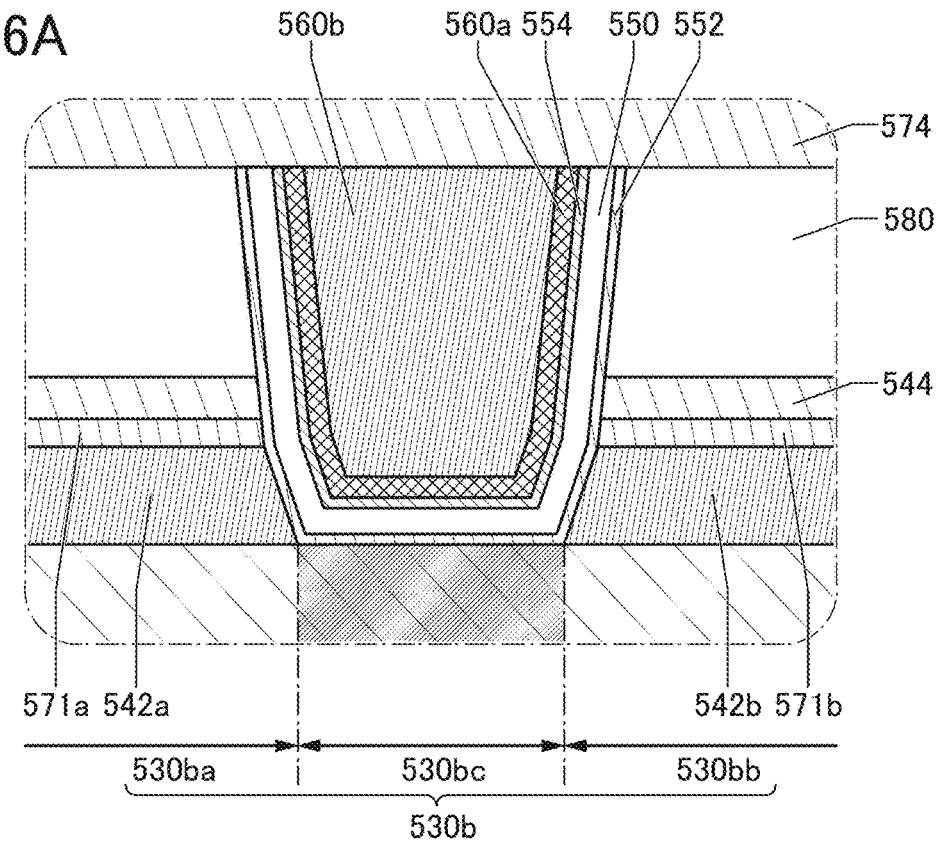
FIG. 26A and FIG. 26B are schematic cross-sectional views illustrating a structure example of a transistor.

Here, FIG. 26A is an enlarged view of the vicinity of the channel formation region in FIG. 24A. Supply of oxygen to the oxide 530b forms the channel formation region in a region between the conductor 542a and the conductor 542b. As illustrated in FIG. 26A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as Vo in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies (Vo) exist in a region of the metal oxide where a channel is formed, which might degrade the reliability. In some cases, hydrogen in the vicinity of an oxygen vacancy (Vo) forms a defect that is an oxygen vacancy (Vo) into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and a current flows through the transistor). Thus, impurities, oxygen vacancies, and VoH are preferably reduced as much as possible in the region of the oxide semiconductor where a channel is formed.

The region 530ba and the region 530bb functioning as the source region and the drain region are each a low-resistance region with an increased carrier concentration because they include a large amount of oxygen vacancies (Vo) or have a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 530bc functioning as the channel formation region is not particularly limited and can be, for example, $1\times10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or approximately equal to the hydrogen concentration in the region 530bc in some cases. The amount of oxygen vacancies in the junction region is smaller than or substantially equal to the amounts of oxygen vacancies in the region 530ba and the region 530bb and larger than or approximately equal to the amount of oxygen vacancies in the region 530bc in some cases.

Although FIG. 26A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530b is preferably greater than the atomic ratio of In to the element M in the metal oxide used as the oxide 530a.

The oxide 530a is provided under the oxide 530b in the above manner, whereby impurities and oxygen can be inhibited from diffusing into the oxide 530b from a component formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably has crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies (Vo)). In particular, after the formation of a metal oxide, heat treatment is performed at a temperature at which the metal oxide does not become a polycrystal (e.g., 400° C. to 600° C., inclusive), whereby a CAAC-OS having a dense structure and higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and a current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 500. Furthermore, a variation of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with a reduced carrier concentration, whereas the region 530ba and the region 530bb functioning as the source region and the drain region are preferably n-type regions with high carrier concentrations. That is, it is preferable that oxygen vacancies and VoH in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and VoH in the region 530bc can be reduced. Here, the microwave treatment refers to, for example, treatment using an apparatus equipped with a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can be irradiated with the high-frequency wave such as a microwave or RF. By the effect of the plasma, a microwave, or the like, VoH in the region 530bc can be cut; thus, hydrogen H can be removed from the region 530bc and an oxygen vacancy Vo can be filled with oxygen. That is, the reaction "VoH⇌H+Vo" occurs in the region 530bc, so that the hydrogen concentration in the region 530bc can be reduced. As a result, oxygen vacancies and VoH in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in VoH and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with the side surface of the conductor 542 and the surface of the region 530bc, thereby preventing oxygen more than necessary from being supplied to the region 530bc and preventing the side surface of the conductor 542 from being oxidized. Furthermore, the side surface of the conductor 542 can be inhibited from being oxidized when an insulating film to be the insulator 550 is formed.

The oxygen supplied into the region 530bc has any of a variety of forms such as an oxygen atom, an oxygen molecule, and an oxygen radical (also referred to as an O radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and VoH can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the n-type conductivity can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 24B, a curved surface may be provided between the side surface of the oxide 530b and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof may be used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof may be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 24A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be manufactured.

Although the insulator 512, the insulator 514, the insulator 544, the insulator 571, the insulator 574, the insulator 576, and the insulator 581 each preferably have an amorphous structure, a region having a polycrystalline structure may be partly formed. Alternatively, the insulator 512, the insulator 514, the insulator 544, the insulator 571, the insulator 574, the insulator 576, and the insulator 581 may each have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ Ωcm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1 \times 10^{10}$ Ωcm and lower than or equal to $1 \times 10^{15}$ Ωcm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, the drain current at the time when a potential applied to the conductor 560 is 0 V can be lower in the case where a negative potential is applied to the conductor 503 than in the case where the negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 24B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 24B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a manufacturing process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies (Vo). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b each function as a source electrode or a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and the top surface of the conductor 542. The conductor 542 without curved surface can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of further inhibiting diffusion of oxygen as compared to the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or aluminum oxide having an amorphous structure for the insulator 571 because hydrogen can be captured or fixed more effectively in some cases. Accordingly, the transistor 500 and a semiconductor device, which have favorable characteristics and high reliability, can be manufactured.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 24B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies (Vo) in the oxide 530a and the oxide 530b. Therefore, oxygen vacancies (Vo) and VoH formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 24A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, it is acceptable that at least part of the insulator 552 includes a region having a thickness smaller than that of the insulator 550.

To form the insulator 552 having a small thickness as described above, an ALD method is preferably used for deposition. Examples of an ALD method include a thermal ALD method, in which a precursor and a reactant react with each other only by thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of an impurity such as water or hydrogen in the insulator 550 is preferably reduced. The thickness of the insulator 550 is preferably greater than or equal to 1 nm or greater than or equal to 0.5 nm and less than or equal to 15.0 nm or less than or equal to 20 nm. Note that the above-described lower limits and upper limits can be combined with each other. In that case, at least part of the insulator 550 includes a region having the above-described thickness.

Although FIG. 24A, FIG. 24B, and the like illustrate a single-layer structure of the insulator 550, the present invention is not limited to this structure, and a stacked-layer structure of two or more layers may be employed. For example, as illustrated in FIG. 26B, the insulator 550 may have a stacked-layer structure including two layers of an insulator 550a and an insulator 550b over the insulator 550a.

Figure 26B:
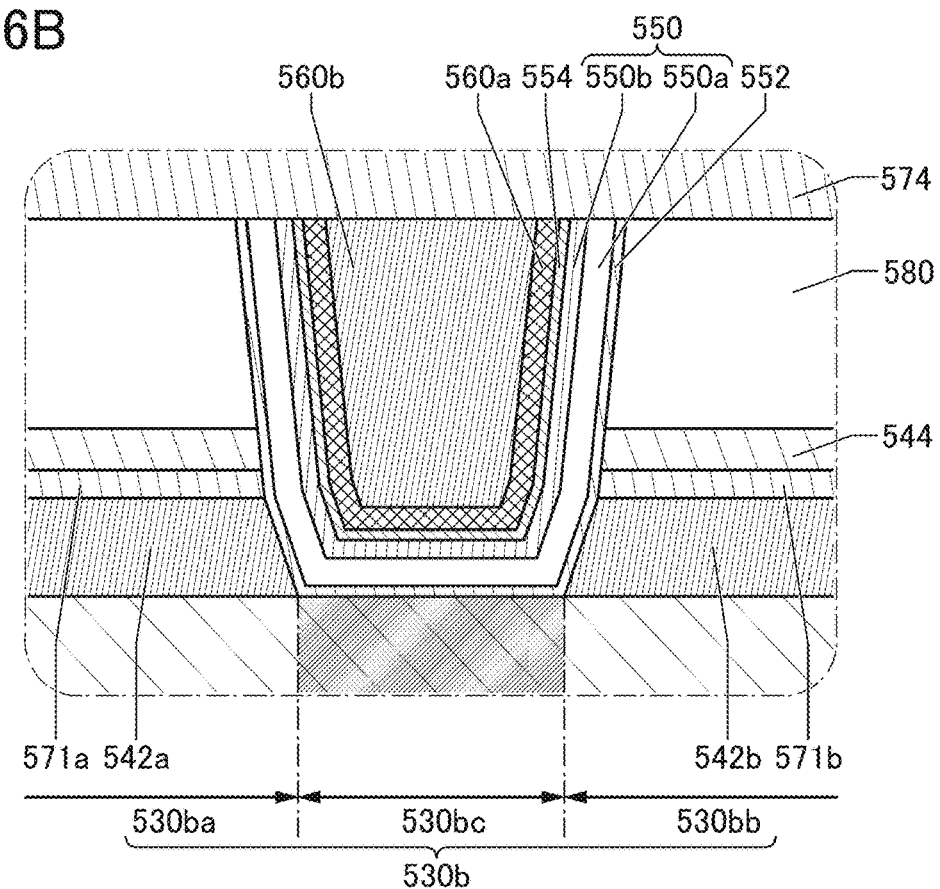

In the case where the insulator 550 has a stacked-layer structure of two layers as illustrated in FIG. 26B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, it is acceptable that at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, it is acceptable that at least part of the insulator 554 includes a region having the above-described thickness. The thickness of the insulator 554 is preferably smaller than that of the insulator 550. In that case, it is acceptable that at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover the bottom surface and the side surface of the conductor 560b. As illustrated in FIG. 24A and FIG. 24B, the upper portion of the conductor 560 is substantially level with the upper portion of the insulator 550. Note that although the conductor 560 has a two-layer structure of the conductor 560a and the conductor 560b in FIG. 24A and FIG. 24B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 24B, in the channel width direction of the transistor 500, with reference to the bottom surface of the insulator 522, the level of the bottom surface of the conductor 560 in a region where the conductor 560 and the oxide 530b do not overlap with each other is preferably lower than the level of the bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that in this specification and the like, the conductor 540a and the conductor 540b are collectively referred to as the conductor 540.

The conductor 540a is provided in a region overlapping with the conductor 542a, for example. Specifically, an opening portion is formed in the insulator 571, the insulator 544, the insulator 580, the insulator 574, the insulator 576, and the insulator 581 illustrated in FIG. 24A and in an insulator 582 and an insulator 586 illustrated in FIG. 23 in the region overlapping with the conductor 542a, and the conductor 540a is provided inside the opening portion. The conductor 540b is provided in a region overlapping with the conductor 542b, for example. Specifically, an opening portion is formed in the insulator 571, the insulator 544, the insulator 580, the insulator 574, the insulator 576, and the insulator 581 illustrated in FIG. 24A and in the insulator 582 and the insulator 586 illustrated in FIG. 23 in the region overlapping with the conductor 542b, and the conductor 540b is provided inside the opening portion. Note that the insulator 582 and the insulator 586 will be described later.

As illustrated in FIG. 24A, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540b and the side surface of the opening portion in the region overlapping with the conductor 542b. Note that in this specification and the like, the insulator 541a and the insulator 541b are collectively referred to as the insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540*a* and the conductor 540*b*.

For the insulator 541*a* and the insulator 541*b*, a barrier insulating film that can be used for the insulator 544 or the like may be used. For the insulator 541*a* and the insulator 541*b*, for example, an insulator such as silicon nitride, aluminum oxide, or silicon nitride oxide may be used. Since the insulator 541*a* and the insulator 541*b* are provided in contact with the insulator 574, the insulator 576, and the insulator 571, impurities such as water and hydrogen contained in the insulator 580 or the like can be inhibited from entering the oxide 530 through the conductor 540*a* and the conductor 540*b*. In particular, silicon nitride is suitable because of its high blocking property against hydrogen. Furthermore, oxygen contained in the insulator 580 can be prevented from being absorbed by the conductor 540*a* and the conductor 540*b*.

When the insulator 541*a* and the insulator 541*b* each have a stacked-layer structure as illustrated in FIG. 24A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 23, a conductor 610, a conductor 612, and the like serving as wirings may be provided in contact with the upper portion of the conductor 540*a* and the upper portion of the conductor 540*b*. For the conductor 610 and the conductor 612, a conductive material containing tungsten, copper, or aluminum as its main component is preferably used. The conductors can each have a stacked-layer structure. Specifically, the conductors may each be a stack of titanium or a titanium nitride and any of the above conductive materials, for example. Note that the conductors may each be formed to be embedded in an opening provided in an insulator.

The structure of the transistor included in the semiconductor device of one embodiment of the present invention is not limited to that of the transistor 500 illustrated in FIG. 23, FIG. 24A, FIG. 24B, and FIG. 25. The structure of the transistor included in the semiconductor device of one embodiment of the present invention may be changed in accordance with circumstances.

Figure 27:
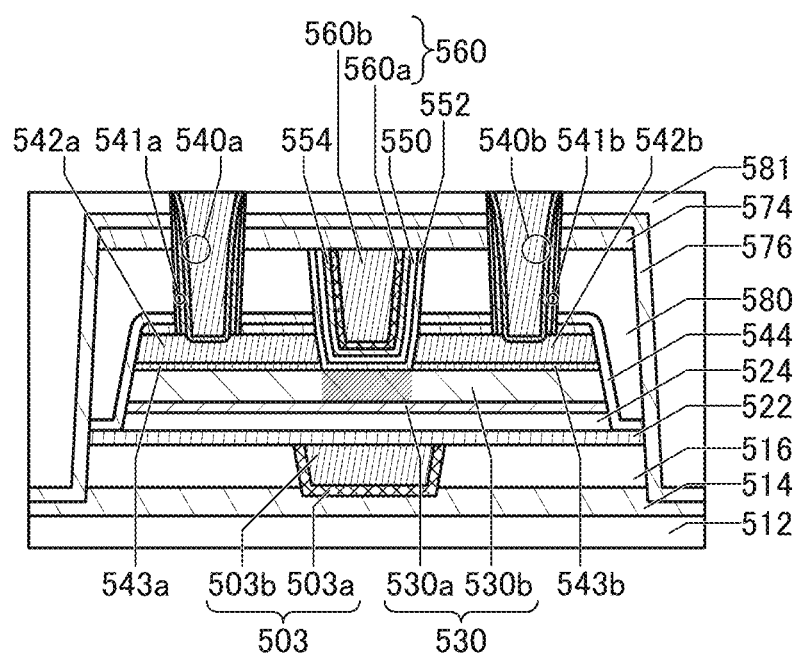
FIG. 27 is a schematic cross-sectional diagram illustrating a structure example of a transistor.

For example, the transistor 500 illustrated in FIG. 23, FIG. 24A, FIG. 24B, and FIG. 25 may have a structure illustrated in FIG. 27. The transistor in FIG. 27 is different from the transistor 500 illustrated in FIG. 23, FIG. 24A, FIG. 24B, and FIG. 25 in including an oxide 543*a* and an oxide 543*b*. Note that in this specification and the like, the oxide 543*a* and the oxide 543*b* are collectively referred to as an oxide 543. The cross section in the channel width direction of the transistor in FIG. 27 can have a structure similar to the cross section of the transistor 500 illustrated in FIG. 24B.

The oxide 543*a* is provided between the oxide 530*b* and the conductor 542*a*, and the oxide 543*b* is provided between the oxide 530*b* and the conductor 542*b*. Here, the oxide 543*a* is preferably in contact with the top surface of the oxide 530*b* and the bottom surface of the conductor 542*a*. The oxide 543*b* is preferably in contact with the top surface of the oxide 530*b* and the bottom surface of the conductor 542*b*.

The oxide 543 preferably has a function of inhibiting passage of oxygen. The oxide 543 having a function of inhibiting passage of oxygen is preferably provided between the oxide 530*b* and the conductor 542 functioning as the source electrode or the drain electrode, in which case the electric resistance between the conductor 542 and the oxide 530*b* can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530*b*. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530*b*. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582.

A substance having a barrier property against oxygen or hydrogen is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 23 and FIG. 25 will be described. Note that the capacitor 600 and the wiring and/or the plug are provided above the transistor 500 illustrated in FIG. 23 and FIG. 25.

The capacitor 600 includes the conductor 610, a conductor 620, and an insulator 630, for example.

The conductor 610 is provided over one of the conductor 540*a* and the conductor 540*b*, the conductor 546, and the insulator 586. The conductor 610 has a function of one of a pair of electrodes of the capacitor 600.

The conductor 612 is provided over the other of the conductor 540*a* and the conductor 540*b* and the insulator 586. The conductor 612 has a function of a plug, a wiring, a terminal, or the like for electrically connecting a circuit element, a wiring, or the like placed above to the transistor 500. Specifically, the conductor 612 can be the wiring WDL or the like in the semiconductor device SVD1 described in Embodiment 1, for example.

Note that the conductor 612 and the conductor 610 may be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 23; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric sandwiched between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

For another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high-permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of semiconductor devices progress, a problem such as leakage current from a transistor or a capacitor might arise because of a thinner gate insulator and a thinner dielectric used in the capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained.

The conductor 620 is provided to overlap with the conductor 610 with the insulator 630 therebetween. The conductor 610 has a function of one of the pair of electrodes of the capacitor 600. The conductor 620 can be the wiring WWLB or the like in the semiconductor device SDV1 described in Embodiment 1, for example.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. For example, the conductor 620 can be formed using a material that can be used for the conductor 610. The conductor 620 may have a stacked-layer structure of two or more layers instead of a single-layer structure.

An insulator 640 is provided over the conductor 620 and the insulator 630. The insulator 640 is preferably formed using a film having a barrier property that prevents hydrogen or impurities from diffusing into the region where the transistor 500 is provided, for example. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials that can be used for the insulator 324, for example.

Although the capacitor 600 illustrated in FIG. 23 and FIG. 25 is a planar capacitor, the shape of the capacitor is not limited thereto. For example, the capacitor 600 may be a cylindrical capacitor instead of a planar capacitor.

A wiring layer may be provided above the capacitor 600. For example, in FIG. 23, an insulator 411, an insulator 412, an insulator 413, and an insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described later.

In addition, in the insulator 630, the insulator 640, and the insulator 650, an opening portion is provided in a region overlapping with the conductor 612, and the conductor 660 is provided to fill the opening portion. The conductor 660 serves as a plug or a wiring that is electrically connected to the conductor 416 included in the above-described wiring layer.

Like the insulator 324 or the like, the insulator 411 and the insulator 414 are each preferably formed using an insulator having a barrier property against impurities such as water and hydrogen, for example. Thus, the insulator 411 and the insulator 414 can be formed using any of the materials that can be used for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330, for example.

When a semiconductor device using a transistor including an oxide semiconductor has the structure described in this embodiment, a change in electrical characteristics of the transistor can be inhibited and the reliability can be improved. Alternatively, a semiconductor device using a transistor including an oxide semiconductor can be miniaturized or highly integrated.

Note that this embodiment can be combined with any of the other embodiments in this specification as appropriate.

Embodiment 6

Described in this embodiment is a metal oxide (hereinafter also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of oxide semiconductor will be explained with FIG. 28A. FIG. 28A is a diagram showing the classification of crystal structures of an oxide semiconductor, typically IGZO (a metal oxide containing In, Ga, and Zn).

As shown in FIG. 28A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 28A are in an intermediate state between "Amorphous" and "Crystal", and belong to a new boundary region (new crystalline phase). That is, these structures are completely different from "Amorphous", which is energetically unstable, and "Crystal".

Note that a crystal structure of a film or a substrate can be evaluated with an X-ray diffraction (XRD) spectrum. FIG. 28B shows an XRD spectrum, which is obtained by GIXD (Grazing-Incidence XRD) measurement, of a CAAC-IGZO film classified into "Crystalline" (the horizontal axis represents 2θ[deg.] and the vertical axis represents intensity in arbitrary unit (a. u.)). Note that a GIXD method is also referred to as a thin film method or a Seemann-Bohlin method. The XRD spectrum that is shown in FIG. 28B and obtained by GIXD measurement is hereinafter simply referred to as an XRD spectrum. The CAAC-IGZO film in FIG. 28B has a composition in the vicinity of In:Ga:Zn=4:2:3 [atomic ratio]. The CAAC-IGZO film in FIG. 28B has a thickness of 500 nm.

As shown in FIG. 28B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 28B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 28C shows a diffraction pattern of the CAAC-IGZO film. FIG. 28C shows a diffraction pattern obtained by the NBED method in which an electron beam is incident in the direction parallel to the substrate. The composition of the CAAC-IGZO film in FIG. 28C is In:Ga:Zn=4:2:3 [atomic ratio] or the vicinity thereof. In the nanobeam electron diffraction method, electron diffraction is performed with a probe diameter of 1 nm.

As shown in FIG. 28C, a plurality of spots indicating c-axis alignment are observed in the diffraction pattern of the CAAC-IGZO film.

<<Structure of Oxide Semiconductor>>

Oxide semiconductors may be classified in a manner different from one shown in FIG. 28A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the hydrogen concentration in the film of the a-like OS is higher than those of the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In]

in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_o$ n), high field-effect mobility ($\mu$), and excellent switching operation can be achieved.

An oxide semiconductor has various structures with different properties. Two or more kinds among the amorphous oxide semiconductor, the polycrystalline oxide semiconductor, the a like OS, the CAC-OS, the nc-OS, and the CAAC-OS may be included in an oxide semiconductor of one embodiment of the present invention.

<Transistor Including Oxide Semiconductor>

Next, a case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 7

This embodiment will describe examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 29A.

Figure 29A:
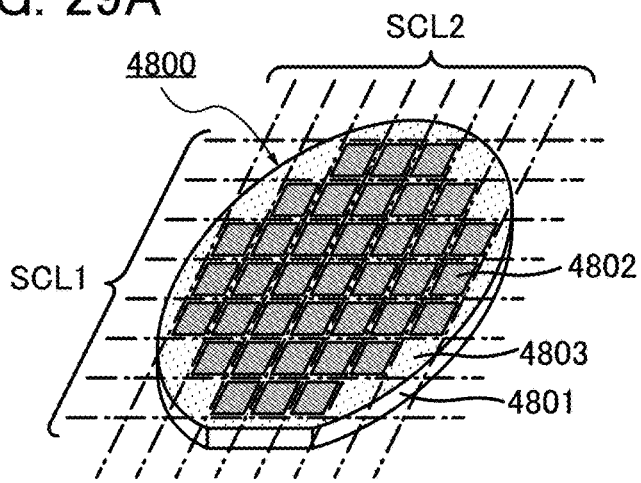
FIG. 29A is a perspective view illustrating an example of a semiconductor wafer.

A semiconductor wafer 4800 shown in FIG. 29A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided such that the plurality of scribe lines SCL1 are parallel to each other, the plurality of scribe lines SCL2 are parallel to each other, and the scribe lines SCL1 are perpendicular to the scribe lines SCL2.

Figure 29B:
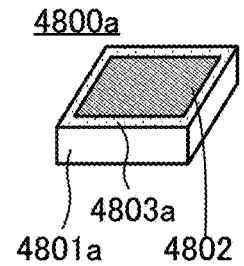
FIG. 29B is a perspective view illustrating an example of a chip.

With the dicing step, a chip 4800a as shown in FIG. 29B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a length of a cutting allowance of the scribe line SCL1 or a cutting allowance of the scribe line SCL2.

Note that the shape of the element substrate of one embodiment of the present invention is not limited to the shape of the semiconductor wafer 4800 shown in FIG. 29A. The element substrate may be a rectangular semiconductor wafer, for example. The shape of the element substrate can be changed as appropriate, depending on a manufacturing process of an element and an apparatus for manufacturing the element.

<Electronic Component>

Figure 29C:
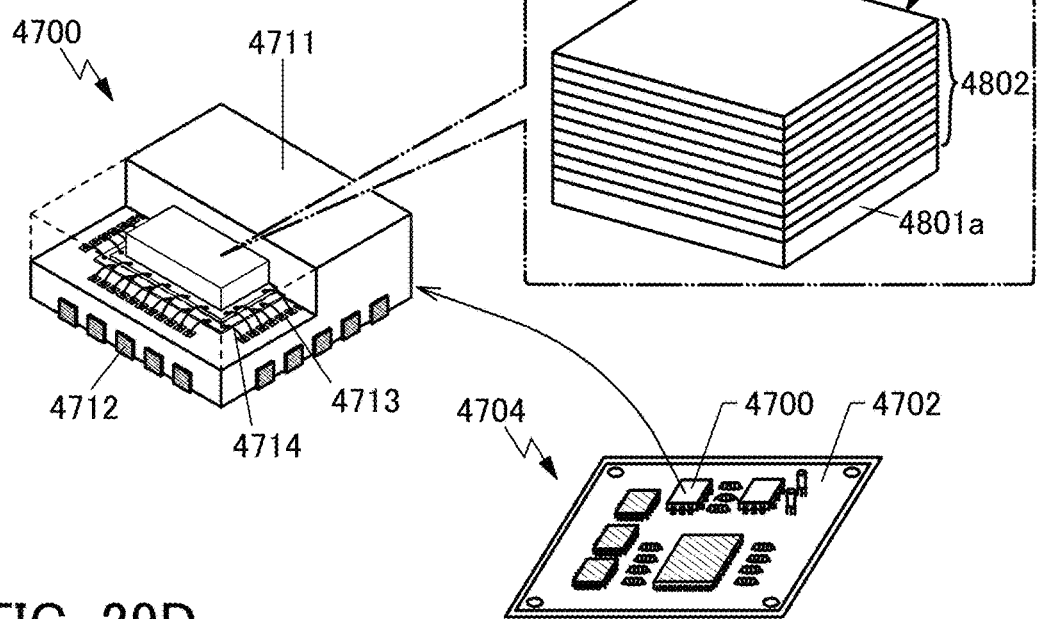
FIG. 29C and FIG. 29D are perspective views illustrating examples of electronic components.

FIG. 29C is a perspective view of an electronic component 4700 and a substrate (a mounting board 4704) on which the electronic component 4700 is mounted. The electronic component 4700 illustrated in FIG. 29C includes the chip 4800a in a mold 4711. Note that the chip 4800a illustrated in FIG. 29C may have a structure in which the circuit portions 4802 are stacked. To illustrate the inside of the electronic component 4700, some portions are omitted in FIG. 29C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 29D:
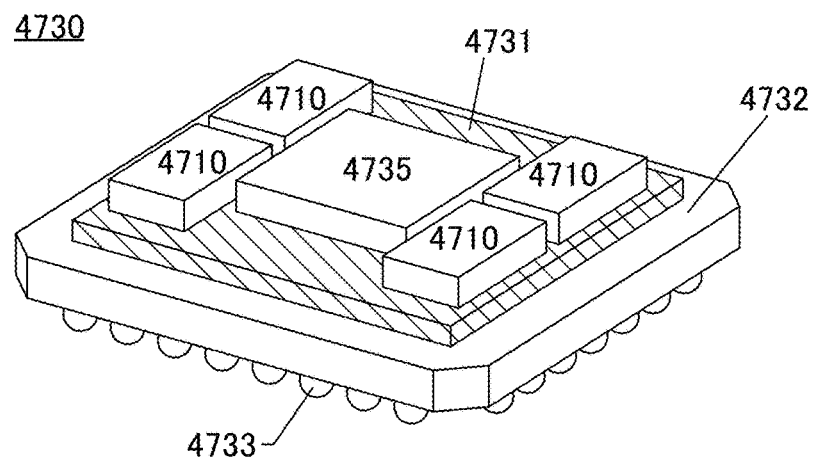

FIG. 29D is a perspective view of an electronic component 4730. The electronic component 4730 is an example of a SiP (System in package) or an MCM (Multi Chip Module). In the electronic component 4730, an interposer 4731 is provided on a package substrate 4732 (printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a multi-layer structure. Moreover, the interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". A through electrode is provided in the interposer 4731 and the through electrode is used to electrically connect an integrated circuit and the package substrate 4732 in some cases. In the case of using a silicon interposer, a TSV (through-silicon via) can also be used as the through electrode.

A silicon interposer is preferably used as the interposer 4731. The silicon interposer can be manufactured at lower cost than an integrated circuit because it is not necessary to provide an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon is less likely to occur. It is preferable to use a silicon interposer especially for a 2.5D package (2.5-dimensional mounting) in which a plurality of integrated circuits are arranged side by side on the interposer.

A heat sink (radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 29D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as a staggered pin grid array (SPGA), a land grid array (LGA), a quad flat package (QFP), a quad flat J-leaded package (QFJ), or a quad flat non-leaded package (QFN) can be employed.

Note that this embodiment can be combined with any of the other embodiments in this specification as appropriate.

Embodiment 8

Figure 30:
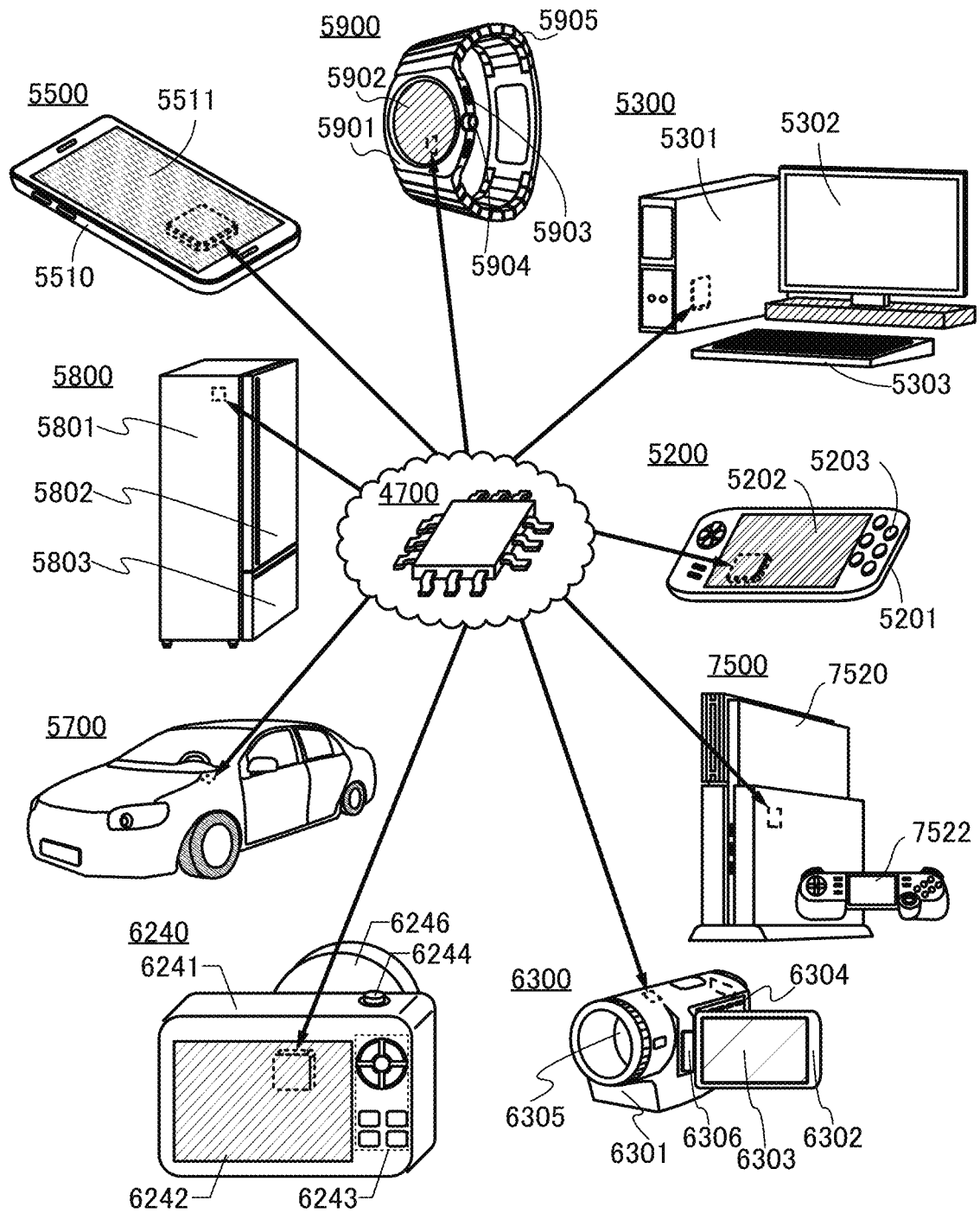
FIG. 30 is a perspective view illustrating examples of electronic devices.

In this embodiment, examples of electronic devices each including the semiconductor device described in the above embodiment are described. FIG. 30 illustrates electronic devices each including the electronic component 4700 including the semiconductor device.

[Mobile Phone]

An information terminal 5500 illustrated in FIG. 30 is a mobile phone (a smartphone), which is a type of portable information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication of fingerprints, voice prints, and the like.

[Wearable Terminal]

FIG. 30 illustrates a watch-type information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application for managing the health condition of the user of the wearable terminal and a navigation system that selects the optimal route and navigates the user in accordance with the input of the destination.

[Information Terminal]

FIG. 30 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIG. 30 illustrates the smartphone, the desktop information terminal, and the wearable terminal as examples of electronic devices, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 30 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, and a function of automatically adjusting temperature to be appropriate for the foods stored in the electric refrigerator-freezer 5800, for example.

Although the electric refrigerator-freezer is described as a household appliance in this example, other examples of the household appliance include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machines]

FIG. 30 illustrates a portable game machine 5200 as an example of a game machine. The portable game machine 5200 includes a housing 5201, a display portion 5202, a button 5203, and the like.

FIG. 30 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 30, the controller 7522 can include a display portion displaying a game image, and an input interface such as a touch panel, a stick, a rotating knob, or a sliding knob, besides a button, for example. The shape of the controller 7522 is not limited to that illustrated in FIG. 30, and the shape of the controller 7522 may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice, instead of a controller.

Videos displayed on the game machine can be output with a display device such as a television device, a personal computer display, a game display, and a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used in the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program. For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although FIG. 30 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used in an automobile, which is a moving vehicle, and around the driver's seat in an automobile.

FIG. 30 illustrates an automobile 5700 as an example of a moving vehicle.

An instrument panel that can display a speedometer, a tachometer, a mileage, a fuel meter, a gearshift state, air-conditioning setting, or the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an image capturing device (not illustrated) provided for the automobile 5700, thereby enhancing safety. That is, displaying an image taken by the image capturing device provided on the exterior of the automobile 5700 can compensate for blind areas and enhance safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Note that although an automobile is described above as an example of the moving vehicle, the moving vehicle is not limited to an automobile. Other examples of the moving vehicle include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in the above embodiment can be used in a camera.

FIG. 30 illustrates a digital camera 6240 as an example of an image capturing device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 can be additionally equipped with a stroboscope, a viewfinder, or the like.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used in the digital camera 6240, the digital camera 6240 including artificial intelligence can be achieved. Utilizing the artificial intelligence enables the digital camera 6240 to have a function of automatically recognizing a subject such as a face or an object, adjustment of a focus on the subject, a function of automatically using a flash in accordance with environments, and a function of toning a taken image, for example.

[Video Camera]

The semiconductor device described in the above embodiment can be used in a video camera.

FIG. 30 illustrates a video camera 6300 as an example of an image capturing device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded based on a data recording format. With the use of artificial intelligence, the video camera 6300 can perform the pattern recognition by artificial intelligence during encoding. By the pattern recognition, difference data on a person, an animal, an object, and the like included in continuously taken image data is calculated, so that the data can be compressed.

[Expansion Device for PC]

The semiconductor device described in the above embodiment can be used in a calculator such as a PC (Personal Computer) and an expansion device for an information terminal.

Figure 31A:
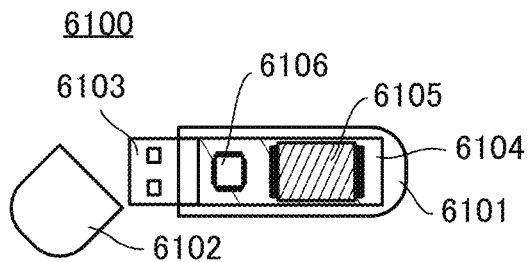
FIG. 31A to FIG. 31C are perspective views each illustrating an example of an electronic device.

As an example of the expansion device, FIG. 31A illustrates a portable expansion device 6100 that includes a chip capable of arithmetic processing and is externally attached to a PC. The expansion device 6100 can perform arithmetic processing using the chip when connected to a PC with a USB (Universal Serial Bus), for example. FIG. 31A illustrates the portable expansion device 6100; however, the expansion device of one embodiment of the present invention is not limited thereto and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the expansion device 6100 for a PC and the like can increase the arithmetic processing capability of the PC. Thus, a PC with insufficient processing capability can perform an arithmetic operation of artificial intelligence, moving image processing, or the like.

[Broadcasting System]

The semiconductor device described in the above embodiment can be used for a broadcasting system.

Figure 31B:
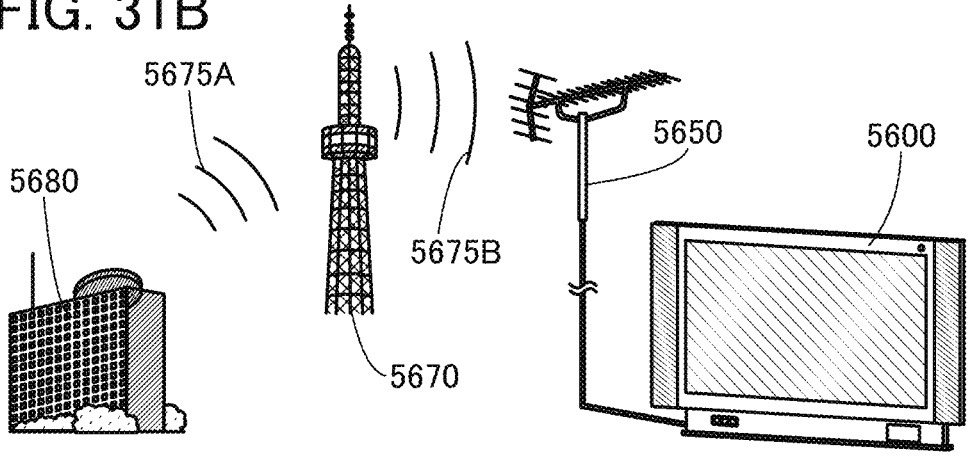

FIG. 31B schematically illustrates data transmission in a broadcasting system. Specifically, FIG. 31B illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 31B, a BS/110° C.S antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. In households, terrestrial broadcasting can be watched on the TV 5600 by receiving the radio wave 5675B with the antenna 5650. Note that the broadcasting system is not limited to the terrestrial broadcasting illustrated in FIG. 31B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 in households, the broadcast data is compressed with an encoder. When the antenna 5650 receives the broadcast data, the broadcast data is decompressed with a decoder of the receiving device in the TV 5600. Utilizing the artificial intelligence enables, for example, recognition of a display pattern included in a displayed image in motion compensation prediction, which is one of the compressing methods for the encoder. In-frame prediction utilizing artificial intelligence, for example, can also be performed. For another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

[Authentication system] The semiconductor device described in the above embodiment can be used for an authentication system.

Figure 31C:
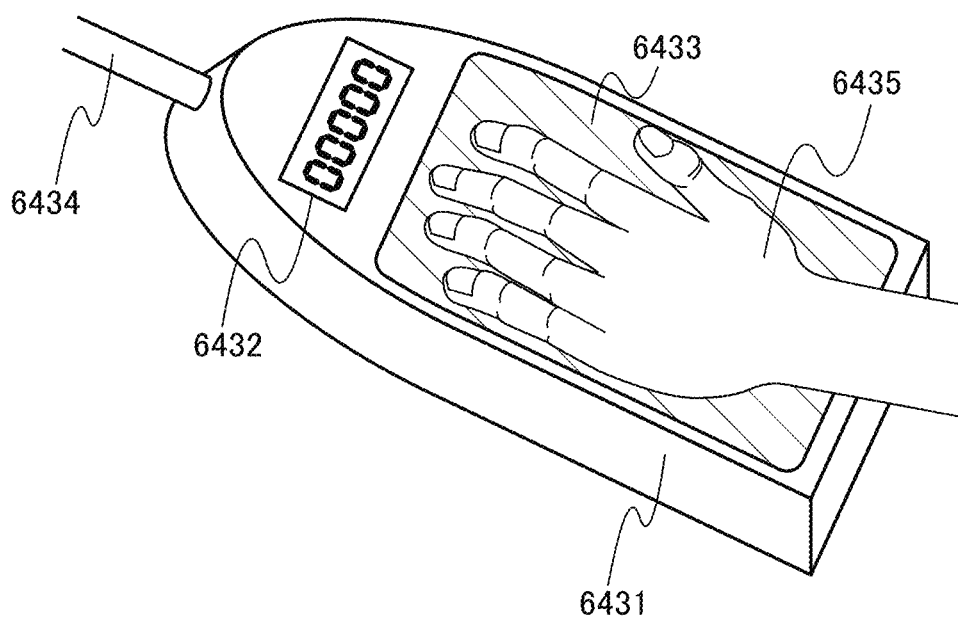

FIG. 31C illustrates a palm print authentication device including a housing 6431, a display portion 6432, a palm print reading portion 6433, and a wiring 6434.

FIG. 31C illustrates how the palm print authentication device obtains a palm print of a hand 6435. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with any of the other embodiments in this specification as appropriate.

Example 1

In this example, a result of simulation performed for examining whether the circuit MC described in Embodiment 1 can operate appropriately as a multiplication cell will be described.

In the simulation, the structure of the circuit MC illustrated in FIG. 4 is input to a circuit simulator, and an output current flowing between the first terminal and the second terminal (wiring OL) of the transistor M10 is calculated with the current $I_W$ flowing between the first terminal and the second terminal of the transistor M2, the current $I_X$ flowing between the first terminal and the second terminal of the transistor M6, the current $I_B$ flowing between the first terminal and the second terminal of the transistor M9.

Note that the capacitor CG included in the circuit MC in FIG. 5, which is input to the simulation, is omitted and power gating (operation to supply or stop of a high power supply potential) using the transistor M1 illustrated in FIG. 5 is performed.

The voltage retained at the gate of the transistor M2 was set to a potential in the voltage range of from 0.25 V to 0.32 V in 0.01 V increments as an example.

The potential input to the wiring XDL, i.e., a potential supplied to the gate of the transistor M6, is set to be a potential in the voltage range of 0.2 V to 0.34 V in 0.02 V increments as an example.

The potential input to the wiring BDL, i.e., the potential input to the gate of the transistor M9 is constantly set to 0.34 V as an example.

Figure 32A:
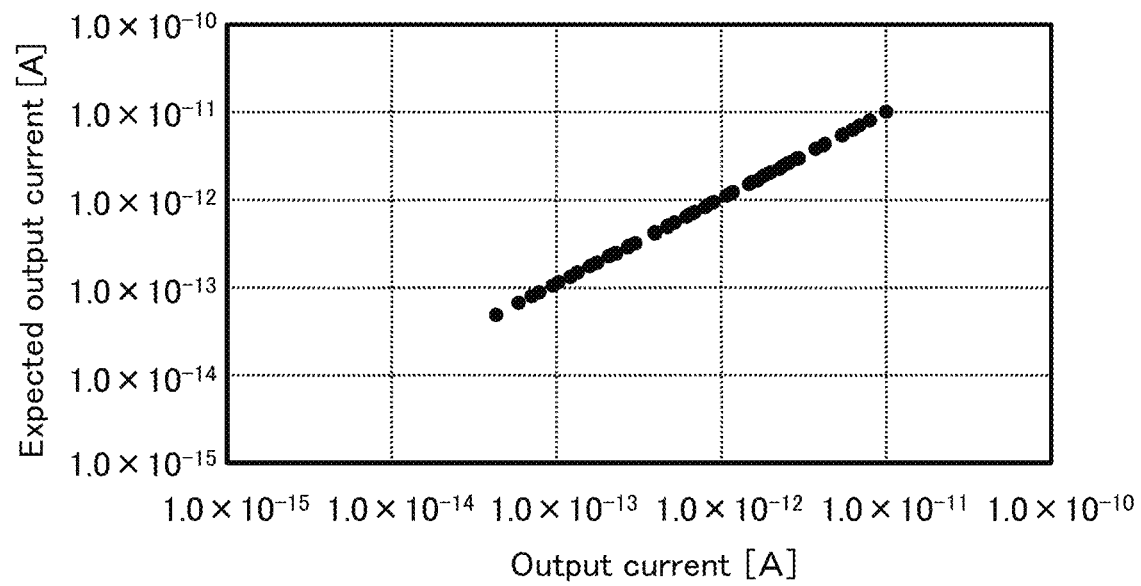
FIG. 32A is a graph showing the relation between a theoretically-expected current output from a semiconductor device and an output current of the semiconductor device obtained by simulation and FIG. 32B is a graph showing the arithmetic efficiency of the semiconductor device.

Here, FIG. 32A is a graph showing an output current obtained by the simulation under the voltage-input conditions described above. The horizontal axis in FIG. 32A represents the magnitude of output current that are theoretically expected and the vertical axis in FIG. 32A represents the magnitude of output current calculated by the simulation. The result of the graph in FIG. 32A shows that the magnitude of output current calculated in the simulation is approximately equal to the magnitude of output current that is theoretically expected.

Figure 32B:
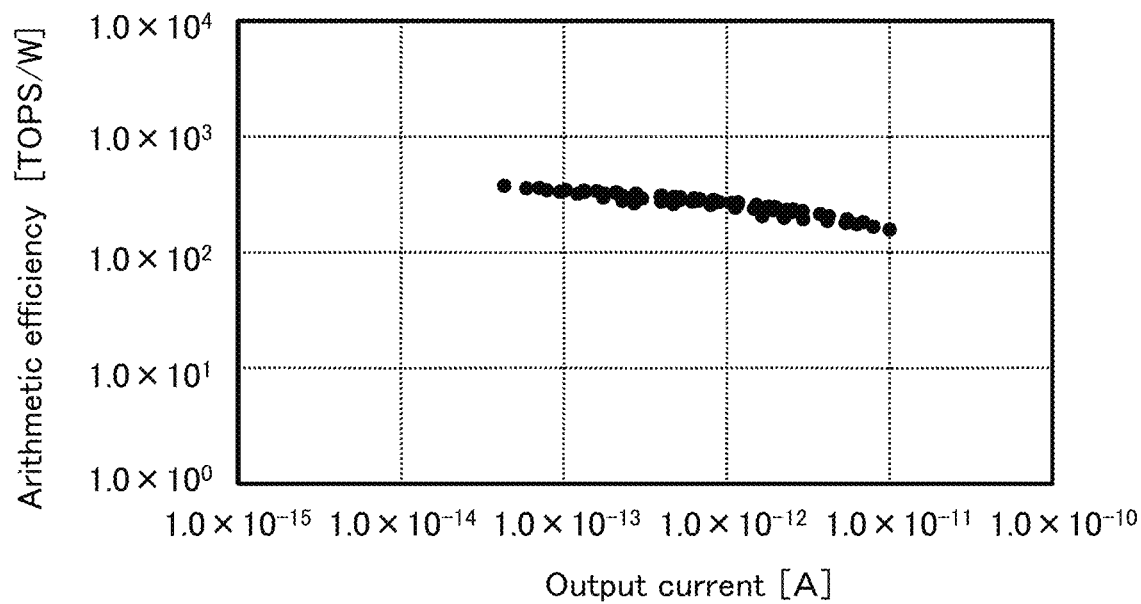

FIG. 32B shows an arithmetic efficiency of circuit used for the above simulation. The horizontal axis in FIG. 32B represents the magnitude of output current calculated by simulation, and the vertical axis in FIG. 32B represents the arithmetic efficiency. Although the arithmetic efficiency differs depending on the output current as shown in FIG. 32B, it is confirmed that the arithmetic efficiencies in all of the output currents are higher than or equal to 100 TOPS/W.

Example 2

Next, a relation between the threshold voltage and the back gate-source voltage of the transistor provided with the circuit HC2, the circuit HC5 to the circuit HC10, and the like described in Embodiment 1 will be described.

Figure 33:
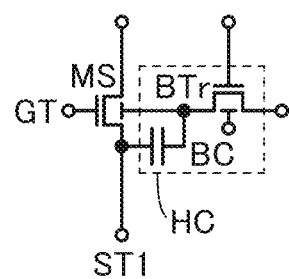
FIG. 33 is a circuit diagram illustrating a circuit structure used for simulation.

First, a circuit structure used for simulation is described. FIG. 33 illustrates a circuit structure used for the simulation, which includes a transistor MS, the transistor BTr, and the capacitor BC. The transistor for adjusting the threshold voltage is the transistor MS, and the transistor MS corresponds to the transistor M2 and the transistor M5 to transistor M10 in the circuit MC in FIG. 3, for example. The transistor BTr and the capacitor BC are included in the circuit HC, and the circuit HC corresponds to, for example, the circuit HC2, the circuit HC5, the circuit HC6, the circuit HC7, the circuit HC8, the circuit HC9, or the circuit HC10 in the circuit MC in FIG. 3. The voltage Vbs between the back gate and the source (the terminal ST1) of the transistor MS can be retained by the capacitor BC.

Figure 34:
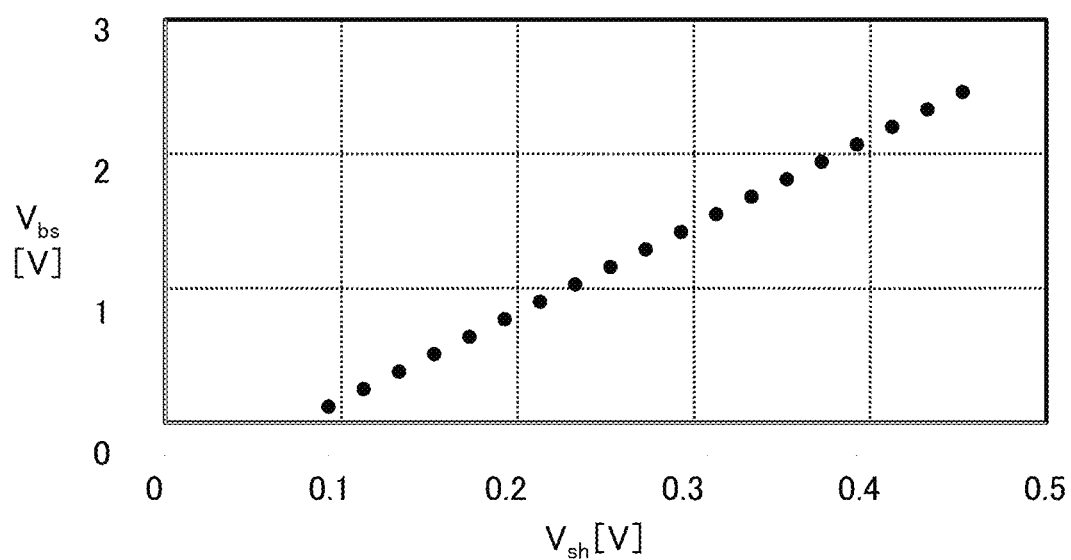
FIG. 34 is a graph showing a relationship between a threshold voltage and a back gate-source voltage of a transistor obtained by simulation.

A description is made on a case where when the threshold voltage Vsn of the transistor MS is in the range of approximately 0.1 V to 0.45 V and the gate (terminal GT)-source (terminal ST1) voltage is 0 V, a current of $1.0 \times 10^{14}$ A flows between the first terminal and the second terminal of the transistor MS. From a result of a simulation performed based on the circuit structure of FIG. 33 and the above conditions, it is shown that a current of approximately $1.0 \times 10^{-14}$ A can flow between the first terminal and the second terminal of the transistor MS on the condition that the gate (terminal GT)-source (terminal ST1) voltage is 0 V by controlling Vbs in the voltage range of from 0 V to 2.5 V. Moreover, FIG. 34 shows the relation between the threshold voltage Vsn and the back gate-source (terminal ST1) voltage Vbs of the transistor MS.

From the above simulation result, it is confirmed that the threshold voltage of the transistors MS can be controlled appropriately by electrically connecting the circuit HC illustrated in FIG. 33 (corresponding to the circuit HC2 or the circuit HC5 to the circuit HC10 in FIG. 3) to the back gate of the transistor MS (corresponding to the transistor M2 or the transistor M5 to the transistor M10 in FIG. 3) for controlling the threshold voltage.

REFERENCE NUMERALS

SDV1: SEMICONDUCTOR DEVICE, SDV1-1: SEMICONDUCTOR DEVICE, SDV1-2: SEMICONDUCTOR DEVICE, SDV2: semiconductor device, SDV3: semiconductor device, SDV4: semiconductor device, SDV5: semiconductor device, CA: cell array, MC: circuit, MC[1,1]: circuit, MC[1,$n$]: circuit, MC[h,1]: circuit, MC[h,n]: circuit, MC[m-h+1,1]: circuit, MC[m-h+1,n]: circuit, MC[m,1]: circuit, MC[m,n]: circuit, MC[1]: circuit, MC[h]: circuit, MC[m-h+1]: circuit, MC[m]: circuit, WDC: circuit, WDIC: circuit, WDICa: circuit, XDC: circuit, BDC: circuit, WWC: circuit, WC: circuit, BGC: circuit, ACTV: circuit, ADR[1]: circuit, ADR[n]: circuit, ACF: circuit, HC2: circuit, HC5: circuit, HC6: circuit, HC7: circuit, HC8: circuit, HC9: circuit, HC10: circuit, HC: circuit, ISC: circuit, PE: circuit, PE[1]: circuit, PE[h]: circuit, PE[m-h+1]: circuit, PE[m]: circuit, PEA: circuit, PDA: circuit, IMA: imaging region, CS: current source, INV1: inverter circuit, INV2: inverter circuit, INV3: inverter circuit, ND: NAND circuit, LE: load, CS1: current source, CS2: current source, CS3: current source, CS4: current source, M1: transistor, M2: transistor, M2$a$: transistor, M2$b$: transistor, M2A: transistor, M2Aa: transistor, M2Ab: transistor, M3: transistor, M3$a$: transistor, M3$b$: transistor, M3A: transistor, M3Aa: transistor, M3Ab: transistor, M4: transistor, M4$a$: transistor, M4$b$: transistor, M5: transistor, M5$a$: transistor, M5$b$: transistor, M6: transistor, M6$a$: transistor, M6$b$: transistor, M6A: transistor, M6Aa: transistor, M6Ab: transistor, M7: transistor, M7$a$: transistor, M7$b$: transistor, M8: transistor, M8$a$: transistor, M8$b$: transistor, M9: transistor, M9$a$: transistor, M9$b$: transistor, M10: transistor, M10$a$: transistor, M10$b$: transistor, M11: transistor, M11$a$: transistor, M11$b$: transistor, M12: transistor, M12$a$: transistor, M12$b$: transistor, M13: transistor, M14: transistor, M15: transistor, M16: transistor, M17: transistor, MS: transistor, CT: transistor, BTr: transistor, Tr1: transistor, Tr1 [1]: transistor, Tr1 [2]: transistor, Tr1 [K]: transistor, Tr2: transistor, Tr2 [1]: transistor, Tr2[2]: transistor, Tr2[K]: transistor, Tr3: transistor, SWW: switch, PD: photodiode, PD[1]: photodiode, PD[h]: photodiode, PD[m-h+1]: photodiode, PD[m]: photodiode, C1: capacitor, C2: capacitor, C3: capacitor, C6: capacitor, CG: capacitor, BC: capacitor, WWL: wiring, WWL[1]: wiring, WWL[m]: wiring, WWLB: wiring, WWLB[1]: wiring, WWLB[m]: wiring, WDL: wiring, WDL[1]: wiring, WDL[n]: wiring, WDIL: wiring, WDIL[1]: wiring, WDIL[n]: wiring, XDL: wiring, XDL[1]: wiring, XDL[h]: wiring, XDL[m-h+1]: wiring, XDL[m]: wiring, BDL: wiring, BDL[1]: wiring, BDL[m]: wiring, BGL: wiring, BGL[1]: wiring, BGL[m]: wiring, XWL[1]: wiring, XWL[n]: wiring, OL: wiring, OL[1]: wiring, OL[n]: wiring, RSL: wiring, TXL: wiring, CVL: wiring, VTL: wiring, VWL: wiring, VDE: wiring, VDE2: wiring, VDE3: wiring, VGE: wiring, VGE2: wiring, VGE3: wiring, VINIL1: wiring, VDDL: wiring, BWL2: wiring, BWL5: wiring, BWL6: wiring, BWL7: wiring, BWL8: wiring, BWL9: wiring, BWL10: wiring, BGL2: wiring, BGL5: wiring, BGL6: wiring, BGL7: wiring, BGL8: wiring, BGL9: wiring, BGL10: wiring, BGLA: wiring, ZL: wiring, ZL[1]: wiring, ZL[n]: wiring, BIL: wiring, DW[1]: wiring, DW[2]: wiring, DW[K]: wiring, IML: wiring, PI: wiring, VTHL: wiring, IT: terminal, OT: terminal, T1: terminal, T2: terminal, GT: terminal, ST: terminal, BSE: substrate, SIL: structure body, OSL: structure body, OSL1: structure body, OSL2: structure body, PDL: structure body, SCL1: scribe line, SCL2: scribe line, 300: transistor, 310: substrate, 310A: substrate, 312: element isolation layer, 313: semiconductor region, 314$a$: low-resistance region, 314$b$: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 500: transistor, 503: conductor, 503a: conductor, 503b: conductor, 510: insulator, 512: insulator, 514: insulator, 516: insulator, 518: conductor, 522: insulator, 524: insulator, 530: oxide, 530a: oxide, 530b: oxide, 530ba: region, 530bb: region, 530bc: region, 540a: conductor, 540b: conductor, 541a: insulator, 541b: insulator, 542a: conductor, 542b: conductor, 543a: oxide, 543b: oxide, 544: insulator, 546: conductor, 550: insulator, 550a: insulator, 550b: insulator, 552: insulator, 554: insulator, 560: conductor, 560a: conductor, 560b: conductor, 571a: insulator, 571b: insulator, 574: insulator, 576: insulator, 580: insulator, 581: insulator, 582: insulator, 586: insulator, 600: capacitor, 610: conductor, 612: conductor, 620: conductor, 630: insulator, 640: insulator, 650: insulator, 660: conductor, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 7500: stationary game machine, 7520: main body, 7522: controller

The invention claimed is:

1. A semiconductor device comprising:
a first transistor, a second transistor, a third transistor, a fourth transistor, a fifth transistor, a sixth transistor, a seventh transistor, an eighth transistor, a ninth transistor, a tenth transistor, and a first capacitor,
wherein each of the first transistor, the second transistor, the third transistor, the fourth transistor, the fifth transistor, the sixth transistor, the seventh transistor, the eighth transistor, the ninth transistor, and the tenth transistor comprises a metal oxide in a channel formation region,
wherein a first terminal of the first transistor is electrically connected to a first terminal of the second transistor,
wherein a gate of the second transistor is electrically connected to a first terminal of the third transistor and a first terminal of the first capacitor,
wherein a second terminal of the second transistor is electrically connected to a second terminal of the first capacitor, a first terminal of the fourth transistor, a gate of the fifth transistor, a first terminal of the seventh transistor, and a gate of the eighth transistor,
wherein a first terminal of the fifth transistor is electrically connected to a first terminal of the sixth transistor and a gate of the seventh transistor,
wherein a first terminal of the eighth transistor is electrically connected to a first terminal of the ninth transistor and a gate of the tenth transistor, and
wherein a drain current of each of the second transistor, the fifth transistor, the sixth transistor, the seventh transistor, the eighth transistor, the ninth transistor, and the tenth transistor is a subthreshold current.

2. The semiconductor device according to claim 1, further comprising:
a second capacitor,
wherein a gate of the first transistor is electrically connected to a first terminal of the second capacitor, and
wherein the gate of the second transistor is electrically connected to a second terminal of the second capacitor.

3. The semiconductor device according to claim 1, wherein at least one of the first transistor, the second transistor, the third transistor, the fourth transistor, the fifth transistor, the sixth transistor, the seventh transistor, the eighth transistor, the ninth transistor, and the tenth transistor is a multi-gate transistor.

4. The semiconductor device according to claim 1, further comprising
an eleventh transistor and a third capacitor,
wherein a first terminal of the eleventh transistor is electrically connected to a first terminal of the third capacitor, and
wherein the first terminal of the eleventh transistor is electrically connected to a back gate of one of the first transistor, the second transistor, the third transistor, the fourth transistor, the fifth transistor, the sixth transistor, the seventh transistor, the eighth transistor, the ninth transistor, and the tenth transistor.

5. The semiconductor device according to claim 1, wherein a back gate of the first transistor is electrically connected to a back gate of the third transistor and a back gate of the fourth transistor.

6. The semiconductor device according to claim 1, further comprising:
an eleventh transistor, a twelfth transistor, and a photodiode,
wherein a first terminal of the eleventh transistor is electrically connected to an input terminal of the photodiode, and
wherein a second terminal of the eleventh transistor is electrically connected to a first terminal of the twelfth transistor, a gate of the twelfth transistor, and a gate of the sixth transistor.

7. The semiconductor device according to claim 1, wherein the first terminal of the first transistor is electrically connected to a second terminal of the fifth transistor and a second terminal of the eighth transistor.

8. The semiconductor device according to claim 1, wherein the semiconductor device is configured to perform a product-sum operation.

9. A semiconductor device comprising:
a first transistor, a second transistor, a third transistor, a fourth transistor, a fifth transistor, a sixth transistor, a seventh transistor, an eighth transistor, a ninth transistor, a tenth transistor, an eleventh transistor, and a first capacitor,
wherein each of the first transistor, the second transistor, the third transistor, the fourth transistor, the fifth transistor, the sixth transistor, the seventh transistor, the eighth transistor, the ninth transistor, the tenth transistor, and the eleventh transistor comprises a metal oxide in a channel formation region, wherein a first terminal of the first transistor is electrically connected to a first terminal of the second transistor, wherein a gate of the second transistor is electrically connected to a first terminal of the third transistor, a gate of the eleventh transistor, and a first terminal of the first capacitor, wherein a second terminal of the third transistor is electrically connected to a first terminal of the eleventh transistor, wherein a second terminal of the second transistor is electrically connected to a second terminal of the first capacitor, a first terminal of the fourth transistor, a gate of the fifth transistor, a first terminal of the seventh transistor, and a gate of the eighth transistor, wherein a first terminal of the fifth transistor is electrically connected to a first terminal of the sixth transistor and a gate of the seventh transistor, wherein a first terminal of the eighth transistor is electrically connected to a first terminal of the ninth transistor and a gate of the tenth transistor, and wherein a drain current of each of the second transistor, the fifth transistor, the sixth transistor, the seventh transistor, the eighth transistor, the ninth transistor, the tenth transistor, and the eleventh transistor is a sub-threshold current.

10. The semiconductor device according to claim 9, wherein at least one of the first transistor, the second transistor, the third transistor, the fourth transistor, the fifth transistor, the sixth transistor, the seventh transistor, the eighth transistor, the ninth transistor, the tenth transistor, and the eleventh transistor is a multi-gate transistor.

11. The semiconductor device according to claim 9, further comprising:

a twelfth transistor and a second capacitor, wherein a first terminal of the twelfth transistor is electrically connected to a first terminal of the second capacitor, and wherein the first terminal of the twelfth transistor is electrically connected to a back gate of one of the first transistor, the second transistor, the third transistor, the fourth transistor, the fifth transistor, the sixth transistor, the seventh transistor, the eighth transistor, the ninth transistor, the tenth transistor, and the eleventh transistor.

12. The semiconductor device according to claim 9, wherein a back gate of the first transistor is electrically connected to a back gate of the fourth transistor and a back gate of the third transistor.

13. The semiconductor device according to claim 9, wherein the first terminal of the first transistor is electrically connected to a second terminal of the fifth transistor and a second terminal of the eighth transistor.

14. The semiconductor device according to claim 9, wherein the semiconductor device is configured to perform a product-sum operation.

* * * * *